United States Patent
Zhao et al.

(10) Patent No.: US 9,396,955 B2
(45) Date of Patent: *Jul. 19, 2016

(54) PLASMA TUNING RODS IN MICROWAVE RESONATOR PROCESSING SYSTEMS

(71) Applicant: Tokyo Electron Limited, Tokyo (JP)

(72) Inventors: Jianping Zhao, Austin, TX (US); Lee Chen, Cedar Creek, TX (US); Merritt Funk, Austin, TX (US); Iwao Toshihiko, Tokyo (JP); Peter L. G. Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 626 days.

This patent is subject to a terminal disclaimer.

(21) Appl. No.: 13/834,690

(22) Filed: Mar. 15, 2013

(65) Prior Publication Data
US 2013/0203261 A1    Aug. 8, 2013

Related U.S. Application Data

(63) Continuation-in-part of application No. 13/249,485, filed on Sep. 30, 2011, now Pat. No. 8,808,496.

(51) Int. Cl.
*C23C 16/00* (2006.01)
*C23F 1/00* (2006.01)
(Continued)

(52) U.S. Cl.
CPC .......... *H01L 21/3065* (2013.01); *C23C 16/511* (2013.01); *H01J 37/32192* (2013.01); *H01J 37/32247* (2013.01); *H01J 37/32256* (2013.01)

(58) Field of Classification Search
USPC ............................ 156/345.41; 118/723 MW
See application file for complete search history.

(56) References Cited

U.S. PATENT DOCUMENTS 4,943,345 A * 7/1990 Asmussen et al. ..... C23C 16/452
                                                            118/50.1
5,134,965 A   8/1992 Tokuda et al.
(Continued)

FOREIGN PATENT DOCUMENTS

CN      1602543 A    3/2005
CN    102089867 A    6/2011
(Continued)

OTHER PUBLICATIONS

International Searching Authority, International Search Report and Written Opinion of related International Application PCT/US12/58088 dated Jan. 7, 2013, 15 pp.
(Continued)

*Primary Examiner* — Rakesh Dhingra
(74) *Attorney, Agent, or Firm* — Wood, Herron & Evans, LLP

(57) ABSTRACT

A plasma tuning rod system is provided with one or more microwave cavities configured to couple electromagnetic (EM) energy in a desired EM wave mode to a plasma by generating resonant microwave energy in one or more plasma tuning rods within and/or adjacent to the plasma. One or more microwave cavity assemblies can be coupled to a process chamber, and can comprise one or more tuning spaces/cavities. Each tuning space/cavity can have one or more plasma tuning rods coupled thereto. The plasma tuning rods can be configured to couple the EM energy from the resonant cavities to the process space within the process chamber and thereby create uniform plasma within the process space.

12 Claims, 20 Drawing Sheets

(51) Int. Cl.
  *H01L 21/306* (2006.01)
  *H01L 21/3065* (2006.01)
  *C23C 16/511* (2006.01)
  *H01J 37/32* (2006.01)

(56) References Cited

U.S. PATENT DOCUMENTS

| | | | |
|---|---|---|---|
| 5,188,862 | A | 2/1993 | Itatani et al. |
| 5,254,372 | A | 10/1993 | Nichols |
| 5,413,759 | A | 5/1995 | Campbell et al. |
| 5,571,366 | A | 11/1996 | Ishii et al. |
| 5,714,009 | A | 2/1998 | Boling |
| 5,804,033 | A | 9/1998 | Kanai et al. |
| 5,869,802 | A | 2/1999 | Spencer et al. |
| 6,029,602 | A | 2/2000 | Bhatnagar |
| 6,057,645 | A * | 5/2000 | Srivastava et al. H01J 37/32284 156/345.41 |
| 6,064,154 | A | 5/2000 | Crouch et al. |
| 6,109,208 | A | 8/2000 | Tsuchihashi et al. |
| 6,114,811 | A * | 9/2000 | Wu .................... H01J 37/32192 118/723 AN |
| 6,313,584 | B1 | 11/2001 | Johnson et al. |
| 6,341,574 | B1 | 1/2002 | Bailey, III et al. |
| 6,388,226 | B1 | 5/2002 | Smith et al. |
| 6,552,296 | B2 | 4/2003 | Smith et al. |
| 6,607,633 | B2 | 8/2003 | Noguchi |
| 7,226,524 | B2 | 6/2007 | Kasai et al. |
| 7,232,767 | B2 | 6/2007 | George et al. |
| 7,510,664 | B2 | 3/2009 | Carr |
| 8,419,960 | B2 | 4/2013 | Sawada et al. |
| 2002/0007912 | A1* | 1/2002 | Kamarehi et al. H01J 37/32192 156/345.12 |
| 2002/0046991 | A1 | 4/2002 | Smith et al. |
| 2002/0148560 | A1 | 10/2002 | Carr |
| 2004/0011465 | A1 | 1/2004 | Matsumoto et al. |
| 2004/0244691 | A1 | 12/2004 | George et al. |
| 2005/0034815 | A1 | 2/2005 | Kasai et al. |
| 2005/0205016 | A1 | 9/2005 | Sugai et al. |
| 2006/0137613 | A1 | 6/2006 | Kasai |
| 2006/0239312 | A1 | 10/2006 | Kewitsch et al. |
| 2007/0113979 | A1 | 5/2007 | George et al. |
| 2008/0282979 | A1 | 11/2008 | Chen et al. |
| 2008/0303744 | A1 | 12/2008 | Hirayama et al. |
| 2009/0200910 | A1 | 8/2009 | Matsuuchi et al. |
| 2009/0236214 | A1 | 9/2009 | Janakiraman et al. |
| 2010/0009096 | A1 | 1/2010 | Kawamura et al. |
| 2011/0057562 | A1 | 3/2011 | Chen et al. |
| 2011/0061814 | A1 | 3/2011 | Ikeda |
| 2011/0097821 | A1 | 4/2011 | Sirard et al. |
| 2011/0097904 | A1 | 4/2011 | Sirard et al. |
| 2011/0174778 | A1 | 7/2011 | Sawada et al. |
| 2011/0271908 | A1 | 11/2011 | Chang et al. |
| 2012/0067523 | A1 | 3/2012 | Kasai et al. |

FOREIGN PATENT DOCUMENTS

| | | |
|---|---|---|
| TW | 481829 | 4/2002 |
| TW | 200501832 | 1/2005 |
| TW | 200532060 A | 10/2005 |
| TW | 200733822 | 9/2007 |
| TW | 200830945 A | 7/2008 |
| WO | 2010004997 A1 | 1/2010 |
| WO | 2010110256 A1 | 9/2010 |

OTHER PUBLICATIONS

Taiwan Intellectual Property Office, Notification of Examination Opinion issued in corresponding TW Application No. 101135638, dated Jan. 12, 2015, 4 pp.
State Intellectual Property Office of the People'S Republic of China, English translation of first Office Action issued in corresponding Chinese Application No. 201280047707.7 issued Oct. 8, 2015, 12 pp.
U.S. Patent and Trademark Office, Non-final Office Action issued in corresponding U.S. Appl. No. 13/249,485, dated Nov. 5, 2013, 44 pp.
State Intellectual Property Office of People'S Republic of China, Second Office Action issued Mar. 15, 2016 in counterpart Chinese Application No. 201280047707.7, 8 pp. including English translation.
Taiwan Intellectual Property Office, Notification of Examination Opinion issued in corresponding TW Application No. 103108246, issued Mar. 9, 2016, 18 pp., including English translation.

* cited by examiner

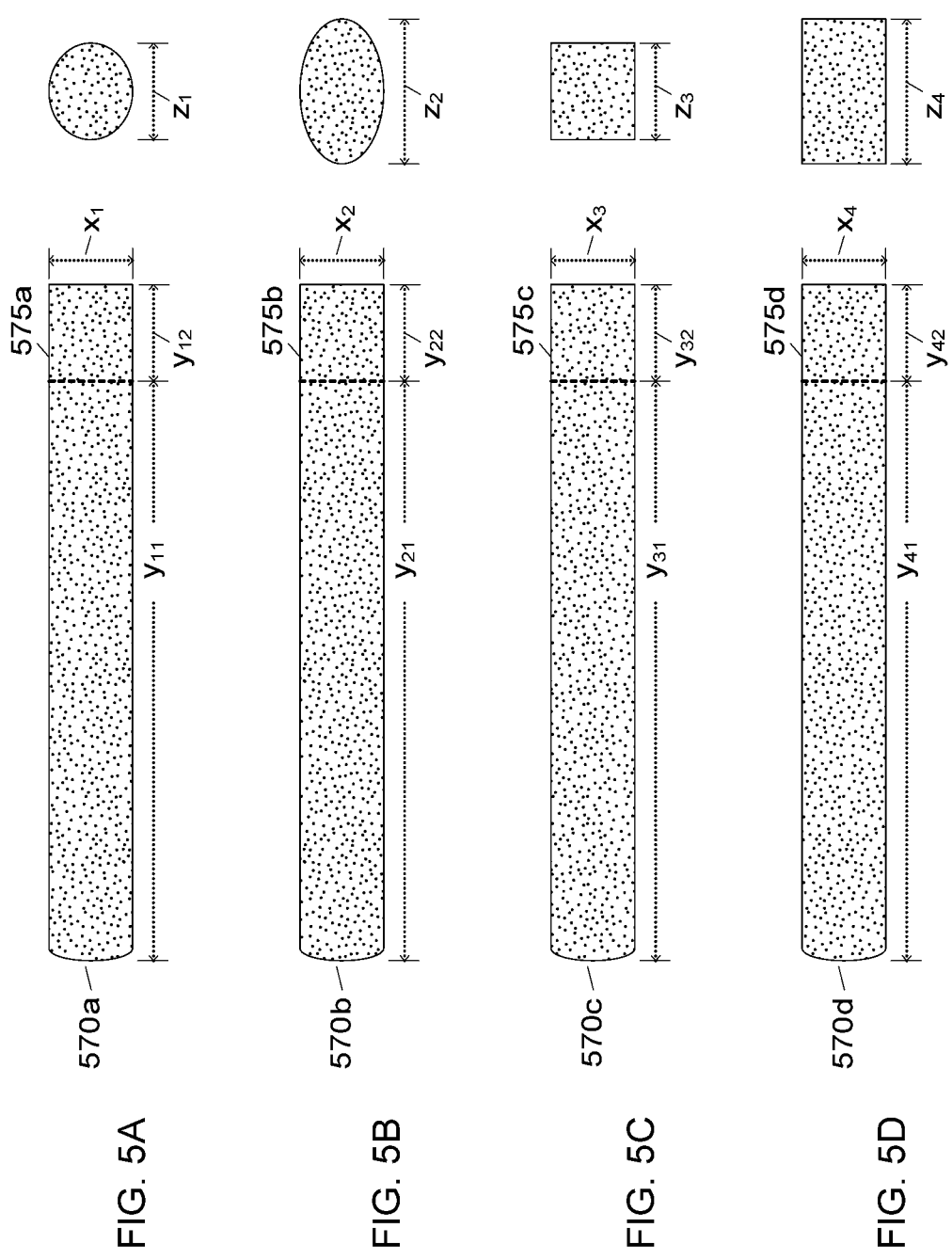

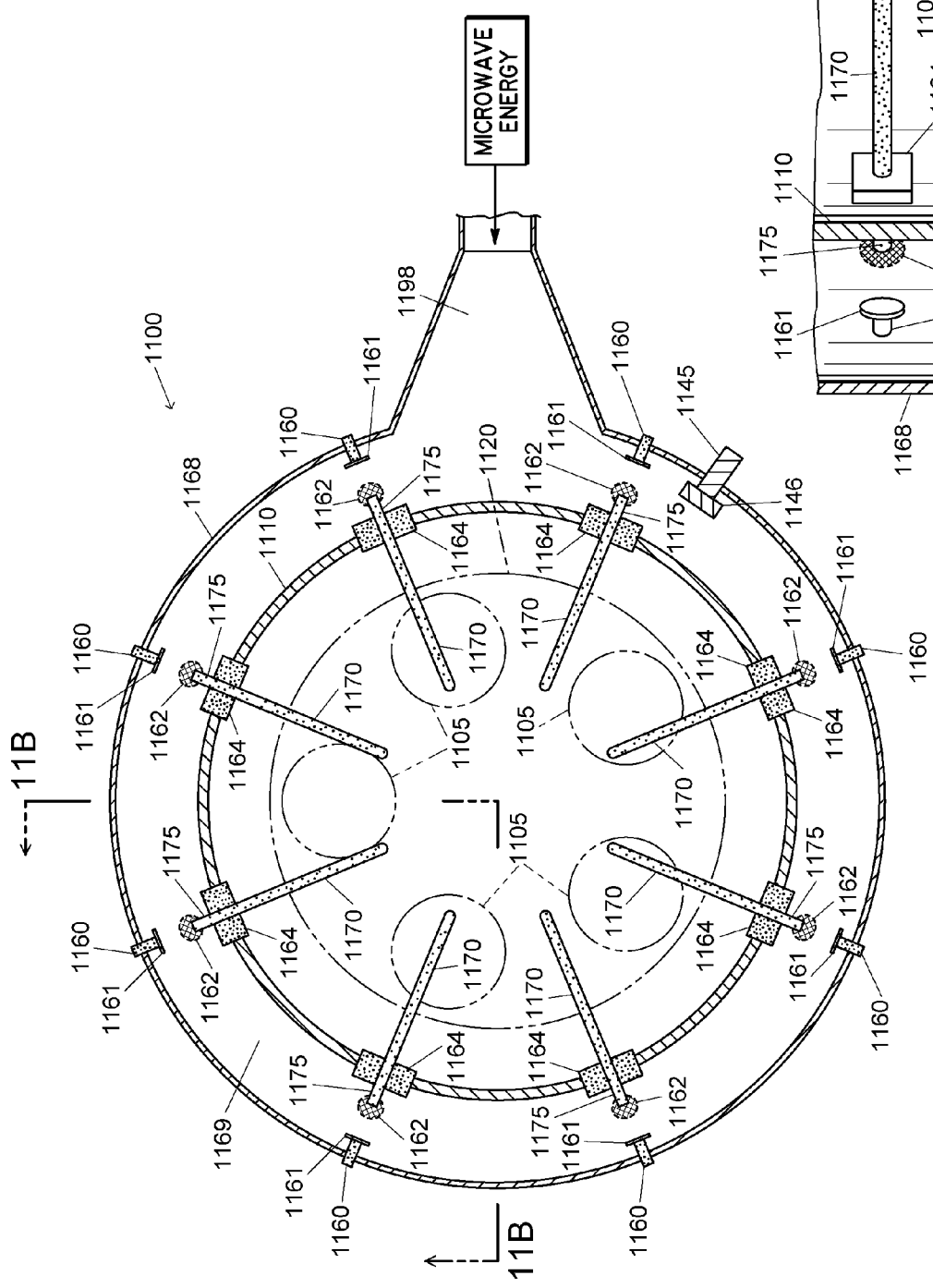

PLASMA TUNING RODS IN MICROWAVE RESONATOR PROCESSING SYSTEMS

CROSS-REFERENCE TO RELATED APPLICATIONS

This application is a continuation-in-part of U.S. patent application Ser. No. 13/249,485 filed Sep. 30, 2011 and entitled PLASMA TUNING RODS IN MICROWAVE RESONATOR PROCESSING SYSTEMS, now U.S. Pat. No. 8,808,496 issued Aug. 19, 2014, the content of which is herein incorporated by reference in its entirety.

BACKGROUND OF THE INVENTION

1. Field of the Invention

The present invention relates to substrate/wafer processing, and more particularly to microwave processing systems and methods for processing substrates and/or semiconductor wafers.

2. Description of the Related Art

Typically, during semiconductor processing, a (dry) plasma etch process is utilized to remove or etch material along fine lines or within vias or contacts patterned on a semiconductor substrate. The plasma etch process generally involves positioning a semiconductor substrate with an overlying patterned, protective layer, for example a photoresist layer, into a process chamber.

Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a portion of the gas species present is ionized following a collision with an energetic electron. Moreover, the heated electrons serve to dissociate some species of the mixture gas species and create reactant specie(s) suitable for etching exposed surfaces. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of the substrate. Such substrate materials where etching is required include silicon dioxide ($SiO_2$), poly-silicon, and silicon nitride, for example.

Conventionally, various techniques have been implemented for exciting a gas into plasma for the treatment of a substrate during semiconductor device fabrication, as described above. In particular, ("parallel plate") capacitively coupled plasma (CCP) processing systems, or inductively coupled plasma (ICP) processing systems have been utilized commonly for plasma excitation. Among other types of plasma sources, there are microwave plasma sources (including those utilizing electron-cyclotron resonance (ECR)), surface wave plasma (SWP) sources, and helicon plasma sources.

It is becoming common wisdom that microwave-processing systems offer improved plasma processing performance, particularly for etching processes, over CCP systems, ICP systems and resonantly heated systems. Microwave processing systems produce a high degree of ionization at a relatively lower Boltzmann electron temperature ($T_e$). In addition, EM sources generally produce plasma richer in electronically excited molecular species with reduced molecular dissociation. However, the practical implementation of microwave processing systems still suffers from several deficiencies including, for example, plasma stability and uniformity.

SUMMARY OF THE INVENTION

The invention relates to microwave processing systems and, more particularly, to stable and/or uniform cavity assemblies in microwave processing systems.

In accordance with an embodiment of the invention, a microwave processing system comprises a process chamber having a process space for processing a substrate therein and one or more cavity assemblies coupled to a side chamber wall of the process chamber, each having an electromagnetic (EM) energy tuning space therein. A set of EM-coupling regions is established in the EM energy tuning spaces and a set of isolation assemblies is coupled to the side chamber wall and configured to isolate the first EM energy tuning spaces from the process space. A set of plasma-tuning rods is coupled to the set of isolation assemblies, the set of plasma-tuning rods having a set of plasma-tuning portions configured in the process space and a set of EM-tuning portions configured in the EM energy tuning spaces and coupled to at least one of the set of EM-coupling regions. A controller is coupled to the one or more cavity assemblies, wherein the controller is configured to control the set of EM-coupling regions in the EM energy tuning spaces, thereby controlling plasma uniformity in the process space.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 5A-5D show different views of exemplary plasma-tuning rods in accordance with embodiments of the invention;

FIGS. 11A-11B show different views of another alternative embodiment of a microwave processing system.

The accompanying drawings, which are incorporated in and constitute a part of this specification, illustrate embodiments of the invention and, together with a general description of the invention given above, and the detailed description given below, serve to explain the invention.

DETAILED DESCRIPTION

A microwave processing system is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that contained within the description are features which, notwithstanding the inventive nature of the general concepts being explained, are also of an inventive nature.

Figure 1A:
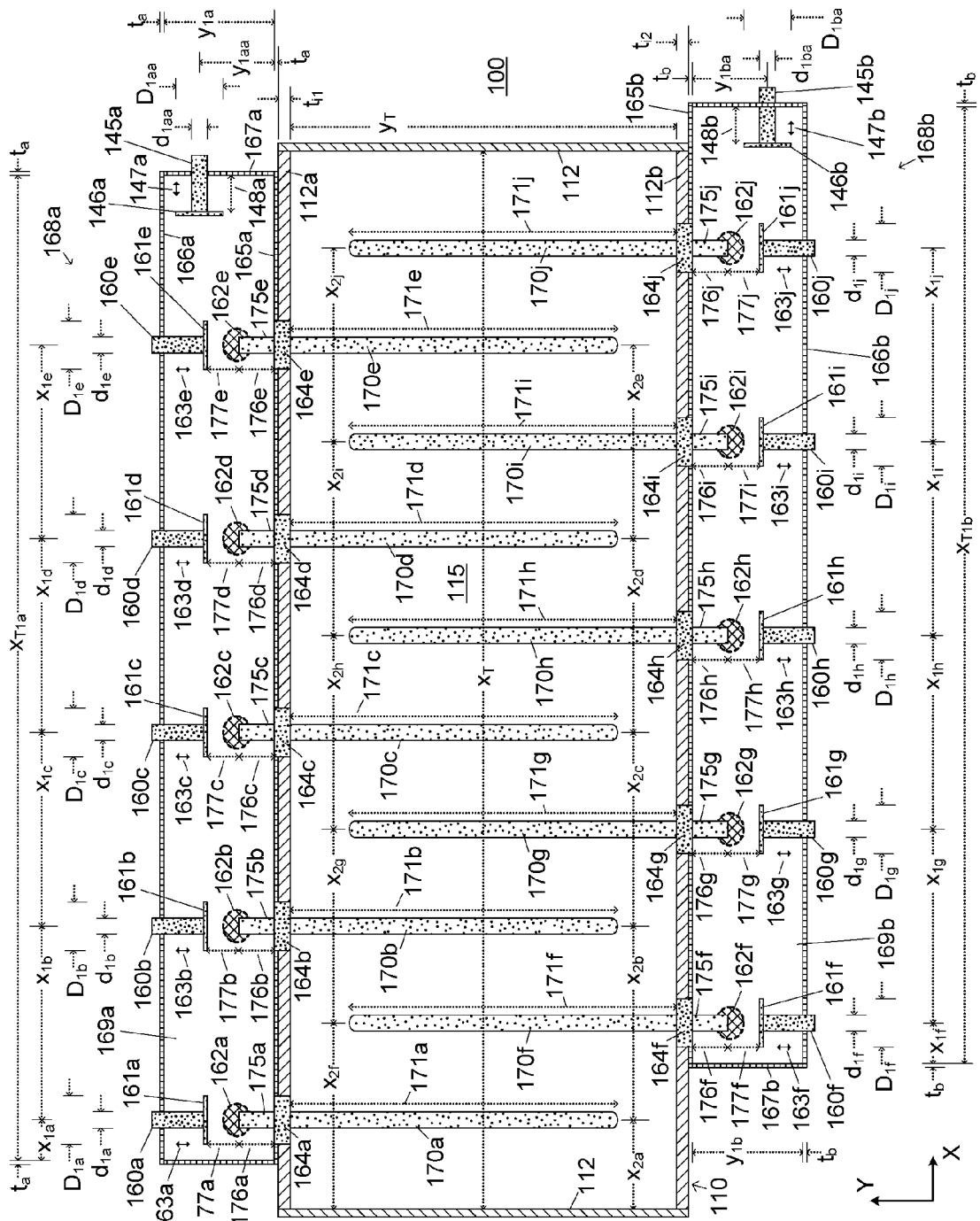
FIGS. 1A-1C illustrate different exemplary views of a first microwave processing system according to embodiments of the invention.
Figure 1B:
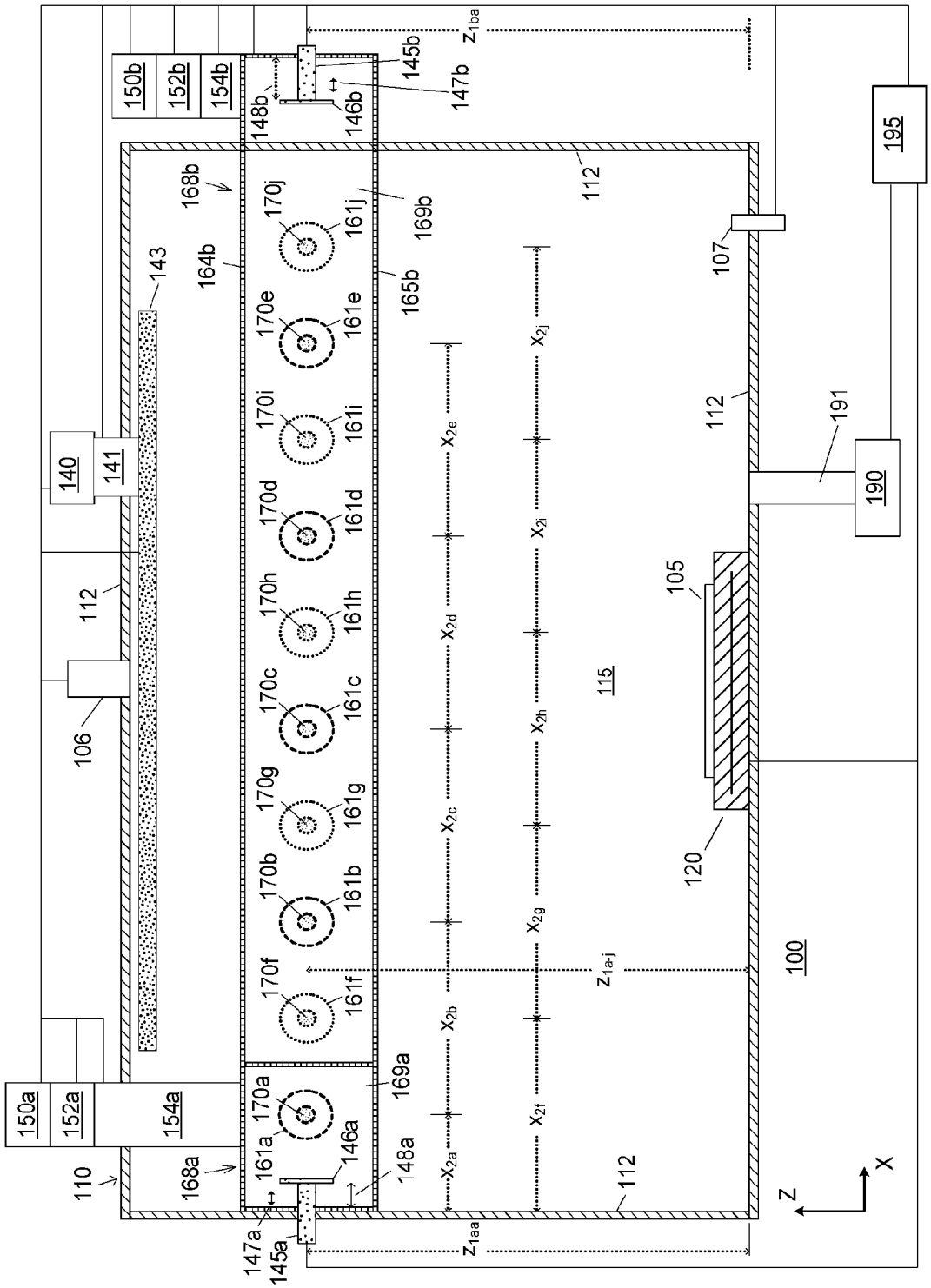
Figure 1C:
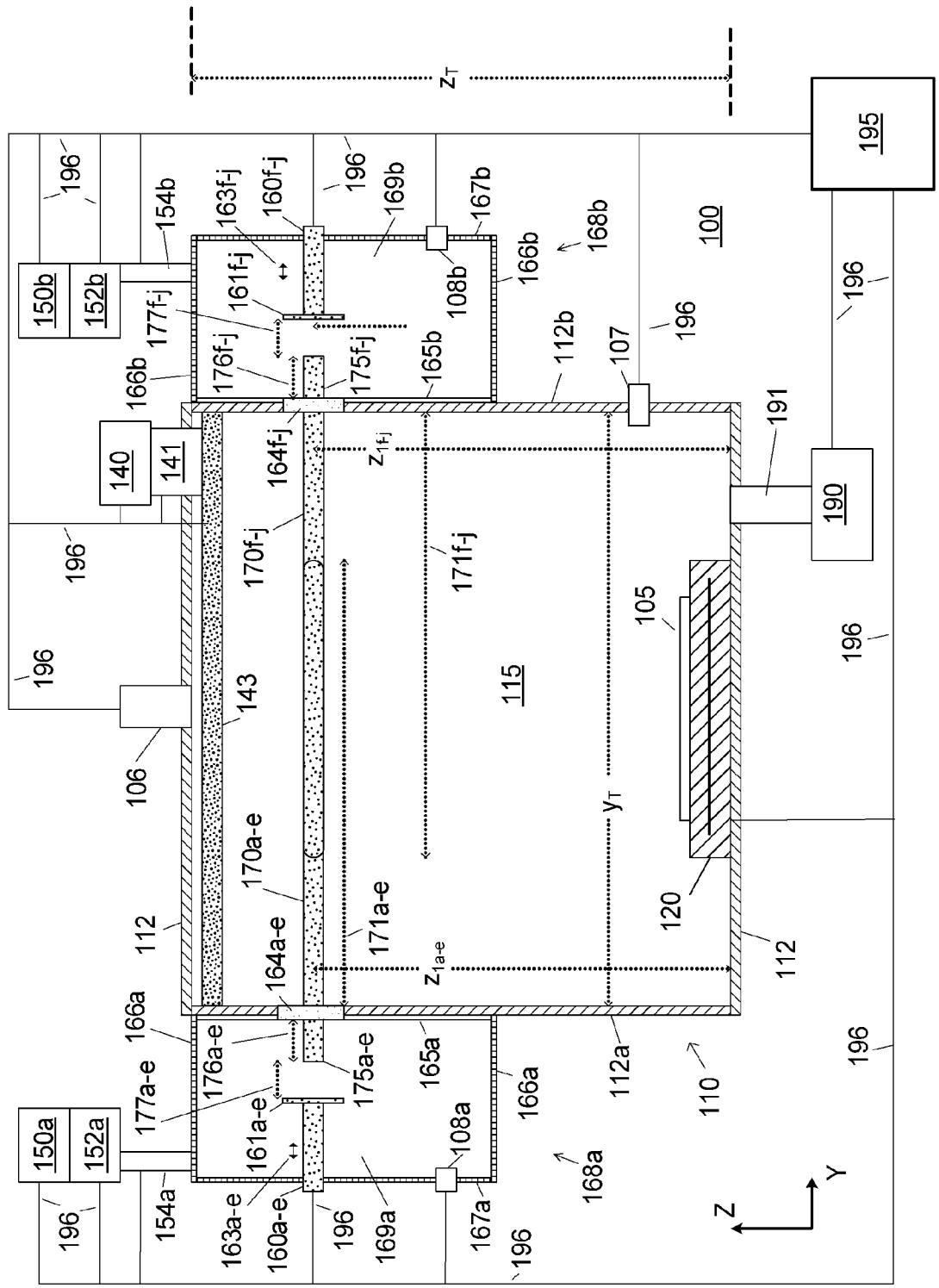

Referring now to the drawings, wherein like reference numerals designate identical or corresponding parts throughout the several views, FIGS. 1A-1C illustrate different views of a first microwave processing system according to embodiments of the invention. The first microwave processing system 100 may be used in a plasma curtain deposition system or a plasma enhanced deposition system.

FIG. 1A shows a partial cut-away top view of a process chamber 110 in a first microwave processing system 100. The top view shows an x/y plane view of a first interface assembly 112a, a second interface assembly 112b, and a plurality of additional chamber walls 112 coupled to the first interface assembly 112a and the second interface assembly 112b thereby forming the process chamber 110. For example, the chamber walls 112 can have wall thicknesses (t) associated therewith, and the wall thicknesses (t) can vary from about 1 mm to about 5 mm. The first interface assembly 112a can have a first interface thickness ($t_{i1}$) associated therewith, and the first interface thickness ($t_{i1}$) can vary from about 1 mm to about 10 mm. The second interface assembly 112b can have a second interface thickness ($t_{i2}$) associated therewith, and the second interface thickness ($t_{i2}$) can vary from about 1 mm to about 10 mm. The process space 115 can have a length ($x_T$) associated therewith, and the length ($x_T$) can vary from about 10 mm to about 500 mm. In this and all later embodiments, it may be appreciated that the dimensions provided may differ from that recited, for example, the process space may have a length or a radius of up to several meters, and interface and wall thicknesses up to 30 mm or greater.

The top view shows a cut-away view of a first cavity assembly 168a having a first EM energy tuning space 169a therein, and the first cavity assembly 168a can include a first cavity wall 165a, a second cavity wall 166a, at least one third cavity wall 167a, and one or more additional cavity walls (not shown). For example, the first cavity assembly 168a can be coupled to the first interface assembly 112a using the first cavity wall 165a, and the walls (165a, 166a, and 167a) can comprise dielectric material and can have wall thicknesses ($t_a$) associated therewith, and the wall thicknesses ($t_a$) can vary from about 1 mm to about 5 mm. In addition, the first EM energy tuning space 169a can have a first length ($x_{T1a}$) and a first width ($y_{1a}$) associated therewith, the first length ($x_{T1a}$) can vary from about 10 mm to about 500 mm, and the first width ($y_{1a}$) can vary from about 5 mm to about 50 mm.

The top view also shows a cut-away view of a second cavity assembly 168b having a second EM energy tuning space 169b therein, and the second cavity assembly 168b can include a first cavity wall 165b, a second cavity wall 166b, at least one third cavity wall 167b, and one or more additional cavity walls (not shown). For example, the second cavity assembly 168b can be coupled to the second interface assembly 112b using the first cavity wall 165b, and walls (165b, 166b, and 167b) can comprise dielectric material and can have wall thicknesses ($t_b$) associated therewith, and the wall thicknesses ($t_b$) can vary from about 1 mm to about 5 mm. In addition, the second EM energy tuning space 169b can have a second length ($x_{T1b}$) and a second width ($y_{1b}$) associated therewith, the second length ($x_{T1b}$) can vary from about 10 mm to about 500 mm, and the second width ($y_{1b}$) can vary from about 5 mm to about 50 mm. In this and all later embodiments, it may be appreciated that the dimensions provided may differ from that recited, for example, the cavity wall thicknesses may be up to 30 mm or greater, and the EM energy tuning spaces can have lengths and/or widths up to several meters.

In some exemplary systems, a first set of isolation assemblies (164a, 164b, 164c, 164d, and 164e) can be removably coupled to a first interface assembly 112a and can be configured to isolate the process space 115 from the first EM energy tuning space 169a. The first set of isolation assemblies (164a, 164b, 164c, 164d, and 164e) can be used to removably couple the first set of plasma tuning rods {(170a, 170b, 170c, 170d, and 170e) and (175a, 175b, 175c, 175d, and 175e)} to a first interface assembly 112a. For example, the first set of plasma-tuning portions (170a, 170b, 170c, 170d, and 170e) can be configured in the process space 115, and the first set of EM-tuning portions (175a, 175b, 175c, 175d, and 175e) can be configured within the first EM energy tuning space 169a.

A second set of isolation assemblies (164f, 164g, 164h, 164i, and 164j) can be removably coupled to the second interface assembly 112b and can be configured to isolate the process space 115 from the second EM energy tuning space 169b. The second set of isolation assemblies (164f, 164g, 164h, 164i, and 164j) can be used to removably couple the second set of plasma tuning rods {(170f, 170g, 170h, 170i, and 170j) and (175f, 175g, 175h, 175i, and 175j)} to the second interface assembly 112b. For example, the second set of plasma-tuning portions (170f, 170g, 170h, 170i, and 170j) can be configured in the process space 115, and the second set of EM-tuning portions (175f, 175g, 175h, 175h, and 175j) can be configured within the second EM energy tuning space 169b.

Still referring to FIG. 1A, a first plasma-tuning rod (170a, 175a) can comprise dielectric material, can have a first plasma-tuning portion 170a that can extend a first plasma-tuning distance 171a into the process space 115 at a first location defined using ($x_{2a}$). For example, the first plasma-tuning distance 171a can vary from about 10 mm to about 400 mm. In this and all later embodiments, it may be appreciated that the dimensions provided may differ from that recited, for example, the distance can be 1 meter or longer, and as much as the full distance to the opposite side of the process space.

A first EM-coupling region 162a can be established at a first EM-coupling distance 176a from the first cavity wall 165a within the first EM energy tuning space 169a established in the first cavity assembly 168a, and the first EM-tuning portion 175a can extend into the first EM-coupling region 162a. The first EM-tuning portion 175a can obtain first microwave energy from the first EM-coupling region 162a, and the first microwave energy can be transferred to the process space 115 at the first location ($x_{2a}$) using the first plasma-tuning portion 170a. The first EM-coupling region 162a can include a maximum field region, a maximum voltage region, maximum energy region, or a maximum current region, or any combination thereof. For example, the first EM-coupling distance 176a can vary from about 0.01 mm to about 10 mm, and the first EM-coupling distance 176a can be wavelength-dependent and can vary from about a ($\lambda/4$) to about (10$\lambda$). In this and all later embodiments, it may be appreciated that the dimensions provided may differ from that recited, for example, the distance can be up to 20 mm or longer.

A first plasma-tuning slab 161a can be coupled to a first control assembly 160a that can be used to move 163a the first plasma-tuning slab 161a a first EM-tuning distance 177a relative to the first EM-tuning portion 175a of the first plasma-tuning rod (170a, 175a) within the first EM energy tuning space 169a. The first control assembly 160a and the first plasma-tuning slab 161a can comprise dielectric material and can be used to optimize the microwave energy coupled from the first EM-coupling region 162a to the first EM-tuning portion 175a of the first plasma-tuning rod (170a, 175a). The first EM-tuning distance 177a can be established between the first EM-tuning portion 175a and the first plasma-tuning slab 161a within the first EM energy tuning space 169a, and the first EM-tuning distance 177a can vary from about 0.01 mm to about 1 mm. In this and all later embodiments, it may be appreciated that the dimensions provided may differ from that recited, for example, the distance can be up to 20 mm or longer.

The first plasma-tuning rod (170a, 175a) can have a first diameter ($d_{1a}$) associated therewith, and the first diameter ($d_{1a}$) can vary from about 0.01 mm to about 1 mm. The first plasma-tuning slab 161a can have a first diameter ($D_{1a}$) associated therewith, and the first diameter ($D_{1a}$) can vary from about 1 mm to about 10 mm. The first EM-coupling region 162a, the first control assembly 160a, and the first plasma-tuning slab 161a can have a first x/y plane offset ($x_{1a}$) associated therewith, and the first x/y plane offset ($x_{1a}$) can be wavelength-dependent and can vary from about a quarter wavelength ($\lambda/4$) to about (10$\lambda$). For example, first control assembly 160a can have a cylindrical configuration and a diameter ($d_{1a}$) that can vary from about 1 mm to about 5 mm. In this and all later embodiments, it may be appreciated that the dimensions provided may differ from that recited, for example, the plasma-tuning rods and slabs can have diameters up to 80 mm or greater, and the control assembly diameter can be up to 10 mm or greater.

A second plasma-tuning rod (170b, 175b) can comprise dielectric material and can have a second plasma-tuning portion 170b that can extend a second plasma-tuning distance 171b into the process space 115 at a second location defined using ($x_{1b}$). For example, the second plasma-tuning distance 171b can vary from about 10 mm to about 400 mm.

A second EM-coupling region 162b can be established at a second EM-coupling distance 176b from the first cavity wall 165a within the first EM energy tuning space 169a established in the first cavity assembly 168a, and the second EM-tuning portion 175b can extend into the second EM-coupling region 162b. The second EM-tuning portion 175b can obtain second microwave energy from the second EM-coupling region 162b, and the second microwave energy can be transferred to the process space 115 at the second location ($x_{1b}$) using the second plasma-tuning portion 170b. The second EM-coupling region 162b can include a maximum field region, a maximum voltage region, maximum energy region, or a maximum current region, or any combination thereof. For example, the second EM-coupling distance 176b can vary from about 0.01 mm to about 10 mm, and the second EM-coupling distance 176b can be wavelength-dependent and can vary from about ($\lambda/4$) to about (10$\lambda$).

A second plasma-tuning slab 161b can be coupled to a second control assembly 160b and can be used to move 163b the second plasma-tuning slab 161b a second EM-tuning distance 177b relative to the second EM-tuning portion 175b of the second plasma-tuning rod (170b, 175b) within the first EM energy tuning space 169a. The second control assembly 160b and the second plasma-tuning slab 161b can be used to optimize the microwave energy coupled from the second EM-coupling region 162b to the second EM-tuning portion 175b of the second plasma-tuning rod (170b, 175b). For example, the second EM-tuning distance 177b can be established between the second EM-tuning portion 175b and the second plasma-tuning slab 161b within the first EM energy tuning space 169a, and the second EM-tuning distance 177b can vary from about 0.01 mm to about 1 mm.

The second plasma-tuning rod (170b, 175b) can have a second diameter ($d_{1b}$) associated therewith that can vary from about 0.01 mm to about 1 mm. The second plasma-tuning slab 161b can comprise dielectric material and can have a second diameter ($D_{1b}$) associated therewith that can vary from about 1 mm to about 10 mm. The second EM-coupling region 162b, the second control assembly 160b, and the second plasma-tuning slab 161b can have a second x/y plane offset ($x_{1b}$) associated therewith, and the second x/y plane offset ($x_{1b}$) can be wavelength-dependent and can vary from about a quarter wavelength ($\lambda/4$) to about (10$\lambda$). For example, the second control assembly 160b can comprise dielectric material, can have a cylindrical configuration and a diameter ($d_{1b}$) that can vary from about 1 mm to about 5 mm.

A third plasma-tuning rod (170c, 175c) can comprise dielectric material and can have a third plasma-tuning portion 170c that can extend a third plasma-tuning distance 171c into the process space 115 at a third location defined using ($x_{2c}$). For example, the third plasma-tuning distance 171c can vary from about 10 mm to about 400 mm.

A third EM-coupling region 162c can be established at a third EM-coupling distance 176c from the first cavity wall 165a within the first EM energy tuning space 169a established in the first cavity assembly 168a, and the third EM-tuning portion 175c can extend into the third EM-coupling region 162c. The third EM-tuning portion 175c can obtain third microwave energy from the third EM-coupling region 162c, and the third microwave energy can be transferred to the process space 115 at the third location ($x_{2c}$) using the third plasma-tuning portion 170c. The third EM-coupling region 162c can include a maximum field region, a maximum voltage region, maximum energy region, or a maximum current region, or any combination thereof. For example, the third EM-coupling distance 176c can vary from about 0.01 mm to about 10 mm, and the third EM-coupling distance 176c can be wavelength-dependent and can vary from about ($\lambda/4$) to about (10$\lambda$).

A third plasma-tuning slab 161c can be coupled to a third control assembly 160c and can be used to move 163c the third plasma-tuning slab 161c a third EM-tuning distance 177c relative to the third EM-tuning portion 175c of the third plasma-tuning rod (170c, 175c) within the first EM energy tuning space 169a. The third control assembly 160c and the third plasma-tuning slab 161c can be used to optimize the microwave energy coupled from the third EM-coupling region 162c to the third EM-tuning portion 175c of the third plasma-tuning rod (170c, 175c). For example, the third EM-tuning distance 177c can be established between the third EM-tuning portion 175c and the third plasma-tuning slab 161c within the first EM energy tuning space 169a, and the third EM-tuning distance 177c can vary from about 0.01 mm to about 1 mm.

The third plasma-tuning rod (170c, 175c) can have a third diameter ($d_{1c}$) associated therewith that can vary from about 0.01 mm to about 1 mm. The third plasma-tuning slab 161c can comprise dielectric material and can have a third diameter ($D_{1c}$) associated therewith that can vary from about 1 mm to about 10 mm. The third EM-coupling region 162c, the third control assembly 160c, and the third plasma-tuning slab 161c can have a third x/y plane offset ($x_{1c}$) associated therewith, and the third x/y plane offset ($x_{1c}$) can be wavelength-dependent and can vary from about a quarter wavelength ($\lambda/4$) to about ($10\lambda$). The third control assembly 160c can comprise dielectric material and can have a cylindrical configuration and a diameter ($d_{1c}$) that can vary from about 1 mm to about 5 mm.

A fourth plasma-tuning rod (170d, 175d) can comprise dielectric material and can have a fourth plasma-tuning portion 170d that can extend a fourth plasma-tuning distance 171d into the process space 115 at a fourth location defined using ($x_{2d}$). For example, the fourth plasma-tuning distance 171d can vary from about 10 mm to about 400 mm.

A fourth EM-coupling region 162d can be established at a fourth EM-coupling distance 176d from the first cavity wall 165a within the first EM energy tuning space 169a established in the first cavity assembly 168a, and the fourth EM-tuning portion 175d can extend into the fourth EM-coupling region 162d. The fourth EM-tuning portion 175d can obtain fourth microwave energy from the fourth EM-coupling region 162d, and the fourth microwave energy can be transferred to the process space 115 at the fourth location ($x_{2d}$) using the fourth plasma-tuning portion 170d. The fourth EM-coupling region 162d can include a maximum field region, a maximum voltage region, maximum energy region, or a maximum current region, or any combination thereof. For example, the fourth EM-coupling distance 176d can vary from about 0.01 mm to about 10 mm, and the fourth EM-coupling distance 176d can be wavelength-dependent and can vary from about ($2/\lambda$) to about ($10\lambda$).

A fourth plasma-tuning slab 161d can be coupled to a fourth control assembly 160d and can be used to move 163d the fourth plasma-tuning slab 161d a fourth EM-tuning distance 177d relative to the fourth EM-tuning portion 175d of the fourth plasma-tuning rod (170d, 175d) within the first EM energy tuning space 169a. The fourth control assembly 160d and the fourth plasma-tuning slab 161d can be used to optimize the microwave energy coupled from the fourth EM-coupling region 162d to the fourth EM-tuning portion 175d of the fourth plasma-tuning rod (170d, 175d). For example, the fourth EM-tuning distance 177d can be established between the fourth EM-tuning portion 175d and the fourth plasma-tuning slab 161d within the first EM energy tuning space 169a, and the fourth EM-tuning distance 177d can vary from about 0.01 mm to about 1 mm.

The fourth plasma-tuning rod (170d, 175d) can have a fourth diameter ($d_{1d}$) associated therewith that can vary from about 0.01 mm to about 1 mm. The fourth plasma-tuning slab 161d can have a fourth diameter ($D_{1d}$) associated therewith that can vary from about 1 mm to about 10 mm. The fourth EM-coupling region 162d, the fourth control assembly 160d, and the fourth plasma-tuning slab 161d can have a fourth x/y plane offset ($x_{1d}$) associated therewith, and the fourth x/y plane offset ($x_{1d}$) can be wavelength-dependent and can vary from about a quarter wavelength ($\lambda/4$) to about ($10\lambda$). The fourth control assembly 160d can comprise dielectric material, can have a cylindrical configuration and a diameter ($d_{1d}$) that can vary from about 1 mm to about 5 mm.

A fifth plasma-tuning rod (170e, 175e) can comprise dielectric material and can have a fifth plasma-tuning portion 170e that can extend a fifth plasma-tuning distance 171e into the process space 115 at a fifth location defined using ($x_{2e}$). For example, the fifth plasma-tuning distance 171e can vary from about 10 mm to about 400 mm.

A fifth EM-coupling region 162e can be established at a fifth EM-coupling distance 176e from the first cavity wall 165a within the first EM energy tuning space 169a established in the first cavity assembly 168a, and the fifth EM-tuning portion 175e can extend into the fifth EM-coupling region 162e. The fifth EM-tuning portion 175e can obtain fifth microwave energy from the fifth EM-coupling region 162e, and the fifth microwave energy can be transferred to the process space 115 at the fifth location ($x_{2e}$) using the fifth plasma-tuning portion 170e. The fifth EM-coupling region 162e can include a maximum field region, a maximum voltage region, maximum energy region, or a maximum current region, or any combination thereof. For example, the fifth EM-coupling distance 176e can vary from about 0.01 mm to about 10 mm, and the fifth EM-coupling distance 176e can be wavelength-dependent and can vary from about ($\lambda/4$) to about ($10\lambda$).

A fifth plasma-tuning slab 161e can comprise dielectric material and can be coupled to a fifth control assembly 160e and can be used to move 163e the fifth plasma-tuning slab 161e a fifth EM-tuning distance 177e relative to the fifth EM-tuning portion 175e of the fifth plasma-tuning rod (170e, 175e) within the first EM energy tuning space 169a. The fifth control assembly 160e and the fifth plasma-tuning slab 161e can be used to optimize the microwave energy coupled from the fifth EM-coupling region 162e to the fifth EM-tuning portion 175e of the fifth plasma-tuning rod (170e, 175e). For example, the fifth EM-tuning distance 177e can be established between the fifth EM-tuning portion 175e and the fifth plasma-tuning slab 161e within the first EM energy tuning space 169a, and the fifth EM-tuning distance 177e can vary from about 0.01 mm to about 1 mm.

The fifth plasma-tuning rod (170e, 175e) can have a fifth diameter ($d_{1e}$) associated therewith that can vary from about 0.01 mm to about 1 mm. The fifth plasma-tuning slab 161e can have a fifth diameter ($D_{1e}$) associated therewith that can vary from about 1 mm to about 10 mm. The fifth EM-coupling region 162e, the fifth control assembly 160e, and the fifth plasma-tuning slab 161e can have a fifth x/y plane offset ($x_{1e}$) associated therewith, and the fifth x/y plane offset ($x_{1e}$) can be wavelength-dependent and can vary from about a quarter wavelength ($\lambda/4$) to about ($10\lambda$). The fifth control assembly 160e can comprise dielectric material, can have a cylindrical configuration and a diameter ($d_{1e}$) that can vary from about 1 mm to about 5 mm.

Still referring to FIG. 1A, a sixth plasma-tuning rod (170f, 175f) can comprise dielectric material and can have a sixth plasma-tuning portion 170f that can extend a sixth plasma-tuning distance 171f into the process space 115 at a sixth location defined using ($x_{2f}$). The sixth plasma-tuning distance 171f can vary from about 10 mm to about 400 mm.

A sixth EM-coupling region 162f can comprise dielectric material and can be established at a sixth EM-coupling distance 176f from the first cavity wall 165b within the second EM energy tuning space 169b established in the second cavity assembly 168b, and the sixth EM-tuning portion 175f can extend into the sixth EM-coupling region 162f. The sixth EM-tuning portion 175f can obtain sixth microwave energy from the sixth EM-coupling region 162f, and the sixth microwave energy can be transferred to the process space 115 at the sixth location ($x_{2f}$) using the sixth plasma-tuning portion 170f. The sixth EM-coupling region 162f can include a maximum field region, a maximum voltage region, maximum energy region, or a maximum current region, or any combination thereof. The sixth EM-coupling distance 176f can vary from about 0.01 mm to about 10 mm, or can be wavelength-dependent and can vary from about ($\lambda/4$) to about (10$\lambda$).

A sixth plasma-tuning slab 161f can comprise dielectric material and can be coupled to a sixth control assembly 160f and can be used to move 163f the sixth plasma-tuning slab 161f a sixth EM-tuning distance 177f relative to the sixth EM-tuning portion 175f of the sixth plasma-tuning rod (170f, 175f) within the second EM energy tuning space 169b. The sixth control assembly 160f and the sixth plasma-tuning slab 161f can be used to optimize the microwave energy coupled from the sixth EM-coupling region 162f to the sixth EM-tuning portion 175f of the sixth plasma-tuning rod (170f, 175f). For example, the sixth EM-tuning distance 177f can be established between the sixth EM-tuning portion 175f and the sixth plasma-tuning slab 161f within the second EM energy tuning space 169b, and the sixth EM-tuning distance 177f can vary from about 0.01 mm to about 1 mm.

The sixth plasma-tuning rod (170f, 175f) can have a sixth diameter ($d_{1f}$) associated therewith that can vary from about 0.01 mm to about 1 mm. The sixth plasma-tuning slab 161f can have a sixth diameter ($D_{1f}$) associated therewith that can vary from about 1 mm to about 10 mm. The sixth EM-coupling region 162f, the sixth control assembly 160f, and the sixth plasma-tuning slab 161f can have a sixth x/y plane offset ($x_{1f}$) associated therewith, and the sixth x/y plane offset ($x_{1f}$) can be wavelength-dependent and can vary from about a quarter wavelength ($\lambda/4$) to about (10$\lambda$). The sixth control assembly 160f can comprise dielectric material, can have a cylindrical configuration and a diameter ($d_{1f}$) that can vary from about 1 mm to about 5 mm.

A seventh plasma-tuning rod (170g, 175g) can comprise dielectric material and can have a seventh plasma-tuning portion 170g that can extend a seventh plasma-tuning distance 171g into the process space 115 at a seventh location defined using ($x_{2g}$). The seventh plasma-tuning distance 171g can vary from about 10 mm to about 400 mm.

A seventh EM-coupling region 162g can be established at a seventh EM-coupling distance 176g from the first cavity wall 165b within the second EM energy tuning space 169b established in the second cavity assembly 168b, and the seventh EM-tuning portion 175g can extend into the seventh EM-coupling region 162g. The seventh EM-tuning portion 175g can obtain seventh microwave energy from the seventh EM-coupling region 162g, and the seventh microwave energy can be transferred to the process space 115 at the seventh location ($x_{2g}$) using the seventh plasma-tuning portion 170g. The seventh EM-coupling region 162g can include a maximum field region, a maximum voltage region, maximum energy region, or a maximum current region, or any combination thereof. For example, the seventh EM-coupling distance 176g can vary from about 0.01 mm to about 10 mm, and the seventh EM-coupling distance 176g can be wavelength-dependent and can vary from about ($\lambda/4$) to about (10$\lambda$).

A seventh plasma-tuning slab 161g can comprise dielectric material and can be coupled to a seventh control assembly 160g and can be used to move 163g the seventh plasma-tuning slab 161g a seventh EM-tuning distance 177g relative to the seventh EM-tuning portion 175g of the seventh plasma-tuning rod (170g, 175g) within the second EM energy tuning space 169b. The seventh control assembly 160g and the seventh plasma-tuning slab 161g can be used to optimize the microwave energy coupled from the seventh EM-coupling region 162g to the seventh EM-tuning portion 175g of the seventh plasma-tuning rod (170g, 175g). For example, the seventh EM-tuning distance 177g can be established between the seventh EM-tuning portion 175g and the seventh plasma-tuning slab 161g within the second EM energy tuning space 169b, and the seventh EM-tuning distance 177g can vary from about 0.01 mm to about 1 mm.

The seventh plasma-tuning rod (170g, 175g) can have a seventh diameter ($d_{1g}$) associated therewith that can vary from about 0.01 mm to about 1 mm. The seventh plasma-tuning slab 161g can have a seventh diameter ($D_{1g}$) associated therewith that can vary from about 1 mm to about 10 mm. The seventh EM-coupling region 162g, the seventh control assembly 160g, and the seventh plasma-tuning slab 161g can have a seventh x/y plane offset ($x_{1g}$) associated therewith, and the seventh x/y plane offset ($x_{1g}$) can be wavelength-dependent and can vary from about a quarter wavelength ($\lambda/4$) to about (10$\lambda$). The seventh control assembly 160g can comprise dielectric material, can have a cylindrical configuration and a diameter ($d_{1g}$) that can vary from about 1 mm to about 5 mm.

An eighth plasma-tuning rod (170h, 175h) can comprise dielectric material and can have an eighth plasma-tuning portion 170h that can extend an eighth plasma-tuning distance 171h into the process space 115 at an eighth location defined using ($x_{2h}$). The eighth plasma-tuning distance 171h can vary from about 10 mm to about 400 mm.

An eighth EM-coupling region 162h can be established at an eighth EM-coupling distance 176h from the first cavity wall 165b within the second EM energy tuning space 169b established in the second cavity assembly 168b, and the eighth EM-tuning portion 175h can extend into the eighth EM-coupling region 162h. The eighth EM-tuning portion 175h can obtain eighth microwave energy from the eighth EM-coupling region 162h, and the eighth microwave energy can be transferred to the process space 115 at the eighth location ($x_{2h}$) using the eighth plasma-tuning portion 170h. The eighth EM-coupling region 162h can include a maximum field region, a maximum voltage region, maximum energy region, or a maximum current region, or any combination thereof. For example, the eighth EM-coupling distance 176h can vary from about 0.01 mm to about 10 mm, and the eighth EM-coupling distance 176h can be wavelength-dependent and can vary from about (2/$\lambda$) to about (10$\lambda$).

An eighth plasma-tuning slab 161h can comprise dielectric material and can be coupled to an eighth control assembly 160h and can be used to move 163h the eighth plasma-tuning slab 161h an eighth EM-tuning distance 177h relative to the eighth EM-tuning portion 175h of the eighth plasma-tuning rod (170h, 175h) within the second EM energy tuning space 169b. The eighth control assembly 160h and the eighth plasma-tuning slab 161h can be used to optimize the microwave energy coupled from the eighth EM-coupling region 162h to the eighth EM-tuning portion 175h of the eighth plasma-tuning rod (170h, 175h). The eighth EM-tuning distance 177h can be established between the eighth EM-tuning portion 175h and the eighth plasma-tuning slab 161h within the second EM energy tuning space 169b, and the eighth EM-tuning distance 177h can vary from about 0.01 mm to about 1 mm.

The eighth plasma-tuning rod (170h, 175h) can have an eighth diameter ($d_{1h}$) associated therewith that can vary from about 0.01 mm to about 1 mm. The eighth plasma-tuning slab 161h can have an eighth diameter ($D_{1h}$) associated therewith that can vary from about 1 mm to about 10 mm. The eighth EM-coupling region 162h, the eighth control assembly 160h, and the eighth plasma-tuning slab 161h can have an eighth x/y plane offset ($x_{1h}$) associated therewith, and the eighth x/y plane offset ($x_{1h}$) can be wavelength-dependent and can vary from about a quarter wavelength ($\lambda/4$) to about (10$\lambda$). The eighth control assembly 160h can comprise dielectric material, can have a cylindrical configuration and a diameter ($d_{1h}$) that can vary from about 1 mm to about 5 mm.

A ninth plasma-tuning rod (170i, 175i) can comprise dielectric material and can have a ninth plasma-tuning portion 170i that can extend a ninth plasma-tuning distance 171i into the process space 115 at a ninth location defined using ($x_{2i}$). For example, the ninth plasma-tuning distance 171i can vary from about 10 mm to about 400 mm.

A ninth EM-coupling region 162i can be established at a ninth EM-coupling distance 176i from the first cavity wall 165b within the second EM energy tuning space 169b established in the second cavity assembly 168b, and the ninth EM-tuning portion 175i can extend into the ninth EM-coupling region 162i. The ninth EM-tuning portion 175i can obtain ninth microwave energy from the ninth EM-coupling region 162i, and the ninth microwave energy can be transferred to the process space 115 at the ninth location ($x_{2i}$) using the ninth plasma-tuning portion 170i. The ninth EM-coupling region 162i can include a maximum field region, a maximum voltage region, maximum energy region, or a maximum current region, or any combination thereof. For example, the ninth EM-coupling distance 176i can vary from about 0.01 mm to about 10 mm, and the ninth EM-coupling distance 176i can be wavelength-dependent and can vary from about ($\lambda/4$) to about (10$\lambda$).

A ninth plasma-tuning slab 161i can comprise dielectric material and can be coupled to a ninth control assembly 160i and can be used to move 163i the ninth plasma-tuning slab 161i a ninth EM-tuning distance 177i relative to the ninth EM-tuning portion 175i of the ninth plasma-tuning rod (170i, 175i) within the second EM energy tuning space 169b. The ninth control assembly 160i and the ninth plasma-tuning slab 161i can be used to optimize the microwave energy coupled from the ninth EM-coupling region 162i to the ninth EM-tuning portion 175i of the ninth plasma-tuning rod (170i, 175i). For example, the ninth EM-tuning distance 177i can be established between the ninth EM-tuning portion 175i and the ninth plasma-tuning slab 161i within the second EM energy tuning space 169b, and the ninth EM-tuning distance 177i can vary from about 0.01 mm to about 1 mm.

The ninth plasma-tuning rod (170i, 175i) can have a ninth diameter ($d_{1i}$) associated therewith that can vary from about 0.01 mm to about 1 mm. The ninth plasma-tuning slab 161i can have a ninth diameter ($D_{1i}$) associated therewith that can vary from about 1 mm to about 10 mm. The ninth EM-coupling region 162i, the ninth control assembly 160i, and the ninth plasma-tuning slab 161i can have a ninth x/y plane offset ($x_{1i}$) associated therewith, and the ninth x/y plane offset ($x_{1i}$) can be wavelength-dependent and can vary from about a quarter wavelength ($\lambda/4$) to about (10$\lambda$). The ninth control assembly 160i can comprise dielectric material, can have a cylindrical configuration and a diameter ($d_{1i}$) that can vary from about 1 mm to about 5 mm.

A tenth plasma-tuning rod (170j, 175j) can comprise dielectric material and can have a tenth plasma-tuning portion 170j that can extend a tenth plasma-tuning distance 171j into the process space 115 at a tenth location defined using ($x_{2j}$). For example, the tenth plasma-tuning distance 171j can vary from about 10 mm to about 400 mm.

A tenth EM-coupling region 162j can be established at a tenth EM-coupling distance 176j from the first cavity wall 165b within the second EM energy tuning space 169b established in the second cavity assembly 168b, and the tenth EM-tuning portion 175j can extend into the tenth EM-coupling region 162j. The tenth EM-tuning portion 175j can obtain tenth microwave energy from the tenth EM-coupling region 162j, and the tenth microwave energy can be transferred to the process space 115 at the tenth location ($x_{2j}$) using the tenth plasma-tuning portion 170j. The tenth EM-coupling region 162j can include a maximum field region, a maximum voltage region, maximum energy region, or a maximum current region, or any combination thereof. For example, the tenth EM-coupling distance 176j can vary from about 0.01 mm to about 10 mm, and the tenth EM-coupling distance 176j can be wavelength-dependent and can vary from about ($\lambda/4$) to about (10$\lambda$).

A tenth plasma-tuning slab 161j can comprise dielectric material, can be coupled to a tenth control assembly 160j and can be used to move 163j the tenth plasma-tuning slab 161j a tenth EM-tuning distance 177j relative to the tenth EM-tuning portion 175j of the tenth plasma-tuning rod (170j, 175j) within the second EM energy tuning space 169b. The tenth control assembly 160j and the tenth plasma-tuning slab 161j can be used to optimize the microwave energy coupled from the tenth EM-coupling region 162j to the tenth EM-tuning portion 175j of the tenth plasma-tuning rod (170j, 175j). For example, the tenth EM-tuning distance 177j can be established between the tenth EM-tuning portion 175j and the tenth plasma-tuning slab 161j within the second EM energy tuning space 169b, and the tenth EM-tuning distance 177j can vary from about 0.01 mm to about 1 mm.

The tenth plasma-tuning rod (170j, 175j) can have a tenth diameter ($d_{1j}$) associated therewith that can vary from about 0.01 mm to about 1 mm. The tenth plasma-tuning slab 161j can have a tenth diameter ($D_{1j}$) associated therewith that can vary from about 1 mm to about 10 mm. The tenth EM-coupling region 162j, the tenth control assembly 160j, and the tenth plasma-tuning slab 161j can have a tenth x/y plane offset ($x_{1j}$) associated therewith, and the tenth x/y plane offset ($x_{1j}$) can be wavelength-dependent and can vary from about a quarter wavelength ($\lambda/4$) to about (10$\lambda$). The tenth control assembly 160j can comprise dielectric material, can have a cylindrical configuration and a diameter ($d_{1j}$) that can vary from about 1 mm to about 5 mm.

The top view of first microwave processing system 100 includes a top view of a first cavity-control assembly 145a that is shown coupled to a top view of a first cavity-tuning slab 146a. The first cavity-control assembly 145a can comprise dielectric material, and can have a first diameter ($d_{1aa}$) associated therewith, and the first diameter ($d_{1aa}$) can vary from about 0.01 mm to about 1 mm. The first cavity-tuning slab 146a can comprise dielectric material, and can have a second diameter ($D_{1aa}$) associated therewith, and the second diameter ($D_{1aa}$) can vary from about 1 mm to about 10 mm. The first cavity-control assembly 145a and the first cavity-tuning slab 146a can have a first x/y plane offset ($y_{1aa}$) associated therewith that can vary from about 1 mm to about 10 mm. In this and all later embodiments, it may be appreciated that the dimensions provided may differ from that recited, for example, the diameters of the cavity-control assemblies and cavity-tuning slabs can be up to 10 mm or greater and up to 80 mm or greater, respectively.

In addition, the top view of first microwave processing system 100 includes a top view of a second cavity-control assembly 145b that is shown coupled to a top view of a second cavity-tuning slab 146b. The second cavity-control assembly 145b can comprise dielectric material, and can have a first additional diameter ($d_{1ba}$) associated therewith, and the first additional diameter ($d_{1ba}$) can vary from about 0.01 mm to about 1 mm. The second cavity-tuning slab 146b can have a second additional diameter ($D_{1ba}$) associated therewith, and the second additional diameter ($D_{1ba}$) can vary from about 1 mm to about 10 mm. The second cavity-control assembly 145b and the second cavity-tuning slab 146b can comprise dielectric material, and can have a second x/y plane offset ($y_{1ba}$) associated therewith, and the second x/y plane offset ($y_{1ba}$) can vary from about 1 mm to about 10 mm.

FIG. 1B shows a partial cut-away front view of process chamber 110 in a first microwave processing system 100. The front view shows an x/z plane view of a plurality of additional walls 112 coupled to each other, thereby creating a partial cut-away front view of a process space 115 in the process chamber 110. The first microwave processing system 100 can be configured to form plasma in the process space 115.

The front view shows a cut-away view of a first cavity assembly 168a having a first EM energy tuning space 169a therein, and the first cavity assembly 168a can include a first cavity wall 165a, a second cavity wall 166a, at least one third cavity wall 167a, and one or more additional cavity walls (not shown). For example, the first cavity assembly 168a can be coupled to the first interface assembly 112a using the first cavity wall 165a. The front view also shows a cut-away view of a second cavity assembly 168b having a second EM energy tuning space 169b therein, and the second cavity assembly 168b can include a first cavity wall 165b, a second cavity wall 166b, at least one third cavity wall 167b, and one or more additional cavity walls (not shown). For example, the second cavity assembly 168b can be coupled to the second interface assembly 112b using the first cavity wall 165b.

A partial front view (dash line view) of a first set of plasma tuning rods (170a-170e), a partial front view (dash line view) of a first set of plasma-tuning slabs (161a-161e), a partial front view (dotted line view) of a second set of plasma tuning rods (170f-170j), and a partial front view (dotted line view) of a second set of plasma-tuning slabs (161f-161j) are shown in FIG. 1B.

The first set of plasma tuning rods (170a-170e) and the first set of plasma-tuning slabs (161a-161e) can have a first set of x/y plane offsets ($x_{2a-e}$) associated therewith, and the first set of x/y plane offsets ($x_{2a-e}$) can vary from about 10 mm to about 100 mm. The first set of plasma tuning rods (170a-170e) and the first set of plasma-tuning slabs (161a-161e) can have a first set of x/z plane offsets ($z_{1a-e}$) associated therewith, and the first set of x/z plane offsets ($z_{1a-e}$) can vary from about 100 mm to about 400 mm.

The second set of plasma tuning rods (170f-170j) and the second set of plasma-tuning slabs (161f-161j) can have a second set of x/y plane offsets ($x_{2f-j}$) associated therewith, and the second set of x/y plane offsets ($x_{2f-j}$) can vary from about 10 mm to about 100 mm. The second set of plasma tuning rods (170f-170j) and the second set of plasma-tuning slabs (161f-161j) can have a second set of x/z plane offsets ($z_{1f-j}$) associated therewith, and the second set of x/z plane offsets ($z_{1f-j}$) can vary from about 100 mm to about 400 mm.

FIG. 1B shows that the first microwave processing system 100 can include one or more plasma sensors 106 coupled to a chamber wall 112 to obtain first plasma data. In addition, the first microwave processing system 100 may be configured to process 200 mm substrates, 300 mm substrates, or larger-sized substrates. In addition, cylindrical, square and rectangular chambers can each be configured so that the first microwave processing system 100 may be configured to process circular, square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

As shown in FIG. 1B, a first EM source 150a can be coupled to a first cavity assembly 168a, and a second EM source 150b can be coupled to a second cavity assembly 168b. The first EM source 150a can be coupled to a first matching network 152a, and the first matching network 152a can be coupled to a first coupling network 154a. The second EM source 150b can be coupled to a second matching network 152b, and the second matching network 152b can be coupled to a second coupling network 154b. Alternatively, a plurality of matching networks (not shown) or a plurality of coupling networks (not shown) may be used.

The first coupling network 154a can be removably coupled to the first cavity assembly 168a that can be removably coupled to an upper portion of a first interface assembly 112a of the process chamber 110. The first coupling network 154a can be used to provide microwave energy to the first EM energy tuning space 169a in the first cavity assembly 168a. The second coupling network 154b can be removably coupled to the second cavity assembly 168b that can be removably coupled to an upper portion of a second interface assembly 112b of the process chamber 110. The second coupling network 154b can be used to provide additional microwave energy to the second EM energy tuning space 169b in the second cavity assembly 168b. Alternatively, other EM-coupling configurations may be used.

As shown in FIG. 1B, a controller 195 can be coupled 196 to the EM sources (150a, 150b), the matching networks (152a, 152b), the coupling networks (154a, 154b), and the cavity assemblies (168a, 168b), and the controller 195 can use process recipes to establish, control, and optimize the EM sources (150a, 150b), the matching networks (152a, 152b), the coupling networks (154a, 154b), and the cavity assemblies (168a, 168b) to control the plasma uniformity within the process space 115. For example, the EM sources (150a, 150b) can operate at a frequency from about 500 MHz to about 5000 MHz. In addition, the controller 195 can be coupled 196 to the plasma sensors 106 and process sensors 107, and the controller 195 can use process recipes to establish, control, and optimize the data from the plasma sensors 106 and the process sensors 107 to control the plasma uniformity within the process space 115.

In addition, the controller 195 can be coupled 196 to gas supply system 140, to a gas supply subassembly 141, and to a gas showerhead 143. For example, the gas supply system 140, the gas supply subassembly 141 and the gas showerhead 143 can be configured to introduce one or more process gases to process space 115, and can include flow control and/or flow measuring devices.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

As shown in FIG. 1B, the first microwave processing system 100 can include a pressure control system 190 and port 191 coupled to the process chamber 110, and configured to evacuate the process chamber 110, as well as control the pressure within the process chamber 110. In addition, the first microwave processing system 100 can include a substrate holder 120 for mounting the substrate 105 in the process space 115.

The front view of first microwave processing system 100 includes a partial front view of a first cavity-control assembly 145*a* that is shown coupled to a front view of a first cavity-tuning slab 146*a*. The first cavity-control assembly 145*a* and the first cavity-tuning slab 146*a* can have a first x/z plane offset ($z_{1aa}$) associated therewith, and the first x/z plane offset ($z_{1aa}$) can vary from about 1 mm to about 10 mm.

The first cavity-control assembly 145*a* can be used to move 147*a* the first cavity-tuning slab 146*a* cavity-tuning distances 148*a* within the first EM-energy tuning space 169*a*. The controller 195 can be coupled 196 to the cavity-control assembly 145*a*, and the controller 195 can use process recipes to establish, control, and optimize the cavity-tuning distances 148*a* to control and maintain the plasma uniformity within the process space 115 in real-time. For example, the cavity-tuning distances 148*a* can vary from about 0.01 mm to about 10 mm, and the cavity-tuning distances 148*a* can be wavelength-dependent and can vary from about ($2/\lambda$) to about ($10\lambda$).

In addition, the front view of first microwave processing system 100 includes a partial front view of a second cavity-control assembly 145*b* that is shown coupled to a front view of a second cavity-tuning slab 146*b*. The second cavity-control assembly 145*b* and the second cavity-tuning slab 146*b* can have a second x/z plane offset ($z_{1ba}$) associated therewith, and the second x/z plane offset ($z_{1ba}$) vary from about 1 mm to about 10 mm.

The second cavity-control assembly 145*b* can be used to move 147*b* the second cavity-tuning slab 146*b* second cavity-tuning distances 148*b* within the second EM-energy tuning space 169*b*. The controller 195 can be coupled 196 to the second cavity-control assembly 145*b*, and the controller 195 can use process recipes to establish, control, and optimize the second cavity-tuning distances 148*b* to control and maintain the plasma uniformity within the process space 115 in real-time. For example, the second cavity-tuning distances 148*b* can vary from about 0.01 mm to about 10 mm, and the second cavity-tuning distances 148*b* can be wavelength-dependent and can vary from about ($\lambda/4$) to about ($10\lambda$).

FIG. 1C shows a partial cut-away side view of the process chamber 110 in the first microwave processing system 100. The side view shows a y/z plane view of a plurality of chamber walls 112 coupled to a first interface assembly 112*a* and to a second interface assembly 112*b*, thereby creating a partial cut-away y/z plane view of the process space 115 in the process chamber 110. The first microwave processing system 100 can be configured to form uniform plasma in the process space 115.

A partial side view of a first EM energy tuning space 169*a* in the first cavity assembly 168*a* and a partial side view of a second EM energy tuning space 169*b* in the second cavity assembly 168*b* are shown in FIG. 1C. A partial side view of the first set of plasma tuning rods (170*a*-170*e*), a partial side view of a first set of plasma-tuning slabs (161*a*-161*e*), a partial side view of a second set of plasma tuning rods (170*f*-170*j*), and a partial side view of a second set of plasma-tuning slabs (161*f*-161*j*) are shown in FIG. 1C.

Side views of a first set of isolation assemblies (164*a*, 164*b*, 164*c*, 164*d*, and 164*e*) and a second set of isolation assemblies (164*f*, 164*g*, 164*h*, 164*i*, and 164*j*) are also shown in FIG. 1C. For example, first set of isolation assemblies (164*a*, 164*b*, 164*c*, 164*d*, and 164*e*) can be used to removably couple the first set of plasma tuning rods {(170*a*, 170*b*, 170*c*, 170*d*, and 170*e*) and (175*a*, 175*b*, 175*c*, 175*d*, and 175*e*)} to a first interface assembly 112*a*. Each of the first set of isolation assemblies (164*a*, 164*b*, 164*c*, 164*d*, and 164*e*) can be removably coupled to a first interface assembly 112*a*. In addition, the second set of isolation assemblies (164*f*, 164*g*, 164*h*, 164*i*, and 164*j*) can be used to removably couple the second set of plasma tuning rods {(170*f*, 170*g*, 170*h*, 170*i*, and 170*j*) and (175*f*, 175*g*, 175*h*, 175*h*, and 175*j*)} to a second interface assembly 112*b*. Each of the second set of isolation assemblies (164*f*, 164*g*, 164*h*, 164*i*, and 164*j*) can be removably coupled to a second interface assembly 112*b*.

As shown in FIG. 1C, a first set of plasma-tuning slabs (161*a*, 161*b*, 161*c*, 161*d*, and 161*e*) can be coupled to a first set of control assemblies (160*a*, 160*b*, 160*c*, 160*d*, and 160*e*), and first set of control assemblies (160*a*, 160*b*, 160*c*, 160*d*, and 160*e*) can be used to move (163*a*, 163*b*, 163*c*, 163*d*, and 163*e*) the first set of plasma-tuning slabs (161*a*, 161*b*, 161*c*, 161*d*, and 161*e*) the first set of EM-tuning distances (177*a*, 177*b*, 177*c*, 177*d*, and 177*e*) relative to the EM-tuning portions (175*a*, 175*b*, 175*c*, 175*d*, and 175*e*) within the first EM energy tuning space 169*a*. In addition, a second set of plasma-tuning slabs (161*f*, 161*g*, 161*h*, 161*i*, and 161*i*) can be coupled to a second set of control assemblies (160*f*, 160*g*, 160*h*, 160*i*, and 160*j*), and the second set of control assemblies (160*f*, 160*g*, 160*h*, 160*i*, and 160*j*) can be used to move (163*f*, 163*g*, 163*h*, 163*i*, and 163*j*) the second set of plasma-tuning slabs (161*f*, 161*g*, 161*h*, 161*i*, and 161*j*) the second set of EM-tuning distances (177*f*, 177*g*, 177*h*, 177*i*, and 177*j*) relative to the EM-tuning portions (175*f*, 175*g*, 175*h*, 175*i*, and 175*j*) within the second EM energy tuning space 169*b*.

The first set of control assemblies (160*a*, 160*b*, 160*c*, 160*d*, and 160*e*) can be coupled 196 to the controller 195, and the controller 195 can use process recipes to establish, control, and optimize the first set of EM-tuning distances (177*a*, 177*b*, 177*c*, 177*d*, and 177*e*) to control the plasma uniformity within the process space 115. In addition, the second set of control assemblies (160*f*, 160*g*, 160*h*, 160*i*, and 160*j*) can be coupled 196 to the controller 195, and the controller 195 can use process recipes to establish, control, and optimize the second set of EM-tuning distances (177*f*, 177*g*, 177*h*, 177*i*, and 177*j*) to control the plasma uniformity within the process space 115.

The controller 195 can be coupled 196 to the EM sources (150*a*, 150*b*), the matching networks (152*a*, 152*b*), the coupling networks (154*a*, 154*b*), and the cavity assemblies (168*a*, 168*b*), and the controller 195 can use process recipes to establish, control, and optimize the EM sources (150*a*, 150*b*), the matching networks (152*a*, 152*b*), the coupling networks (154*a*, 154*b*), and the cavity assemblies (168*a*, 168b) to control the plasma uniformity within the process space 115. For example, the EM sources (150a, 150b) can operate at frequencies from about 500 MHz to about 5000 MHz. In addition, the controller 195 can be coupled 196 to the plasma sensors 106, the process sensors 107, and the cavity sensors (108a and 108b), and the controller 195 can use process recipes to establish, control, and optimize the data from the plasma sensors 106, the process sensors 107, and the cavity sensors (108a and 108b), to control the plasma uniformity within the process space 115.

The side view illustrates a process chamber 110 having a total width ($y_T$), and a total height ($z_T$) associated therewith in the y/z plane. The total width ($y_T$) can vary from about 50 mm to about 500 mm, and the total height ($z_T$) can vary from about 50 mm to about 500 mm.

Figure 2A:
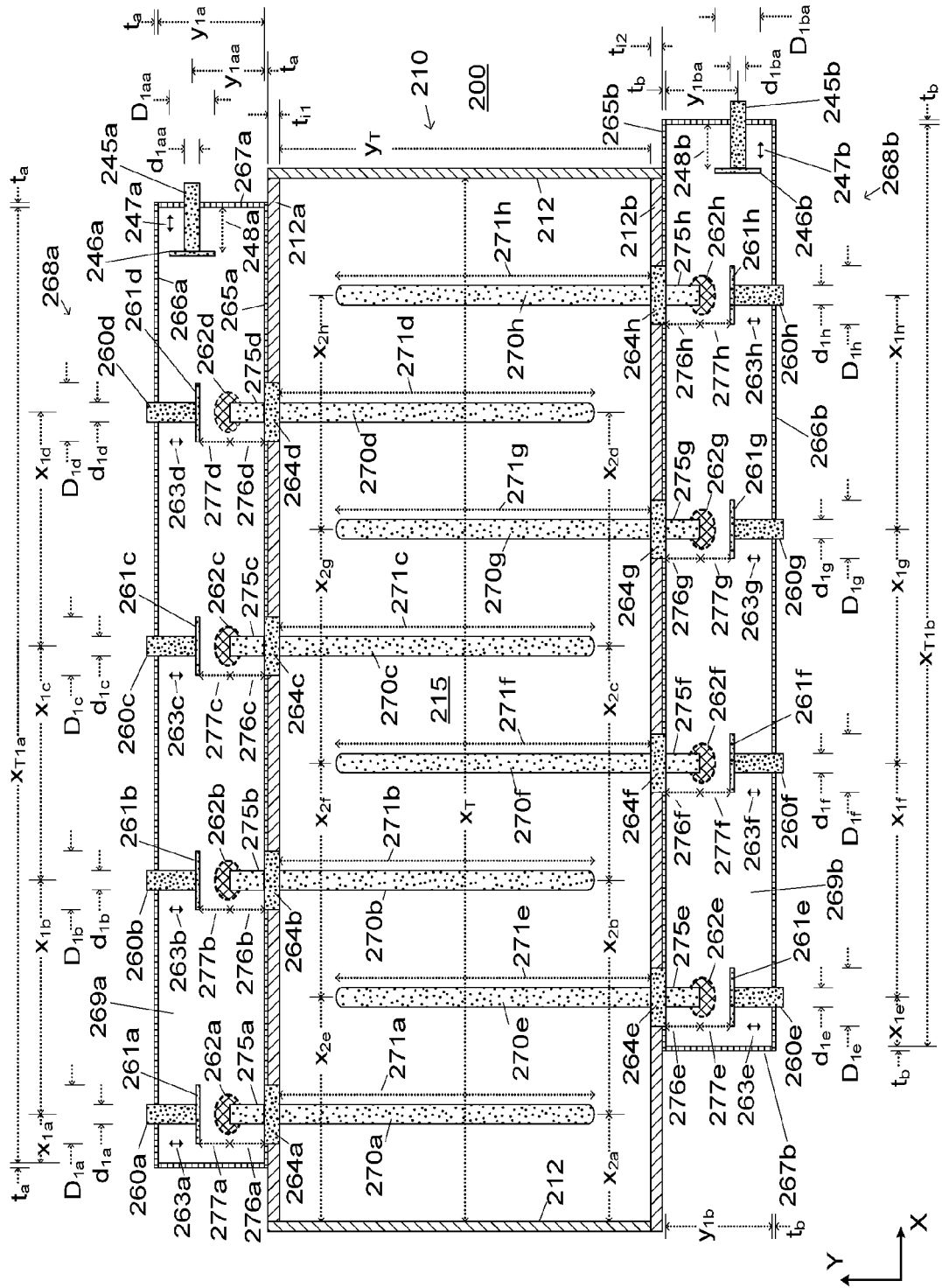
FIGS. 2A-2C illustrate different exemplary views of a second microwave processing system according to embodiments of the invention.

FIG. 2A shows a partial cut-away top view of a second process chamber 210 in a second microwave processing system 200. The top view shows an x/y plane view of a first interface assembly 212a, a second interface assembly 212b, and a plurality of additional chamber walls 212 coupled to the first interface assembly 212a and the second interface assembly 212b thereby forming the second process chamber 210. For example, the chamber walls 212 can have wall thicknesses (t) associated therewith, and the wall thicknesses (t) can vary from about 1 mm to about 5 mm. The first interface assembly 212a can have a first interface thickness ($t_{i1}$) associated therewith, and the first interface thickness ($t_{i1}$) can vary from about 1 mm to about 10 mm. The second interface assembly 212b can have a second interface thickness ($t_{i2}$) associated therewith, and the second interface thickness ($t_{i2}$) can vary from about 1 mm to about 10 mm. The process space 215 can have a length ($x_T$) associated therewith, and the length ($x_T$) can vary from about 10 mm to about 500 mm.

The top view of the second microwave processing system 200 shows a cut-away view of a first cavity assembly 268a having a first EM energy tuning space 269a therein, and the first cavity assembly 268a can include a first cavity wall 265a, a second cavity wall 266a, at least one third cavity wall 267a, and one or more additional cavity walls (not shown). For example, the first cavity assembly 268a can be coupled to the first interface assembly 212a using the first cavity wall 265a, and walls (265a, 266a, and 267a) can comprise dielectric material and can have wall thicknesses ($t_a$) associated therewith, and the wall thicknesses ($t_a$) can vary from about 1 mm to about 5 mm. In addition, the first EM energy tuning space 269a can have a first length ($x_{T1a}$) and a first width ($y_{1a}$) associated therewith, the first length ($x_{T1a}$) can vary from about 10 mm to about 500 mm, and the first width ($y_{1a}$) can vary from about 5 mm to about 50 mm.

The top view of the second microwave processing system 200 also shows a cut-away view of a second cavity assembly 268b having a second EM energy tuning space 269b therein, and the second cavity assembly 268b can include a first cavity wall 265b, a second cavity wall 266b, at least one third cavity wall 267b, and one or more additional cavity walls (not shown). For example, the second cavity assembly 268b can be coupled to the second interface assembly 212b using the first cavity wall 265b, and walls (265b, 266b, and 267b) can comprise dielectric material and can have wall thicknesses ($t_b$) associated therewith, and the wall thicknesses ($t_b$) can vary from about 1 mm to about 5 mm. In addition, the second EM energy tuning space 269b can have a second length ($x_{T1b}$) and a second width ($y_{1b}$) associated therewith, the second length ($x_{T1b}$) can vary from about 10 mm to about 500 mm, and the second width ($y_{1b}$) can vary from about 5 mm to about 50 mm.

In some exemplary systems, a first set of isolation assemblies (264a, 264b, 264c, and 264d) can be removably coupled to a first interface assembly 212a and can be configured to isolate the process space 215 from the first EM energy tuning space 269a. The first set of isolation assemblies (264a, 264b, 264c, and 264d) can be used to removably couple the first set of plasma tuning rods {(270a, 270b, 270c, and 270d) and (275a, 275b, 275c, 275d)} to a first interface assembly 212a. For example, the first set of plasma-tuning portions (270a, 270b, 270c, and 270d) can be configured in the process space 215, and the first set of EM-tuning portions (275a, 275b, 275c, and 275d) can be configured within the first EM energy tuning space 269a.

A second set of isolation assemblies (264e, 264f, 264g, and 264h) can be removably coupled to the second interface assembly 212b and can be configured to isolate the process space 215 from the second EM energy tuning space 269b. The second set of isolation assemblies (264e, 264f, 264g, and 264h) can be used to removably couple the second set of plasma tuning rods {(270e, 270f, 270g, and 270h) and (275e, 275f, 275g, and 275h)} to the second interface assembly 212b. For example, the second set of plasma-tuning portions (270e, 270f, 270g, and 270h) can be configured in the process space 215, and the second set of EM-tuning portions (275e, 275f, 275g, and 275h) can be configured within the second EM energy tuning space 269b.

Still referring to FIG. 2A, a first plasma-tuning rod (270a, 275a) can comprise dielectric material and can have a first plasma-tuning portion 270a that can extend a first plasma-tuning distance 271a into the process space 215 at a first location defined using ($x_{2a}$). The first plasma-tuning distance 271a can vary from about 10 mm to about 400 mm.

A first EM-coupling region 262a can be established at a first EM-coupling distance 276a from the first cavity wall 265a within the first EM energy tuning space 269a established in the first cavity assembly 268a, and the first EM-tuning portion 275a can extend into the first EM-coupling region 262a. The first EM-tuning portion 275a can obtain first microwave energy from the first EM-coupling region 262a, and the first microwave energy can be transferred to the process space 215 at the first location ($x_{2a}$) using the first plasma-tuning portion 270a. The first EM-coupling region 262a can include a maximum field region, a maximum voltage region, maximum energy region, or a maximum current region, or any combination thereof. For example, the first EM-coupling distance 276a can vary from about 0.01 mm to about 10 mm, and the first EM-coupling distance 276a can be wavelength-dependent and can vary from about ($\lambda/4$) to about ($10\lambda$).

A first plasma-tuning slab 261a can comprise dielectric material, can be coupled to a first control assembly 260a, and can be used to move 263a the first plasma-tuning slab 261a a first EM-tuning distance 277a relative to the first EM-tuning portion 275a of the first plasma-tuning rod (270a, 275a) within the first EM energy tuning space 269a. The first control assembly 260a and the first plasma-tuning slab 261a can be used to optimize the microwave energy coupled from the first EM-coupling region 262a to the first EM-tuning portion 275a of the first plasma-tuning rod (270a, 275a). For example, the first EM-tuning distance 277a can be established between the first EM-tuning portion 275a and the first plasma-tuning slab 261a within the first EM energy tuning space 269a, and the first EM-tuning distance 277a can vary from about 0.01 mm to about 1 mm.

The first plasma-tuning rod (270a, 275a) can have a first diameter ($d_{1a}$) associated therewith that can vary from about 0.01 mm to about 1 mm. The first plasma-tuning slab 261a can have a first diameter ($D_{1a}$) associated therewith that can vary from about 1 mm to about 10 mm. The first EM-coupling region 262a, the first control assembly 260a, and the first plasma-tuning slab 261a can have a first x/y plane offset ($x_{1a}$) associated therewith, and the first x/y plane offset ($x_{1a}$) can be wavelength-dependent and can vary from about a quarter wavelength ($\lambda/4$) to about ($10\lambda$). The first control assembly 260a can comprise dielectric material, can have a cylindrical configuration and a diameter ($d_{1a}$) that can vary from about 1 mm to about 5 mm.

A second plasma-tuning rod (270b, 275b) can comprise dielectric material and can have a second plasma-tuning portion 270b that can extend a second plasma-tuning distance 271b into the process space 215 at a second location defined using ($x_{2b}$). For example, the second plasma-tuning distance 271b can vary from about 10 mm to about 400 mm.

A second EM-coupling region 262b can be established at a second EM-coupling distance 276b from the first cavity wall 265a within the first EM energy tuning space 269a established in the first cavity assembly 268a, and the second EM-tuning portion 275b can extend into the second EM-coupling region 262b. The second EM-tuning portion 275b can obtain second microwave energy from the second EM-coupling region 262b, and the second microwave energy can be transferred to the process space 215 at the second location ($x_{1b}$) using the second plasma-tuning portion 270b. The second EM-coupling region 262b can include a maximum field region, a maximum voltage region, maximum energy region, or a maximum current region, or any combination thereof. For example, the second EM-coupling distance 276b can vary from about 0.01 mm to about 10 mm, and the second EM-coupling distance 276b can be wavelength-dependent and can vary from about ($\lambda/4$) to about ($10\lambda$).

A second plasma-tuning slab 261b can comprise dielectric material, can be coupled to a second control assembly 260b, and can be used to move 263b the second plasma-tuning slab 261b a second EM-tuning distance 277b relative to the second EM-tuning portion 275b of the second plasma-tuning rod (270b, 275b) within the first EM energy tuning space 269a. The second control assembly 260b and the second plasma-tuning slab 261b can be used to optimize the microwave energy coupled from the second EM-coupling region 262b to the second EM-tuning portion 275b of the second plasma-tuning rod (270b, 275b). For example, the second EM-tuning distance 277b can be established between the second EM-tuning portion 275b and the second plasma-tuning slab 261b within the first EM energy tuning space 269a, and the second EM-tuning distance 277b can vary from about 0.01 mm to about 1 mm.

The second plasma-tuning rod (270b, 275b) can have a second diameter ($d_{1b}$) associated therewith that can vary from about 0.01 mm to about 1 mm. The second plasma-tuning slab 261b can have a second diameter ($D_{1b}$) associated therewith that can vary from about 1 mm to about 10 mm. The second EM-coupling region 262b, the second control assembly 260b, and the second plasma-tuning slab 261b can have a second x/y plane offset ($x_{1b}$) associated therewith, and the second x/y plane offset ($x_{1b}$) can be wavelength-dependent and can vary from about a quarter wavelength ($\lambda/4$) to about ($10\lambda$). The second control assembly 260b can comprise dielectric material, can have a cylindrical configuration and a diameter ($d_{1b}$) that can vary from about 1 mm to about 5 mm.

A third plasma-tuning rod (270c, 275c) can comprise dielectric material and can have a third plasma-tuning portion 270c that can extend a third plasma-tuning distance 271c into the process space 215 at a third location defined using ($x_{2c}$). For example, the third plasma-tuning distance 271c can vary from about 10 mm to about 400 mm.

A third EM-coupling region 262c can be established at a third EM-coupling distance 276c from the first cavity wall 265a within the first EM energy tuning space 269a established in the first cavity assembly 268a, and the third EM-tuning portion 275c can extend into the third EM-coupling region 262c. The third EM-tuning portion 275c can obtain third microwave energy from the third EM-coupling region 262c, and the third microwave energy can be transferred to the process space 215 at the third location ($x_{2c}$) using the third plasma-tuning portion 270c. The third EM-coupling region 262c can include a maximum field region, a maximum voltage region, maximum energy region, or a maximum current region, or any combination thereof. For example, the third EM-coupling distance 276c can vary from about 0.01 mm to about 10 mm, and the third EM-coupling distance 276c can be wavelength-dependent and can vary from about ($\lambda/4$) to about ($10\lambda$).

A third plasma-tuning slab 261c can comprise dielectric material, can be coupled to a third control assembly 260c and can be used to move 263c the third plasma-tuning slab 261c a third EM-tuning distance 277c relative to the third EM-tuning portion 275c of the third plasma-tuning rod (270c, 275c) within the first EM energy tuning space 269a. The third control assembly 260c and the third plasma-tuning slab 261c can be used to optimize the microwave energy coupled from the third EM-coupling region 262c to the third EM-tuning portion 275c of the third plasma-tuning rod (270c, 275c). For example, the third EM-tuning distance 277c can be established between the third EM-tuning portion 275c and the third plasma-tuning slab 261c within the first EM energy tuning space 269a, and the third EM-tuning distance 277c can vary from about 0.01 mm to about 1 mm.

The third plasma-tuning rod (270c, 275c) can have a third diameter ($d_{1c}$) associated therewith that can vary from about 0.01 mm to about 1 mm. The third plasma-tuning slab 261c can have a third diameter ($D_1$) associated therewith that can vary from about 1 mm to about 10 mm. The third EM-coupling region 262c, the third control assembly 260c, and the third plasma-tuning slab 261c can have a third x/y plane offset ($x_{1c}$) associated therewith, and the third x/y plane offset ($x_{1c}$) can be wavelength-dependent and can vary from about a quarter wavelength ($2/\lambda$) to about ($10\lambda$). The third control assembly 260c can comprise dielectric material, can have a cylindrical configuration and a diameter ($d_{1c}$) that can vary from about 1 mm to about 5 mm.

A fourth plasma-tuning rod (270d, 275d) can comprise dielectric material and can have a fourth plasma-tuning portion 270d that can extend a fourth plasma-tuning distance 271d into the process space 215 at a fourth location defined using ($x_{2d}$). For example, the fourth plasma-tuning distance 271d can vary from about 10 mm to about 400 mm.

A fourth EM-coupling region 262d can be established at a fourth EM-coupling distance 276d from the first cavity wall 265a within the first EM energy tuning space 269a established in the first cavity assembly 268a, and the fourth EM-tuning portion 275d can extend into the fourth EM-coupling region 262d. The fourth EM-tuning portion 275d can obtain fourth microwave energy from the fourth EM-coupling region 262d, and the fourth microwave energy can be transferred to the process space 215 at the fourth location ($x_{2d}$) using the fourth plasma-tuning portion 270d. The fourth EM-coupling region 262d can include a maximum field region, a maximum voltage region, maximum energy region, or a maximum current region, or any combination thereof. For example, the fourth EM-coupling distance 276d can vary from about 0.01 mm to about 10 mm, and the fourth EM-coupling distance 276d can be wavelength-dependent and can vary from about (λ/4) to about (10λ).

A fourth plasma-tuning slab 261d can comprise dielectric material, can be coupled to a fourth control assembly 260d, and can be used to move 263d the fourth plasma-tuning slab 261d a fourth EM-tuning distance 277d relative to the fourth EM-tuning portion 275d of the fourth plasma-tuning rod (270d, 275d) within the first EM energy tuning space 269a. The fourth control assembly 260d and the fourth plasma-tuning slab 261d can be used to optimize the microwave energy coupled from the fourth EM-coupling region 262d to the fourth EM-tuning portion 275d of the fourth plasma-tuning rod (270d, 275d). For example, the fourth EM-tuning distance 277d can be established between the fourth EM-tuning portion 275d and the fourth plasma-tuning slab 261d within the first EM energy tuning space 269a, and the fourth EM-tuning distance 277d can vary from about 0.01 mm to about 1 mm.

The fourth plasma-tuning rod (270d, 275d) can have a fourth diameter ($d_{1d}$) associated therewith, and the fourth diameter ($d_{1d}$) can vary from about 0.01 mm to about 1 mm. The fourth plasma-tuning slab 261d can have a fourth diameter ($D_{1d}$) associated therewith, and the fourth diameter ($D_{1d}$) can vary from about 1 mm to about 10 mm. The fourth EM-coupling region 262d, the fourth control assembly 260d, and the fourth plasma-tuning slab 261d can have a fourth x/y plane offset ($x_{1d}$) associated therewith, and the fourth x/y plane offset ($x_{1d}$) can be wavelength-dependent and can vary from about a quarter wavelength (λ/4) to about (10λ). The fourth control assembly 260d can comprise dielectric material and can have a cylindrical configuration and a diameter ($d_{1d}$) that can vary from about 1 mm to about 5 mm.

A fifth plasma-tuning rod (270e, 275e) can comprise dielectric material and can have a fifth plasma-tuning portion 270e that can extend a fifth plasma-tuning distance 271e into the process space 215 at a fifth location defined using ($x_{2e}$). For example, the fifth plasma-tuning distance 271e can vary from about 10 mm to about 400 mm.

A fifth EM-coupling region 262e can be established at a fifth EM-coupling distance 276e from the first cavity wall 265b within the second EM energy tuning space 269b established in the second cavity assembly 268b, and the fifth EM-tuning portion 275e can extend into the fifth EM-coupling region 262e. The fifth EM-tuning portion 275e can obtain fifth microwave energy from the fifth EM-coupling region 262e, and the fifth microwave energy can be transferred to the process space 215 at the fifth location ($x_{2e}$) using the fifth plasma-tuning portion 270e. The fifth EM-coupling region 262e can include a maximum field region, a maximum voltage region, maximum energy region, or a maximum current region, or any combination thereof. For example, the fifth EM-coupling distance 276e can vary from about 0.01 mm to about 10 mm, and the fifth EM-coupling distance 276e can be wavelength-dependent and can vary from about (λ/4) to about (10λ).

A fifth plasma-tuning slab 261e can comprise dielectric material, can be coupled to a fifth control assembly 260e, and can be used to move 263e the fifth plasma-tuning slab 261e a fifth EM-tuning distance 277e relative to the fifth EM-tuning portion 275e of the fifth plasma-tuning rod (270e, 275e) within the first EM energy tuning space 269a. The fifth control assembly 260e and the fifth plasma-tuning slab 261e can be used to optimize the microwave energy coupled from the fifth EM-coupling region 262e to the fifth EM-tuning portion 275e of the fifth plasma-tuning rod (270e, 275e). For example, the fifth EM-tuning distance 277e can be established between the fifth EM-tuning portion 275e and the fifth plasma-tuning slab 261e within the second EM energy tuning space 269b, and the fifth EM-tuning distance 277e can vary from about 0.01 mm to about 1 mm.

The fifth plasma-tuning rod (270e, 275e) can have a fifth diameter ($d_{1e}$) associated therewith that can vary from about 0.01 mm to about 1 mm. The fifth plasma-tuning slab 261e can have a fifth diameter ($D_{1e}$) associated therewith that can vary from about 1 mm to about 10 mm. The fifth EM-coupling region 262e, the fifth control assembly 260e, and the fifth plasma-tuning slab 261e can have a fifth x/y plane offset ($x_{1e}$) associated therewith, and the fifth x/y plane offset ($x_{1e}$) can be wavelength-dependent and can vary from about a quarter wavelength (λ/4) to about (10λ). The fifth control assembly 260e can comprise dielectric material, can have a cylindrical configuration and a diameter ($d_{1e}$) that can vary from about 1 mm to about 5 mm.

Still referring to FIG. 2A, a sixth plasma-tuning rod (270f, 275f) can comprise dielectric material and can have a sixth plasma-tuning portion 270f that can extend a sixth plasma-tuning distance 271f into the process space 215 at a sixth location defined using ($x_{2f}$). The sixth plasma-tuning distance 271f can vary from about 10 mm to about 400 mm.

A sixth EM-coupling region 262f can be established at a sixth EM-coupling distance 276f from the first cavity wall 265b within the second EM energy tuning space 269b established in the second cavity assembly 268b, and the sixth EM-tuning portion 275f can extend into the sixth EM-coupling region 262f. The sixth EM-tuning portion 275f can obtain sixth microwave energy from the sixth EM-coupling region 262f, and the sixth microwave energy can be transferred to the process space 215 at the sixth location ($x_{2f}$) using the sixth plasma-tuning portion 270f. The sixth EM-coupling region 262f can include a maximum field region, a maximum voltage region, maximum energy region, or a maximum current region, or any combination thereof. For example, the sixth EM-coupling distance 276f can vary from about 0.01 mm to about 10 mm, and the sixth EM-coupling distance 276f can be wavelength-dependent and can vary from about (λ/4) to about (10λ).

A sixth plasma-tuning slab 261f can comprise dielectric material, can be coupled to a sixth control assembly 260f, and can be used to move 263f the sixth plasma-tuning slab 261f a sixth EM-tuning distance 277f relative to the sixth EM-tuning portion 275f of the sixth plasma-tuning rod (270f, 275f) within the second EM energy tuning space 269b. The sixth control assembly 260f and the sixth plasma-tuning slab 261f can be used to optimize the microwave energy coupled from the sixth EM-coupling region 262f to the sixth EM-tuning portion 275f of the sixth plasma-tuning rod (270f, 275f). For example, the sixth EM-tuning distance 277f can be established between the sixth EM-tuning portion 275f and the sixth plasma-tuning slab 261f within the second EM energy tuning space 269b, and the sixth EM-tuning distance 277f can vary from about 0.01 mm to about 1 mm.

The sixth plasma-tuning rod (270f, 275f) can have a sixth diameter ($d_{1f}$) associated therewith that can vary from about 0.01 mm to about 1 mm. The sixth plasma-tuning slab 261f can have a sixth diameter ($D_{1f}$) associated therewith that can vary from about 1 mm to about 10 mm. The sixth EM-coupling region 262f, the sixth control assembly 260f, and the sixth plasma-tuning slab 261f can have a sixth x/y plane offset ($x_{1f}$) associated therewith, and the sixth x/y plane offset ($x_{1f}$) can be wavelength-dependent and can vary from about a quarter wavelength (λ/4) to about (10λ). The sixth control assembly 260f can comprise dielectric material, can have a cylindrical configuration and a diameter ($d_{1f}$) that can vary from about 1 mm to about 5 mm.

A seventh plasma-tuning rod (270g, 275g) can comprise dielectric material and can have a seventh plasma-tuning portion 270g that can extend a seventh plasma-tuning distance 271g into the process space 215 at a seventh location defined using ($x_{2g}$). The seventh plasma-tuning distance 271g can vary from about 10 mm to about 400 mm.

A seventh EM-coupling region 262g can be established at a seventh EM-coupling distance 276g from the first cavity wall 265b within the second EM energy tuning space 269b established in the second cavity assembly 268b, and the seventh EM-tuning portion 275g can extend into the seventh EM-coupling region 262g. The seventh EM-tuning portion 275g can obtain seventh microwave energy from the seventh EM-coupling region 262g, and the seventh microwave energy can be transferred to the process space 215 at the seventh location ($x_{2g}$) using the seventh plasma-tuning portion 270g. The seventh EM-coupling region 262g can include a maximum field region, a maximum voltage region, maximum energy region, or a maximum current region, or any combination thereof. For example, the seventh EM-coupling distance 276g can vary from about 0.01 mm to about 10 mm, and the seventh EM-coupling distance 276g can be wavelength-dependent and can vary from about ($\lambda/4$) to about ($10\lambda$).

A seventh plasma-tuning slab 261g can comprise dielectric material, can be coupled to a seventh control assembly 260g, and can be used to move 263g the seventh plasma-tuning slab 261g a seventh EM-tuning distance 277g relative to the seventh EM-tuning portion 275g of the seventh plasma-tuning rod (270g, 275g) within the second EM energy tuning space 269b. The seventh control assembly 260g and the seventh plasma-tuning slab 261g can be used to optimize the microwave energy coupled from the seventh EM-coupling region 262g to the seventh EM-tuning portion 275g of the seventh plasma-tuning rod (270g, 275g). For example, the seventh EM-tuning distance 277g can be established between the seventh EM-tuning portion 275g and the seventh plasma-tuning slab 261g within the second EM energy tuning space 269b, and the seventh EM-tuning distance 277g can vary from about 0.01 mm to about 1 mm.

The seventh plasma-tuning rod (270g, 275g) can have a seventh diameter ($d_{1g}$) associated therewith that can vary from about 0.01 mm to about 1 mm. The seventh plasma-tuning slab 261g can have a seventh diameter ($D_{1g}$) associated therewith that can vary from about 1 mm to about 10 mm. The seventh EM-coupling region 262g, the seventh control assembly 260g, and the seventh plasma-tuning slab 261g can have a seventh x/y plane offset ($x_{1g}$) associated therewith, and the seventh x/y plane offset ($x_{1g}$) can be wavelength-dependent and can vary from about a quarter wavelength ($\lambda/4$) to about ($10\lambda$). The seventh control assembly 260g can comprise dielectric material, can have a cylindrical configuration and a diameter ($d_{1g}$) that can vary from about 1 mm to about 5 mm.

An eighth plasma-tuning rod (270h, 275h) can comprise dielectric material and can have an eighth plasma-tuning portion 270h that can extend an eighth plasma-tuning distance 271h into the process space 215 at an eighth location defined using ($x_{2h}$). The eighth plasma-tuning distance 271h can vary from about 10 mm to about 400 mm.

An eighth EM-coupling region 262h can be established at an eighth EM-coupling distance 276h from the first cavity wall 265b within the second EM energy tuning space 269b established in the second cavity assembly 268b, and the eighth EM-tuning portion 275h can extend into the eighth EM-coupling region 262h. The eighth EM-tuning portion 275h can obtain eighth microwave energy from the eighth EM-coupling region 262h, and the eighth microwave energy can be transferred to the process space 215 at the eighth location ($x_{2h}$) using the eighth plasma-tuning portion 270h. The eighth EM-coupling region 262h can include a maximum field region, a maximum voltage region, maximum energy region, or a maximum current region, or any combination thereof. For example, the eighth EM-coupling distance 276h can vary from about 0.01 mm to about 10 mm, and the eighth EM-coupling distance 276h can be wavelength-dependent and can vary from about ($\lambda/4$) to about ($10\lambda$).

An eighth plasma-tuning slab 261h can comprise dielectric material, can be coupled to an eighth control assembly 260h, and can be used to move 263h the eighth plasma-tuning slab 261h an eighth EM-tuning distance 277h relative to the eighth EM-tuning portion 275h of the eighth plasma-tuning rod (270h, 275h) within the second EM energy tuning space 269b. The eighth control assembly 260h and the eighth plasma-tuning slab 261h can be used to optimize the microwave energy coupled from the eighth EM-coupling region 262h to the eighth EM-tuning portion 275h of the eighth plasma-tuning rod (270h, 275h). For example, the eighth EM-tuning distance 277h can be established between the eighth EM-tuning portion 275h and the eighth plasma-tuning slab 261h within the second EM energy tuning space 269b, and the eighth EM-tuning distance 277h can vary from about 0.01 mm to about 1 mm.

The eighth plasma-tuning rod (270h, 275h) can have an eighth diameter ($d_{1h}$) associated therewith that can vary from about 0.01 mm to about 1 mm. The eighth plasma-tuning slab 261h can have an eighth diameter ($D_{1h}$) associated therewith that can vary from about 1 mm to about 10 mm. The eighth EM-coupling region 262h, the eighth control assembly 260h, and the eighth plasma-tuning slab 261h can have an eighth x/y plane offset ($x_{1h}$) associated therewith, and the eighth x/y plane offset ($x_{1h}$) can be wavelength-dependent and can vary from about a quarter wavelength ($\lambda/4$) to about ($10\lambda$). The eighth control assembly 260h can comprise dielectric material, can have a cylindrical configuration and a diameter ($d_{1h}$) that can vary from about 1 mm to about 5 mm.

The top view of the second microwave processing system 200 includes a top view of a first cavity-control assembly 245a that is shown coupled to a top view of a first cavity-tuning slab 246a. The first cavity-control assembly 245a can comprise dielectric material, and can have a first diameter ($d_{1aa}$) associated therewith, and the first diameter ($d_{1aa}$) can vary from about 0.01 mm to about 1 mm. The first cavity-tuning slab 246a can comprise dielectric material, and can have a second diameter ($D_{1aa}$) associated therewith, and the second diameter ($D_{1aa}$) can vary from about 1 mm to about 10 mm. The first cavity-control assembly 245a and the first cavity-tuning slab 246a can have a first x/y plane offset ($y_{1aa}$) associated therewith, and the first x/y plane offset ($y_{1aa}$) can vary from about 1 mm to about 10 mm.

In addition, the top view of the second microwave processing system 200 includes a top view of a second cavity-control assembly 245b that is shown coupled to a top view of a second cavity-tuning slab 246b. The second cavity-control assembly 245b can comprise dielectric material, and can have a first additional diameter ($d_{1ba}$) associated therewith, and the first additional diameter ($d_{1ba}$) can vary from about 0.01 mm to about 1 mm. The second cavity-tuning slab 246b can comprise dielectric material, and can have a second additional diameter ($D_{1ba}$) associated therewith, and the second additional diameter ($D_{1ba}$) can vary from about 1 mm to about 10 mm. The second cavity-control assembly 245b and the second cavity-tuning slab 246b can have a second x/y plane offset ($y_{1ba}$) associated therewith, and the second x/y plane offset ($y_{1ba}$) vary from about 1 mm to about 10 mm.

Figure 2B:
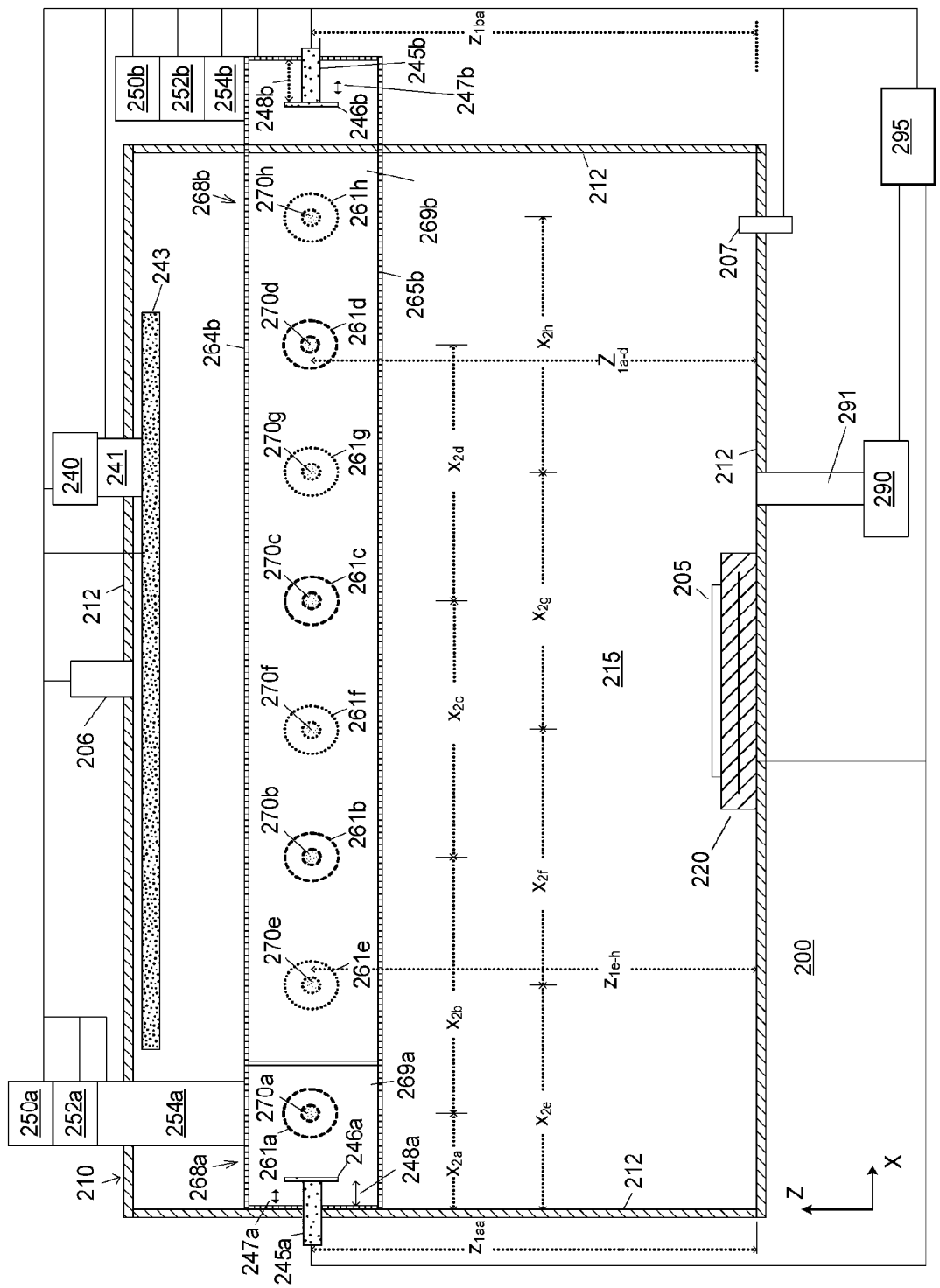

FIG. 2B shows a partial cut-away front view of a second process chamber 210 in a second microwave processing system 200. The front view shows an x/z plane view of a plurality of additional walls 212 coupled to each other, thereby creating a partial cut-away front view of a process space 215 in the second process chamber 210. The second microwave processing system 200 can be configured to form uniform plasma in the process space 215.

The front view shows a cut-away view of a first cavity assembly 268a having a first EM energy tuning space 269a therein, and the first cavity assembly 268a can include a first cavity wall 265a, a second cavity wall 266a, at least one third cavity wall 267a, and one or more additional cavity walls (not shown). For example, the first cavity assembly 268a can be coupled to the first interface assembly 212a using the first cavity wall 265a. The front view also shows a cut-away view of a second cavity assembly 268b having a second EM energy tuning space 269b therein, and the second cavity assembly 268b can include a first cavity wall 265b, a second cavity wall 266b, at least one third cavity wall 267b, and one or more additional cavity walls (not shown). For example, the second cavity assembly 268b can be coupled to the second interface assembly 212b using the first cavity wall 265b.

A partial front view (dash line view) of a first set of plasma tuning rods (270a-270d), a partial front view (dash line view) of a first set of plasma-tuning slabs (261a-261d), a partial front view (dotted line view) of a second set of plasma tuning rods (270e-270h), and a partial front view (dotted line view) of a second set of plasma-tuning slabs (261e-261h) are shown in FIG. 2B.

The first set of plasma tuning rods (270a-270d) and the first set of plasma-tuning slabs (261a-261d) can have a first set of x/y plane offsets ($x_{2a-d}$) associated therewith, and the first set of x/y plane offsets ($x_{2a-d}$) can vary from about 10 mm to about 100 mm. The first set of plasma tuning rods (270a-270d) and the first set of plasma-tuning slabs (261a-261d) can have a first set of x/z plane offsets ($z_{1a-d}$) associated therewith, and the first set of x/z plane offsets ($z_{1a-d}$) can vary from about 100 mm to about 400 mm.

The second set of plasma tuning rods (270e-270h) and the second set of plasma-tuning slabs (261e-261h) can have a second set of x/y plane offsets ($x_{2e-h}$) associated therewith, and the second set of x/y plane offsets ($x_{2e-h}$) can vary from about 10 mm to about 100 mm. The second set of plasma tuning rods (270e-270h) and the second set of plasma-tuning slabs (261e-261h) can have a second set of x/z plane offsets ($z_{1e-h}$) associated therewith, and the second set of x/z plane offsets ($z_{1e-h}$) can vary from about 100 mm to about 400 mm.

FIG. 2B shows that the second microwave processing system 200 can include one or more plasma sensors 206 coupled to a chamber wall 212 to obtain first plasma data. In addition, the second microwave processing system 200 may be configured to process 200 mm substrates, 300 mm substrates, or larger-sized substrates. In addition, cylindrical, square and rectangular chambers can each be configured so that the second microwave processing system 200 may be configured to process circular, square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

As shown in FIG. 2B, a first EM source 250a can be coupled to a first cavity assembly 268a, and a second EM source 250b can be coupled to a second cavity assembly 268b. The first EM source 250a can be coupled to a first matching network 252a, and the first matching network 252a can be coupled to a first coupling network 254a. The second EM source 250b can be coupled to a second matching network 252b, and the second matching network 252b can be coupled to a second coupling network 254b. Alternatively, a plurality of matching networks (not shown) or a plurality of coupling networks (not shown) may be used.

The first coupling network 254a can be removably coupled to the first cavity assembly 268a that can be removably coupled to an upper portion of a first interface assembly 212a of the process chamber 210. The first coupling network 254a can be used to provide microwave energy to the first EM energy tuning space 269a in the first cavity assembly 268a. The second coupling network 254b can be removably coupled to the second cavity assembly 268b that can be removably coupled to an upper portion of a second interface assembly 212b of the process chamber 210. The second coupling network 254b can be used to provide additional microwave energy to the second EM energy tuning space 269b in the second cavity assembly 268b. Alternatively, other EM-coupling configurations may be used.

As shown in FIG. 2B, a controller 295 can be coupled 296 to the EM sources (250a, 250b), the matching networks (252a, 252b), the coupling networks (254a, 254b), and the cavity assemblies (268a, 268b), and the controller 295 can use process recipes to establish, control, and optimize the EM sources (250a, 250b), the matching networks (252a, 252b), the coupling networks (254a, 254b), and the cavity assemblies (268a, 268b) to control the plasma uniformity within the process space 215. For example, the EM sources (250a, 250b) can operate at a frequency from about 500 MHz. to about 5000 MHz. In addition, the controller 295 can be coupled 296 to the plasma sensors 206 and process sensors 207, and the controller 295 can use process recipes to establish, control, and optimize the data from the plasma sensors 206 and the process sensors 207 to control the plasma uniformity within the process space 215.

In addition, the controller 295 can be coupled 296 to gas supply system 240, to a gas supply subassembly 241, and to a gas showerhead 243. For example, the gas supply system 240, the gas supply subassembly 241 and the gas showerhead 243 can be configured to introduce one or more process gases to process space 215, and can include flow control and/or flow measuring devices.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma enhanced deposition, the process gas may comprise a film forming precursor, a reduction gas, or an inert gas, or a combination of two or more thereof.

As shown in FIG. 2B, the second microwave processing system 200 can include a pressure control system 290 and port 291 coupled to the process chamber 210, and configured to evacuate the process chamber 210, as well as control the pressure within the process chamber 210. In addition, the second microwave processing system 200 can include a substrate holder 220 for mounting the substrate 205 in the process space 215.

The front view of the second microwave processing system 200 includes a partial front view of the first cavity-control assembly 245a that is shown coupled to a front view of the first cavity-tuning slab 246a. The first cavity-control assembly 245a and the first cavity-tuning slab 246a can have a first x/z plane offset ($z_{1aa}$) associated therewith, and the first x/z plane offset ($z_{1aa}$) can vary from about 1 mm to about 10 mm.

The first cavity-control assembly 245a can be used to move 247a the first cavity-tuning slab 246a cavity-tuning distances 248a within the first EM-energy tuning space 269a. The controller 295 can be coupled 296 to the cavity-control assembly 245a, and the controller 295 can use process recipes to establish, control, and optimize the cavity-tuning distances 248a to control and maintain the plasma uniformity within the process space 215 in real-time. For example, the cavity-tuning distances 248a can vary from about 0.01 mm to about 10 mm, and the cavity-tuning distances 248a can be wavelength-dependent and can vary from about ($\lambda/4$) to about ($10\lambda$).

In addition, the front view of the second microwave processing system 200 includes a partial front view of a second cavity-control assembly 245b that is shown coupled to a front view of a second cavity-tuning slab 246b. The second cavity-control assembly 245b and the second cavity-tuning slab 246b can have a second x/z plane offset ($z_{1ba}$) associated therewith that can vary from about 1 mm to about 10 mm.

The second cavity-control assembly 245b can be used to move 247b the second cavity-tuning slab 246b second cavity-tuning distances 248b within the second EM-energy tuning space 269b. The controller 295 can be coupled 296 to the second cavity-control assembly 245b, and the controller 295 can use process recipes to establish, control, and optimize the second cavity-tuning distances 248b to control and maintain the plasma uniformity within the process space 215 in real-time. For example, the second cavity-tuning distances 248b can vary from about 0.01 mm to about 10 mm, and the second cavity-tuning distances 248b can be wavelength-dependent and can vary from about ($\lambda/4$) to about ($10\lambda$).

Figure 2C:
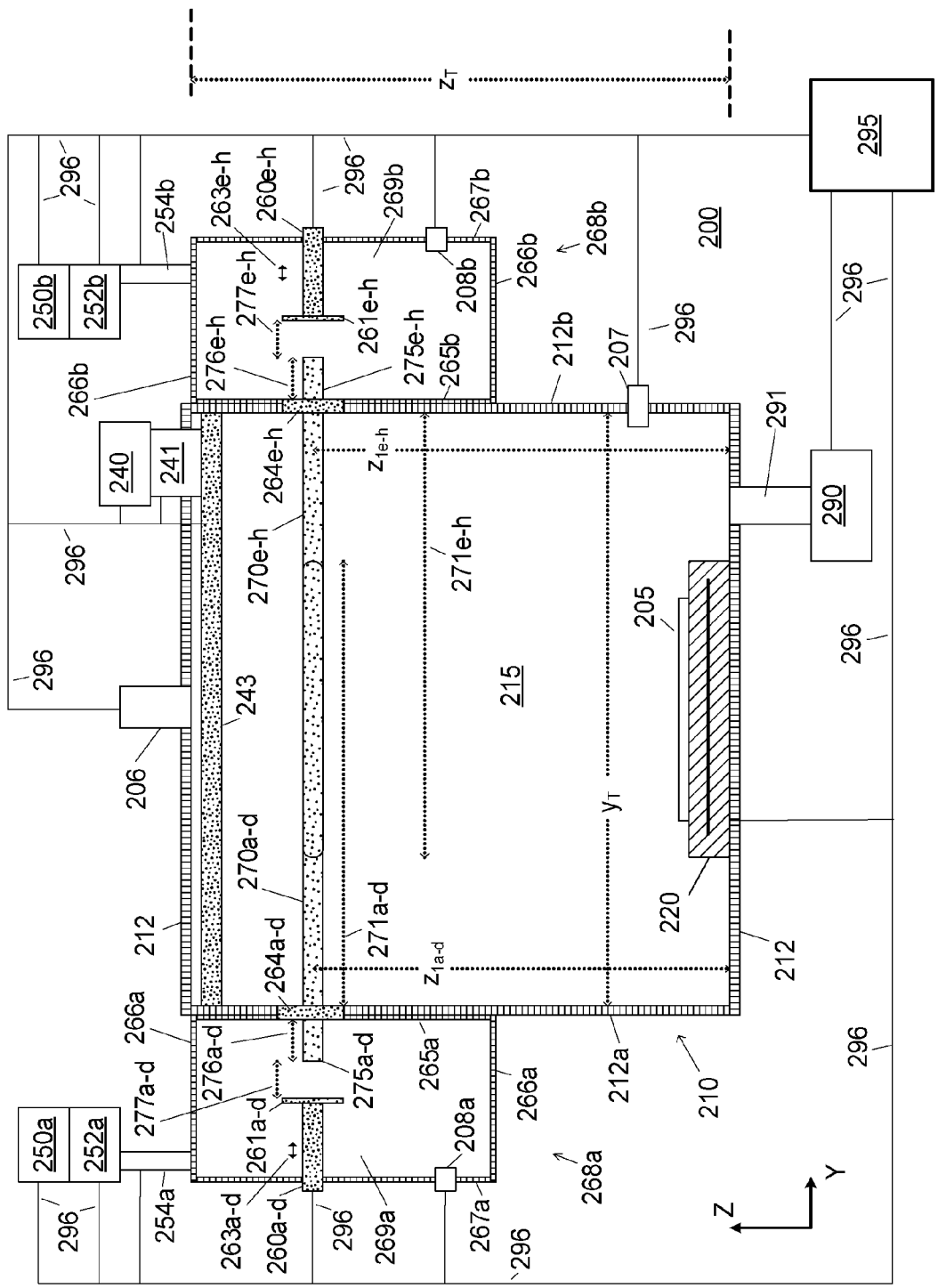

FIG. 2C shows a partial cut-away side view of the second process chamber 210 in the second microwave processing system 200. The side view shows a y/z plane view of a plurality of chamber walls 212 coupled to a first interface assembly 212a and to a second interface assembly 212b, thereby creating a partial cut-away side view of the process space 215 in the process chamber 210. The second microwave processing system 200 can be configured to form plasma in the process space 215.

A partial side view of a first EM energy tuning space 269a in the first cavity assembly 268a and a partial side view of a second EM energy tuning space 269b in the second cavity assembly 268b are shown in FIG. 2C. A partial side view of the first set of plasma tuning rods (270a-270d), a partial side view of a first set of plasma-tuning slabs (261a-261d), a partial side view of a second set of plasma tuning rods (270e-270h), and a partial side view of a second set of plasma-tuning slabs (261e-261h) are shown in FIG. 2C.

Side views of a first set of isolation assemblies (264a, 264b, 264c, and 264d) and a second set of isolation assemblies (264e, 264f, 264g, and 264h) are also shown in FIG. 2C. For example, first set of isolation assemblies (264a, 264b, 264c, and 264d) can be used to removably couple the first set of plasma tuning rods {(270a, 270b, 270c, and 270d) and (275a, 275b, 275c, and 275d)} to a first interface assembly 212a. Each of the first set of isolation assemblies (264a, 264b, 264c, and 264d) can be removably coupled to a first interface assembly 212a. In addition, the second set of isolation assemblies (264e, 264f, 264g, and 264h) can be used to removably couple the second set of plasma tuning rods {(270e, 270f, 270g, and 270h) and (275e, 275f, 275g, and 275h)} to a second interface assembly 212b. Each of the second set of isolation assemblies (264e, 264f, 264g, and 264h) can be removably coupled to a second interface assembly 212b.

As shown in FIG. 2C, a first set of plasma-tuning slabs (261a, 261b, 261c, and 261d) can be coupled to a first set of control assemblies (260a, 260b, 260c, and 260d), and first set of control assemblies (260a, 260b, 260c, and 260d) can be used to move (263a, 263b, 263c, and 263d) the first set of plasma-tuning slabs (261a, 261b, 261c, and 261d) the first set of EM-tuning distances (277a, 277b, 277c, and 277d) relative to the EM-tuning portions (275a, 275b, 275c, and 275d) within the first EM energy tuning space 269a. In addition, a second set of plasma-tuning slabs (261e, 261f, 261g, and 261h) can be coupled to a second set of control assemblies (260e, 260f, 260g, and 260h), and the second set of control assemblies (260e, 260f, 260g, and 260h) can be used to move (263e, 263f, 263g, and 263h) the second set of plasma-tuning slabs (261e, 261f, 261g, and 261h) the second set of EM-tuning distances (277e, 277f, 277g, and 277h) relative to the EM-tuning portions (275e, 275f, 275g, and 275h) within the second EM energy tuning space 269b.

The first set of control assemblies (260a, 260b, 260c, and 260d) can be coupled 296 to the controller 295, and the controller 295 can use process recipes to establish, control, and optimize the first set of EM-tuning distances (277a, 277b, 277c, and 277d) to control the plasma uniformity within the process space 215. In addition, the second set of control assemblies (260e, 260f, 260g, and 260h) can be coupled 296 to the controller 295, and the controller 295 can use process recipes to establish, control, and optimize the second set of EM-tuning distances (277e, 277f, 277g, and 277h) to control the plasma uniformity within the process space 215.

The controller 295 can be coupled 296 to the EM sources (250a, 250b), the matching networks (252a, 252b), the coupling networks (254a, 254b), and the cavity assemblies (268a, 268b), and the controller 295 can use process recipes to establish, control, and optimize the EM sources (250a, 250b), the matching networks (252a, 252b), the coupling networks (254a, 254b), and the cavity assemblies (268a, 268b) to control the plasma uniformity within the process space 215. For example, the EM sources (250a, 250b) can operate at frequencies from about 500 MHz to about 5000 MHz. In addition, the controller 295 can be coupled 296 to the plasma sensors 206, the process sensors 207, and the cavity sensors (208a and 208b), and the controller 295 can use process recipes to establish, control, and optimize the data from the plasma sensors 206, the process sensors 207, and the cavity sensors (208a and 208b), to control the plasma uniformity in the process space 215.

The side view illustrates a process chamber 210 having a total width ($y_T$), and a total height ($z_T$) associated therewith in the y/z plane. For example, the total width ($y_T$) can vary from about 50 mm to about 500 mm, and the total height ($z_T$) can vary from about 50 mm to about 500 mm.

Figure 3A:
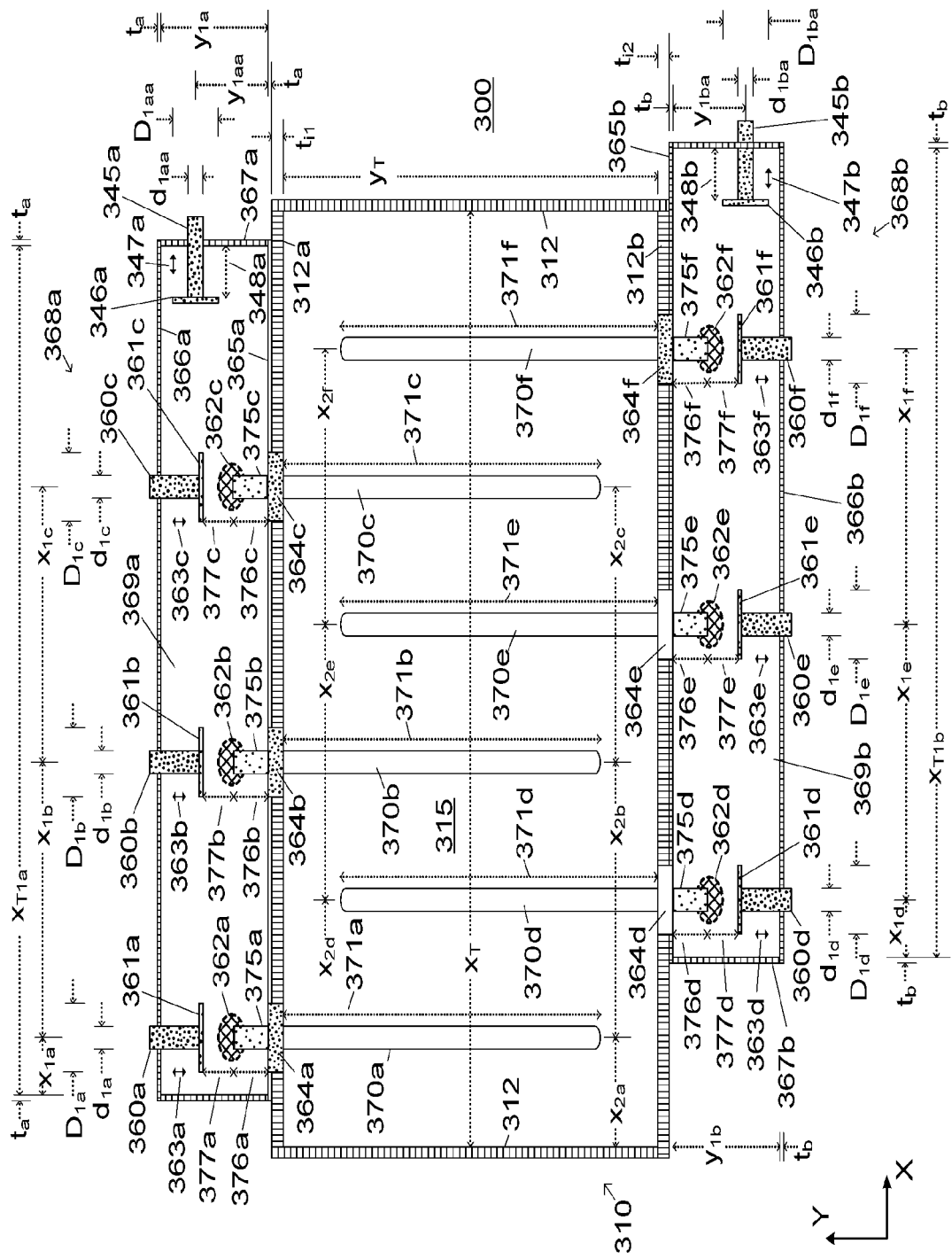
FIGS. 3A-3C illustrate different exemplary views of a third microwave processing system according to embodiments of the invention.

FIG. 3A shows a partial cut-away top view of a third process chamber 310 in a third microwave processing system 300. The top view shows an x/y plane view of a first interface assembly 312a, a second interface assembly 312b, and a plurality of additional chamber walls 312 coupled to the first interface assembly 312a and the second interface assembly 312b thereby forming the third process chamber 310. For example, the chamber walls 312 can have wall thicknesses (t)

associated therewith, and the wall thicknesses (t) can vary from about 1 mm to about 5 mm. The first interface assembly 312a can have a first interface thickness ($t_{i1}$) associated therewith, and the first interface thickness ($t_{i1}$) can vary from about 1 mm to about 10 mm. The second interface assembly 312b can have a second interface thickness ($t_{i2}$) associated therewith, and the second interface thickness ($t_{i2}$) can vary from about 1 mm to about 10 mm. The process space 315 can have a length ($x_T$) associated therewith, and the length ($x_T$) can vary from about 10 mm to about 500 mm.

The top view of the third microwave processing system 300 shows a cut-away view of a first cavity assembly 368a having a first EM energy tuning space 369a therein, and the first cavity assembly 368a can include a first cavity wall 365a, a second cavity wall 366a, at least one third cavity wall 367a, and one or more additional cavity walls (not shown). For example, the first cavity assembly 368a can be coupled to the first interface assembly 312a using the first cavity wall 365a, and walls (365a, 366a, and 367a) can comprise dielectric material and can have wall thicknesses ($t_a$) associated therewith, and the wall thicknesses ($t_a$) can vary from about 1 mm to about 5 mm. In addition, the first EM energy tuning space 369a can have a first length ($x_{T1a}$) and a first width ($y_{1a}$) associated therewith, the first length ($x_{T1a}$) can vary from about 10 mm to about 500 mm, and the first width ($y_{1a}$) can vary from about 5 mm to about 50 mm.

The top view of the third microwave processing system 300 also shows a cut-away view of a second cavity assembly 368b having a second EM energy tuning space 369b therein, and the second cavity assembly 368b can include a first cavity wall 365b, a second cavity wall 366b, at least one third cavity wall 367b, and one or more additional cavity walls (not shown). For example, the second cavity assembly 368b can be coupled to the second interface assembly 312b using the first cavity wall 365b, and walls (365b, 366b, and 367b) can comprise dielectric material and can have wall thicknesses ($t_b$) associated therewith, and the wall thicknesses ($t_b$) can vary from about 1 mm to about 5 mm. In addition, the second EM energy tuning space 369b can have a second length ($x_{T1b}$) and a second width ($y_{1b}$) associated therewith, the second length ($x_{T1b}$) can vary from about 10 mm to about 500 mm, and the second width ($y_{1b}$) can vary from about 5 mm to about 50 mm.

In some exemplary systems, a first set of isolation assemblies (364a, 364b, and 364c) can be removably coupled to a first interface assembly 312a and can be configured to isolate the process space 315 from the first EM energy tuning space 369a. The first set of isolation assemblies (364a, 364b, and 364c) can be used to removably couple the first set of plasma tuning rods {(370a, 370b, and 370c) and (375a, 375b, and 375c)} to a first interface assembly 312a. For example, the first set of plasma-tuning portions (370a, 370b, and 370c) can be configured in the process space 315, and the first set of EM-tuning portions (375a, 375b, and 375c) can be configured within the first EM energy tuning space 369a.

A second set of isolation assemblies (364d, 364e, and 364f) can be removably coupled to the second interface assembly 312b and can be configured to isolate the process space 315 from the second EM energy tuning space 369b. The second set of isolation assemblies (364d, 364e, and 364f) can be used to removably couple the second set of plasma tuning rods {(370d, 370e, and 370f) and (375d, 375e, and 375f)} to the second interface assembly 312b. For example, the second set of plasma-tuning portions (370d, 370e, and 370f) can be configured in the process space 315, and the second set of EM-tuning portions (375d, 375e, and 375f) can be configured within the second EM energy tuning space 369b.

Still referring to FIG. 3A, a first plasma-tuning rod (370a, 375a) can comprise dielectric material and can have a first plasma-tuning portion 370a that can extend a first plasma-tuning distance 371a into the process space 315 at a first location defined using ($x_{2a}$). The first plasma-tuning distance 371a can vary from about 10 mm to about 400 mm.

A first EM-coupling region 362a can be established at a first EM-coupling distance 376a from the first cavity wall 365a within the first EM energy tuning space 369a established in the first cavity assembly 368a, and the first EM-tuning portion 375a can extend into the first EM-coupling region 362a. The first EM-tuning portion 375a can obtain first microwave energy from the first EM-coupling region 362a, and the first microwave energy can be transferred to the process space 315 at the first location ($x_{2a}$) using the first plasma-tuning portion 370a. The first EM-coupling region 362a can include a maximum field region, a maximum voltage region, maximum energy region, or a maximum current region, or any combination thereof. For example, the first EM-coupling distance 376a can vary from about 0.01 mm to about 10 mm, and the first EM-coupling distance 376a can be wavelength-dependent and can vary from about ($\lambda/4$) to about ($10\lambda$).

A first plasma-tuning slab 361a can comprise dielectric material, can be coupled to a first control assembly 360a, and can be used to move 363a the first plasma-tuning slab 361a a first EM-tuning distance 377a relative to the first EM-tuning portion 375a of the first plasma-tuning rod (370a, 375a) within the first EM energy tuning space 369a. The first control assembly 360a and the first plasma-tuning slab 361a can be used to optimize the microwave energy coupled from the first EM-coupling region 362a to the first EM-tuning portion 375a of the first plasma-tuning rod (370a, 375a). For example, the first EM-tuning distance 377a can be established between the first EM-tuning portion 375a and the first plasma-tuning slab 361a within the first EM energy tuning space 369a, and the first EM-tuning distance 377a can vary from about 0.01 mm to about 1 mm.

The first plasma-tuning rod (370a, 375a) can have a first diameter ($d_{1a}$) associated therewith that can vary from about 0.01 mm to about 1 mm. The first plasma-tuning slab 361a can have a first diameter ($D_{1a}$) associated therewith that can vary from about 1 mm to about 10 mm. The first EM-coupling region 362a, the first control assembly 360a, and the first plasma-tuning slab 361a can have a first x/y plane offset ($x_{1a}$) associated therewith, and the first x/y plane offset ($x_{1a}$) can be wavelength-dependent and can vary from about a quarter wavelength ($\lambda/4$) to about ($10\lambda$). The first control assembly 360a can comprise dielectric material, can have a cylindrical configuration and a diameter ($d_{1a}$) that can vary from about 1 mm to about 5 mm.

A second plasma-tuning rod (370b, 375b) can have a second plasma-tuning portion 370b that can extend a second plasma-tuning distance 371b into the process space 315 at a second location defined using ($x_{2b}$). For example, the second plasma-tuning distance 371b can vary from about 10 mm to about 400 mm.

A second EM-coupling region 362b can be established at a second EM-coupling distance 376b from the first cavity wall 365a within the first EM energy tuning space 369a established in the first cavity assembly 368a, and the second EM-tuning portion 375b can extend into the second EM-coupling region 362b. The second EM-tuning portion 375b can obtain second microwave energy from the second EM-coupling region 362b, and the second microwave energy can be transferred to the process space 315 at the second location ($x_{1b}$) using the second plasma-tuning portion 370b. The second EM-coupling region 362b can include a maximum field region, a maximum voltage region, maximum energy region, or a maximum current region, or any combination thereof. For example, the second EM-coupling distance 376b can vary from about 0.01 mm to about 10 mm, and the second EM-coupling distance 376b can be wavelength-dependent and can vary from about ($\lambda/4$) to about ($10\lambda$).

A second plasma-tuning slab 361b can comprise dielectric material, can be coupled to a second control assembly 360b, and can be used to move 363b the second plasma-tuning slab 361b a second EM-tuning distance 377b relative to the second EM-tuning portion 375b of the second plasma-tuning rod (370b, 375b) within the first EM energy tuning space 369a. The second control assembly 360b and the second plasma-tuning slab 361b can be used to optimize the microwave energy coupled from the second EM-coupling region 362b to the second EM-tuning portion 375b of the second plasma-tuning rod (370b, 375b). For example, the second EM-tuning distance 377b can be established between the second EM-tuning portion 375b and the second plasma-tuning slab 361b within the first EM energy tuning space 369a, and the second EM-tuning distance 377b can vary from about 0.01 mm to about 1 mm.

The second plasma-tuning rod (370b, 375b) can have a second diameter ($d_{1b}$) associated therewith that can vary from about 0.01 mm to about 1 mm. The second plasma-tuning slab 361b can have a second diameter ($D_{1b}$) associated therewith that can vary from about 1 mm to about 10 mm. The second EM-coupling region 362b, the second control assembly 360b, and the second plasma-tuning slab 361b can have a second x/y plane offset ($x_{1b}$) associated therewith, and the second x/y plane offset ($x_{1b}$) can be wavelength-dependent and can vary from about a quarter wavelength ($\lambda/4$) to about ($10\lambda$). The second control assembly 360b can comprise dielectric material, can have a cylindrical configuration and a diameter ($d_{1b}$) that can vary from about 1 mm to about 5 mm.

A third plasma-tuning rod (370c, 375c) can comprise dielectric material and can have a third plasma-tuning portion 370c that can extend a third plasma-tuning distance 371c into the process space 315 at a third location defined using ($x_{2c}$). For example, the third plasma-tuning distance 371c can vary from about 10 mm to about 400 mm.

A third EM-coupling region 362c can be established at a third EM-coupling distance 376c from the first cavity wall 365a within the first EM energy tuning space 369a established in the first cavity assembly 368a, and the third EM-tuning portion 375c can extend into the third EM-coupling region 362c. The third EM-tuning portion 375c can obtain third microwave energy from the third EM-coupling region 362c, and the third microwave energy can be transferred to the process space 315 at the third location ($x_{2c}$) using the third plasma-tuning portion 370c. The third EM-coupling region 362c can include a maximum field region, a maximum voltage region, maximum energy region, or a maximum current region, or any combination thereof. The third EM-coupling distance 376c can vary from about 0.01 mm to about 10 mm, and the third EM-coupling distance 376c can be wavelength-dependent and can vary from about ($2/\lambda$) to about ($10\lambda$).

A third plasma-tuning slab 361c can comprise dielectric material, can be coupled to a third control assembly 360c, and can be used to move 363c the third plasma-tuning slab 361c a third EM-tuning distance 377c relative to the third EM-tuning portion 375c of the third plasma-tuning rod (370c, 375c) within the first EM energy tuning space 369a. The third control assembly 360c and the third plasma-tuning slab 361c can be used to optimize the microwave energy coupled from the third EM-coupling region 362c to the third EM-tuning portion 375c of the third plasma-tuning rod (370c, 375c). For example, the third EM-tuning distance 377c can be established between the third EM-tuning portion 375c and the third plasma-tuning slab 361c within the first EM energy tuning space 369a, and the third EM-tuning distance 377c can vary from about 0.01 mm to about 1 mm.

The third plasma-tuning rod (370c, 375c) can have a third diameter ($d_{1c}$) associated therewith that can vary from about 0.01 mm to about 1 mm. The third plasma-tuning slab 361c can have a third diameter ($D_{1s}$) associated therewith that can vary from about 1 mm to about 10 mm. The third EM-coupling region 362c, the third control assembly 360c, and the third plasma-tuning slab 361c can have a third x/y plane offset ($x_{1s}$) associated therewith, and the third x/y plane offset ($x_{1s}$) can be wavelength-dependent and can vary from about a quarter wavelength ($2/\lambda$) to about ($10\lambda$). For example, the third control assembly 360c can have a cylindrical configuration and a diameter ($d_1$) that can vary from about 1 mm to about 5 mm.

A fourth plasma-tuning rod (370d, 375d) can comprise dielectric material and can have a fourth plasma-tuning portion 370d that can extend a fourth plasma-tuning distance 371d into the process space 315 at a fourth location defined using ($x_{2d}$). For example, the fourth plasma-tuning distance 371d can vary from about 10 mm to about 400 mm.

A fourth EM-coupling region 362d can be established at a fourth EM-coupling distance 376d from the first cavity wall 365b within the second EM energy tuning space 369b established in the second cavity assembly 368b, and the fourth EM-tuning portion 375d can extend into the fourth EM-coupling region 362d. The fourth EM-tuning portion 375d can obtain fourth microwave energy from the fourth EM-coupling region 362d, and the fourth microwave energy can be transferred to the process space 315 at the fourth location ($x_{2d}$) using the fourth plasma-tuning portion 370d. The fourth EM-coupling region 362d can include a maximum field region, a maximum voltage region, maximum energy region, or a maximum current region, or any combination thereof. For example, the fourth EM-coupling distance 376d can vary from about 0.01 mm to about 10 mm, and the fourth EM-coupling distance 376d can be wavelength-dependent and can vary from about ($\lambda/4$) to about ($10\lambda$).

A fourth plasma-tuning slab 361d can comprise dielectric material, can be coupled to a fourth control assembly 360d, and can be used to move 363d the fourth plasma-tuning slab 361d a fourth EM-tuning distance 377d relative to the fourth EM-tuning portion 375d of the fourth plasma-tuning rod (370d, 375d) within the second EM energy tuning space 369b. The fourth control assembly 360d and the fourth plasma-tuning slab 361d can be used to optimize the microwave energy coupled from the fourth EM-coupling region 362d to the fourth EM-tuning portion 375d of the fourth plasma-tuning rod (370d, 375d). For example, the fourth EM-tuning distance 377d can be established between the fourth EM-tuning portion 375d and the fourth plasma-tuning slab 361d within the second EM energy tuning space 369b, and the fourth EM-tuning distance 377d can vary from about 0.01 mm to about 1 mm.

The fourth plasma-tuning rod (370d, 375d) can have a fourth diameter ($d_{1d}$) associated therewith that can vary from about 0.01 mm to about 1 mm. The fourth plasma-tuning slab 361d can have a fourth diameter ($D_{1d}$) associated therewith that can vary from about 1 mm to about 10 mm. The fourth EM-coupling region 362d, the fourth control assembly 360d, and the fourth plasma-tuning slab 361d can have a fourth x/y plane offset ($x_{1d}$) associated therewith, and the fourth x/y plane offset ($x_{1d}$) can be wavelength-dependent and can vary from about a quarter wavelength ($\lambda/4$) to about ($10\lambda$). The fourth control assembly 360d can comprise dielectric material, can have a cylindrical configuration and a diameter ($d_{1d}$) that can vary from about 1 mm to about 5 mm.

A fifth plasma-tuning rod (370e, 375e) can comprise dielectric material and can have a fifth plasma-tuning portion 370e that can extend a fifth plasma-tuning distance 371e into the process space 315 at a fifth location defined using ($x_{2e}$). For example, the fifth plasma-tuning distance 371e can vary from about 10 mm to about 400 mm.

A fifth EM-coupling region 362e can be established at a fifth EM-coupling distance 376e from the first cavity wall 365b within the second EM energy tuning space 369b established in the second cavity assembly 368b, and the fifth EM-tuning portion 375e can extend into the fifth EM-coupling region 362e. The fifth EM-tuning portion 375e can obtain fifth microwave energy from the fifth EM-coupling region 362e, and the fifth microwave energy can be transferred to the process space 315 at the fifth location ($x_{2e}$) using the fifth plasma-tuning portion 370e. The fifth EM-coupling region 362e can include a maximum field region, a maximum voltage region, maximum energy region, or a maximum current region, or any combination thereof. For example, the fifth EM-coupling distance 376e can vary from about 0.01 mm to about 10 mm, and the fifth EM-coupling distance 376e can be wavelength-dependent and can vary from about ($2/\lambda$) to about ($10\lambda$).

A fifth plasma-tuning slab 361e can comprise dielectric material, can be coupled to a fifth control assembly 360e, and can be used to move 363e the fifth plasma-tuning slab 361e a fifth EM-tuning distance 377e relative to the fifth EM-tuning portion 375e of the fifth plasma-tuning rod (370e, 375e) within the first EM energy tuning space 369a. The fifth control assembly 360e and the fifth plasma-tuning slab 361e can be used to optimize the microwave energy coupled from the fifth EM-coupling region 362e to the fifth EM-tuning portion 375e of the fifth plasma-tuning rod (370e, 375e). For example, the fifth EM-tuning distance 377e can be established between the fifth EM-tuning portion 375e and the fifth plasma-tuning slab 361e within the second EM energy tuning space 369b, and the fifth EM-tuning distance 377e can vary from about 0.01 mm to about 1 mm.

The fifth plasma-tuning rod (370e, 375e) can have a fifth diameter ($d_{1e}$) associated therewith that can vary from about 0.01 mm to about 1 mm. The fifth plasma-tuning slab 361e can have a fifth diameter ($D_{1e}$) associated therewith that can vary from about 1 mm to about 10 mm. The fifth EM-coupling region 362e, the fifth control assembly 360e, and the fifth plasma-tuning slab 361e can have a fifth x/y plane offset ($x_{1e}$) associated therewith, and the fifth x/y plane offset ($x_{1e}$) can be wavelength-dependent and can vary from about a quarter wavelength ($2/\lambda$) to about ($10\lambda$). The fifth control assembly 360e can comprise dielectric material, can have a cylindrical configuration and a diameter ($d_{1e}$) that can vary from about 1 mm to about 5 mm.

Still referring to FIG. 3A, a sixth plasma-tuning rod (370f, 375f) can comprise dielectric material and can have a sixth plasma-tuning portion 370f that can extend a sixth plasma-tuning distance 371f into the process space 315 at a sixth location defined using ($x_{2f}$). The sixth plasma-tuning distance 371f can vary from about 10 mm to about 400 mm.

A sixth EM-coupling region 362f can be established at a sixth EM-coupling distance 376f from the first cavity wall 365b within the second EM energy tuning space 369b established in the second cavity assembly 368b, and the sixth EM-tuning portion 375f can extend into the sixth EM-coupling region 362f. The sixth EM-tuning portion 375f can obtain sixth microwave energy from the sixth EM-coupling region 362f, and the sixth microwave energy can be transferred to the process space 315 at the sixth location ($x_{2f}$) using the sixth plasma-tuning portion 370f. The sixth EM-coupling region 362f can include a maximum field region, a maximum voltage region, maximum energy region, or a maximum current region, or any combination thereof. For example, the sixth EM-coupling distance 376f can vary from about 0.01 mm to about 10 mm, and the sixth EM-coupling distance 376f can be wavelength-dependent and can vary from about ($\lambda/4$) to about ($10\lambda$).

A sixth plasma-tuning slab 361f can comprise dielectric material and can be coupled to a sixth control assembly 360f and can be used to move 363f the sixth plasma-tuning slab 361f a sixth EM-tuning distance 377f relative to the sixth EM-tuning portion 375f of the sixth plasma-tuning rod (370f, 375f) within the second EM energy tuning space 369b. The sixth control assembly 360f and the sixth plasma-tuning slab 361f can be used to optimize the microwave energy coupled from the sixth EM-coupling region 362f to the sixth EM-tuning portion 375f of the sixth plasma-tuning rod (370f, 375f). For example, the sixth EM-tuning distance 377f can be established between the sixth EM-tuning portion 375f and the sixth plasma-tuning slab 361f within the second EM energy tuning space 369b, and the sixth EM-tuning distance 377f can vary from about 0.01 mm to about 1 mm.

The sixth plasma-tuning rod (370f, 375f) can have a sixth diameter ($d_{1f}$) associated therewith that can vary from about 0.01 mm to about 1 mm. The sixth plasma-tuning slab 361f can have a sixth diameter ($D_{1f}$) associated therewith that can vary from about 1 mm to about 10 mm. The sixth EM-coupling region 362f, the sixth control assembly 360f, and the sixth plasma-tuning slab 361f can have a sixth x/y plane offset ($x_{1f}$) associated therewith, and the sixth x/y plane offset ($x_{1f}$) can be wavelength-dependent and can vary from about a quarter wavelength ($\lambda/4$) to about ($10\lambda$). The sixth control assembly 360f can comprise dielectric material, can have a cylindrical configuration and a diameter ($d_{1f}$) that can vary from about 1 mm to about 5 mm.

The top view of the third microwave processing system 300 includes a top view of a first cavity-control assembly 345a that is shown coupled to a top view of a first cavity-tuning slab 346a. The first cavity-control assembly 345a can comprise dielectric material, and can have a first diameter ($d_{1aa}$) associated therewith, and the first diameter ($d_{1aa}$) can vary from about 0.01 mm to about 1 mm. The first cavity-tuning slab 346a can comprise dielectric material, and can have a second diameter ($D_{1aa}$) associated therewith, and the second diameter ($D_{1aa}$) can vary from about 1 mm to about 10 mm. The first cavity-control assembly 345a and the first cavity-tuning slab 346a can have a first x/y plane offset ($y_{1aa}$) associated therewith, and the first x/y plane offset ($y_{1aa}$) can vary from about 1 mm to about 10 mm.

In addition, the top view of the third microwave processing system 300 includes a top view of a second cavity-control assembly 345b that is shown coupled to a top view of a second cavity-tuning slab 346b. The second cavity-control assembly 345b can comprise dielectric material, and can have a first additional diameter ($d_{1ba}$) associated therewith, and the first additional diameter ($d_{1ba}$) can vary from about 0.01 mm to about 1 mm. The second cavity-tuning slab 346b can comprise dielectric material, and can have a second additional diameter ($D_{1ba}$) associated therewith, and the second additional diameter ($D_{1ba}$) can vary from about 1 mm to about 10 mm. The second cavity-control assembly 345b and the second cavity-tuning slab 346b can have a second x/y plane offset ($y_{1ba}$) associated therewith, and the second x/y plane offset ($y_{1ba}$) vary from about 1 mm to about 10 mm.

Figure 3B:
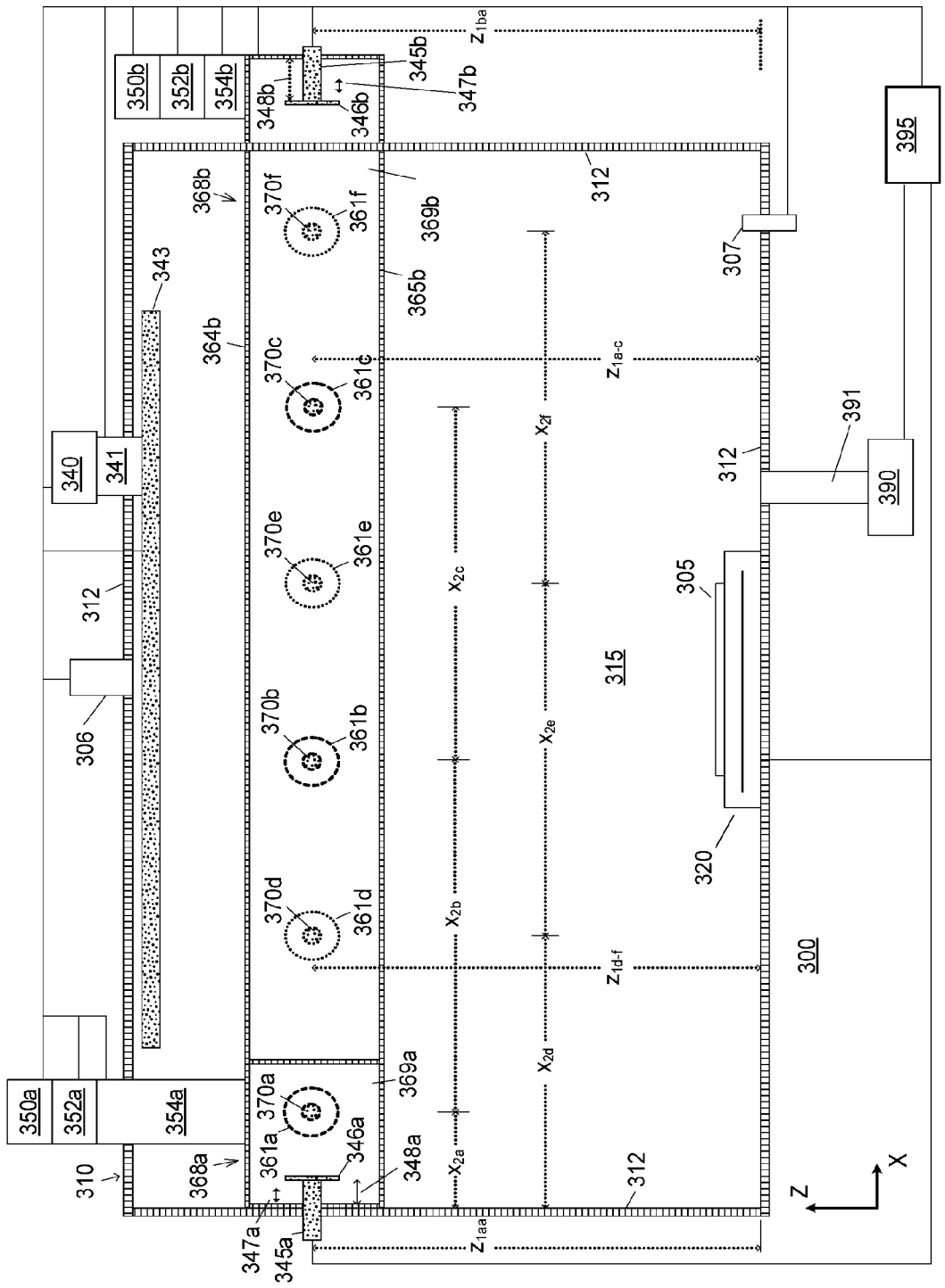

FIG. 3B shows a partial cut-away front view of a third process chamber 310 in a third microwave processing system 300. The front view shows an x/z plane view of a plurality of additional walls 312 coupled to each other, thereby creating a partial cut-away front view of a process space 315 in the third process chamber 310. The third microwave processing system 300 can be configured to form uniform plasma in the process space 315.

The front view shows a cut-away view of a first cavity assembly 368a having a first EM energy tuning space 369a therein, and the first cavity assembly 368a can include a first cavity wall 365a, a second cavity wall 366a, at least one third cavity wall 367a, and one or more additional cavity walls (not shown). For example, the first cavity assembly 368a can be coupled to the first interface assembly 312a using the first cavity wall 365a. The front view also shows a cut-away view of a second cavity assembly 368b having a second EM energy tuning space 369b therein, and the second cavity assembly 368b can include a first cavity wall 365b, a second cavity wall 366b, at least one third cavity wall 367b, and one or more additional cavity walls (not shown). For example, the second cavity assembly 368b can be coupled to the second interface assembly 312b using the first cavity wall 365b.

A partial front view (dash line view) of a first set of plasma tuning rods (370a-370c), a partial front view (dash line view) of a first set of plasma-tuning slabs (361a-361c), a partial front view (dotted line view) of a second set of plasma tuning rods (370d-370f), and a partial front view (dotted line view) of a second set of plasma-tuning slabs (361d-361f) are shown in FIG. 3B.

The first set of plasma tuning rods (370a-370c) and the first set of plasma-tuning slabs (361a-361c) can have a first set of x/y plane offsets ($x_{2a-c}$) associated therewith, and the first set of x/y plane offsets ($x_{2a-c}$) can vary from about 10 mm to about 100 mm. The first set of plasma tuning rods (370a-370c) and the first set of plasma-tuning slabs (361a-361c) can have a first set of x/z plane offsets ($z_{1a-c}$) associated therewith, and the first set of x/z plane offsets ($z_{1a-c}$) can vary from about 100 mm to about 400 mm.

The second set of plasma tuning rods (370d-370f) and the second set of plasma-tuning slabs (361d-361f) can have a second set of x/y plane offsets ($x_{2d-f}$) associated therewith, and the second set of x/y plane offsets ($x_{2d-f}$) can vary from about 10 mm to about 100 mm. The second set of plasma tuning rods (370d-370f) and the second set of plasma-tuning slabs (361d-361f) can have a second set of x/z plane offsets ($z_{1d-f}$) associated therewith that can vary from about 100 mm to about 400 mm.

FIG. 3B shows that the third microwave processing system 300 can include one or more plasma sensors 306 coupled to a chamber wall 312 to obtain first plasma data. In addition, the third microwave processing system 300 may be configured to process 200 mm substrates, 300 mm substrates, or larger-sized substrates. In addition, cylindrical, square and rectangular chambers can each be configured so that the third microwave processing system 300 may be configured to process circular, square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

As shown in FIG. 3B, a first EM source 350a can be coupled to a first cavity assembly 368a, and a second EM source 350b can be coupled to a second cavity assembly 368b.

The first EM source 350a can be coupled to a first matching network 352a, and the first matching network 352a can be coupled to a first coupling network 354a. The second EM source 350b can be coupled to a second matching network 352b, and the second matching network 352b can be coupled to a second coupling network 354b. Alternatively, a plurality of matching networks (not shown) or a plurality of coupling networks (not shown) may be used.

The first coupling network 354a can be removably coupled to the first cavity assembly 368a that can be removably coupled to an upper portion of a first interface assembly 312a of the process chamber 310. The first coupling network 354a can be used to provide microwave energy to the first EM energy tuning space 369a in the first cavity assembly 368a. The second coupling network 354b can be removably coupled to the second cavity assembly 368b that can be removably coupled to an upper portion of a second interface assembly 312b of the process chamber 310. The second coupling network 354b can be used to provide additional microwave energy to the second EM energy tuning space 369b in the second cavity assembly 368b. Alternatively, other EM-coupling configurations may be used.

As shown in FIG. 3B, a controller 395 can be coupled 396 to the EM sources (350a, 350b), the matching networks (352a, 352b), the coupling networks (354a, 354b), and the cavity assemblies (368a, 368b), and the controller 395 can use process recipes to establish, control, and optimize the EM sources (350a, 350b), the matching networks (352a, 352b), the coupling networks (354a, 354b), and the cavity assemblies (368a, 368b) to control the plasma uniformity within the process space 315. For example, the EM sources (350a, 350b) can operate at a frequency from about 500 MHz. to about 5000 MHz. In addition, the controller 395 can be coupled 396 to the plasma sensors 306 and process sensors 307, and the controller 395 can use process recipes to establish, control, and optimize the data from the plasma sensors 306 and the process sensors 307 to control the plasma uniformity within the process space 315.

In addition, the controller 395 can be coupled 396 to gas supply system 340, to a gas supply subassembly 341, and to a gas showerhead 343. For example, the gas supply system 340, the gas supply subassembly 341 and the gas showerhead 343 can be configured to introduce one or more process gases to process space 315, and can include flow control and/or flow measuring devices.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma enhanced deposition, the process gas may comprise a film forming precursor, a reduction gas, or an inert gas, or a combination of two or more thereof.

As shown in FIG. 3B, the third microwave processing system 300 can include a pressure control system 390 and port 391 coupled to the process chamber 310, and configured to evacuate the process chamber 310, as well as control the pressure within the process chamber 310. In addition, the third microwave processing system 300 can include a substrate holder 320 for mounting the substrate 305 in the process space 315.

The front view of the third microwave processing system 300 includes a partial front view of a first cavity-control assembly 345a that is shown coupled to a front view of a first cavity-tuning slab 346a. The first cavity-control assembly 345a and the first cavity-tuning slab 346a can have a first x/z plane offset ($z_{1aa}$) associated therewith, and the first x/z plane offset ($z_{1aa}$) can vary from about 1 mm to about 10 mm.

The first cavity-control assembly 345a can be used to move 347a the first cavity-tuning slab 346a cavity-tuning distances 348a within the first EM-energy tuning space 369a. The controller 395 can be coupled 396 to the cavity-control assembly 345a, and the controller 395 can use process recipes to establish, control, and optimize the cavity-tuning distances 348a to control and maintain the plasma uniformity within the process space 315 in real-time. For example, the cavity-tuning distances 348a can vary from about 0.01 mm to about 10 mm, and the cavity-tuning distances 348a can be wavelength-dependent and can vary from about ($\lambda/4$) to about ($10\lambda$).

In addition, the front view of the third microwave processing system 300 includes a partial front view of a second cavity-control assembly 345b that is shown coupled to a front view of a second cavity-tuning slab 346b. The second cavity-control assembly 345b and the second cavity-tuning slab 346b can have a second x/z plane offset ($z_{1ba}$) associated therewith, and the second x/z plane offset ($z_{1ba}$) vary from about 1 mm to about 10 mm.

The second cavity-control assembly 345b can be used to move 347b the second cavity-tuning slab 346b second cavity-tuning distances 348b within the second EM-energy tuning space 369b. The controller 395 can be coupled 396 to the second cavity-control assembly 345b, and the controller 395 can use process recipes to establish, control, and optimize the second cavity-tuning distances 348b to control and maintain the plasma uniformity within the process space 315 in real-time. For example, the second cavity-tuning distances 348b can vary from about 0.01 mm to about 10 mm, and the second cavity-tuning distances 348b can be wavelength-dependent and can vary from about ($\lambda/4$) to about ($10\lambda$).

Figure 3C:
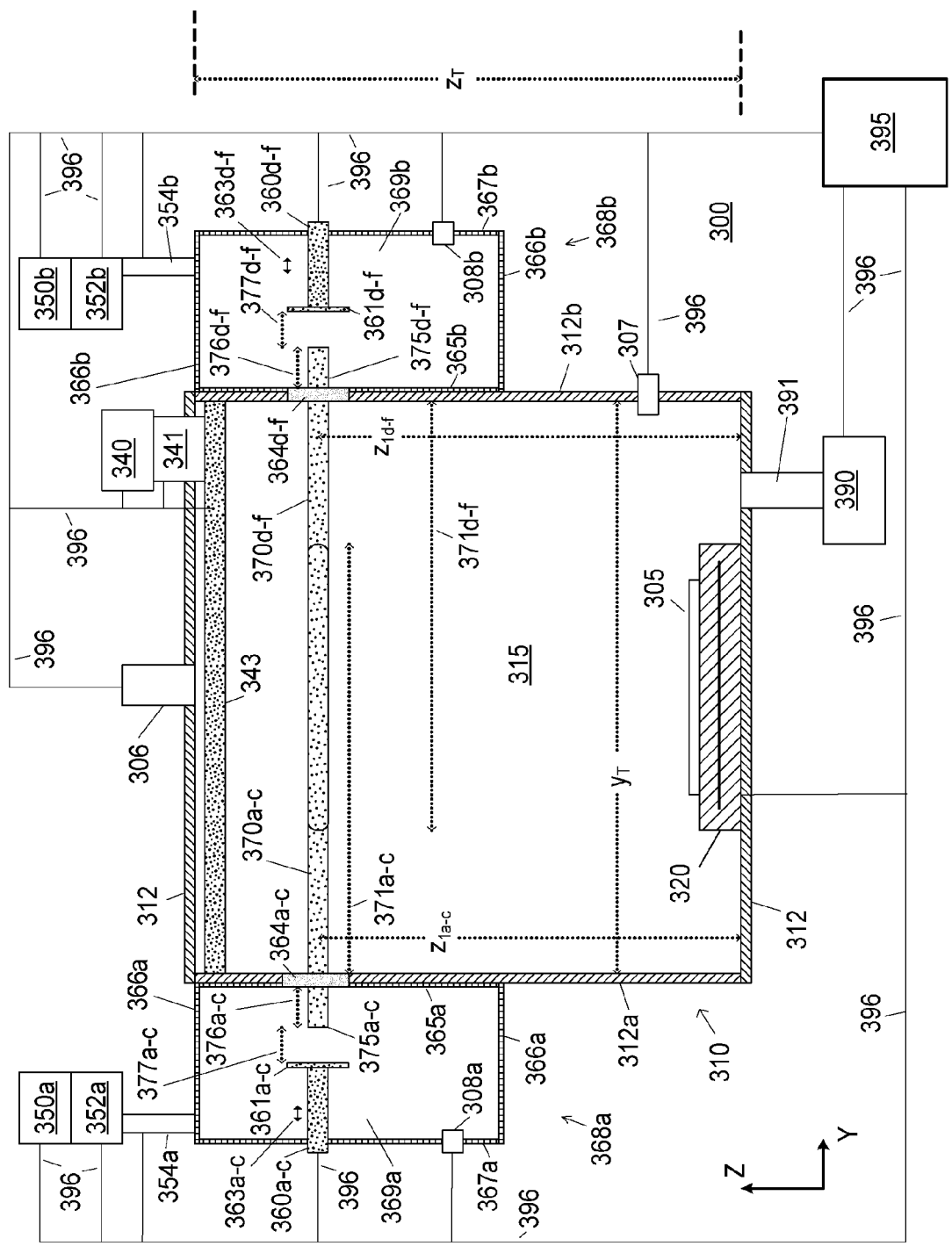

FIG. 3C shows a partial cut-away side view of the third process chamber 310 in the third microwave processing system 300. The side view shows a y/z plane view of a plurality of chamber walls 312 coupled to a first interface assembly 312a and to a second interface assembly 312b, thereby creating a partial cut-away side view of the process space 315 in the process chamber 310. The third microwave processing system 300 can be configured to form uniform plasma in the process space 315.

A partial side view of a first EM energy tuning space 369a in the first cavity assembly 368a and a partial side view of a second EM energy tuning space 369b in the second cavity assembly 368b are shown in FIG. 3C. A partial side view of the first set of plasma tuning rods (370a-370c), a partial side view of a first set of plasma-tuning slabs (361a-361c), a partial side view of a second set of plasma tuning rods (370d-370f), and a partial side view of a second set of plasma-tuning slabs (361d-361f) are shown in FIG. 3C.

Side views of a first set of isolation assemblies (364a, 364b, and 364c) and a second set of isolation assemblies (364d, 364e, and 364f) are also shown in FIG. 3C. For example, first set of isolation assemblies (364a, 364b, and 364c) can be used to removably couple the first set of plasma tuning rods {(370a, 370b, and 370c) and (375a, 375b, and 375c)} to a first interface assembly 312a. Each of the first set of isolation assemblies (364a, 364b, and 364c) can be removably coupled to a first interface assembly 312a. In addition, the second set of isolation assemblies (364d, 364e, and 364f) can be used to removably couple the second set of plasma tuning rods {(370d, 370e, and 370f) and (375d, 375e, and 375f)} to a second interface assembly 312b. Each of the second set of isolation assemblies (364d, 364e, and 364f) can be removably coupled to a second interface assembly 312b.

As shown in FIG. 3C, a first set of plasma-tuning slabs (361a, 361b, and 361c) can be coupled to a first set of control assemblies (360a, 360b, and 360c), and first set of control assemblies (360a, 360b, and 360c) can be used to move (363a, 363b, and 363c) the first set of plasma-tuning slabs (361a, 361b, and 361c) the first set of EM-tuning distances (377a, 377b, and 377c) relative to the EM-tuning portions (375a, 375b, and 375c) within the first EM energy tuning space 369a. In addition, a second set of plasma-tuning slabs (361d, 361e, and 361f) can be coupled to a second set of control assemblies (360d, 360e, and 360f), and the second set of control assemblies (360d, 360e, and 360f) can be used to move (363d, 363e, and 363f) the second set of plasma-tuning slabs (361d, 361e, and 361f) the second set of EM-tuning distances (377d, 377e, and 377f) relative to the EM-tuning portions (375d, 375e, and 375f) within the second EM energy tuning space 369b.

The first set of control assemblies (360a, 360b, and 360c) can be coupled 396 to the controller 395, and the controller 395 can use process recipes to establish, control, and optimize the first set of EM-tuning distances (377a, 377b, and 377c) to control the plasma uniformity within the process space 315. In addition, the second set of control assemblies (360d, 360e, and 360f) can be coupled 396 to the controller 395, and the controller 395 can use process recipes to establish, control, and optimize the second set of EM-tuning distances (377d, 377e, and 377f) to control the plasma uniformity within the process space 315.

The controller 395 can be coupled 396 to the EM sources (350a, 350b), the matching networks (352a, 352b), the coupling networks (354a, 354b), and the cavity assemblies (368a, 368b), and the controller 395 can use process recipes to establish, control, and optimize the EM sources (350a, 350b), the matching networks (352a, 352b), the coupling networks (354a, 354b), and the cavity assemblies (368a, 368b) to control the plasma uniformity within the process space 315. For example, the EM sources (350a, 350b) can operate at frequencies from about 500 MHz to about 5000 MHz. In addition, the controller 395 can be coupled 396 to the plasma sensors 306, the process sensors 307, and the cavity sensors (308a and 308b), and the controller 395 can use process recipes to establish, control, and optimize the data from the plasma sensors 306, the process sensors 307, and the cavity sensors (308a and 308b), to control the plasma uniformity in the process space 315.

The side view illustrates a process chamber 310 having a total width ($y_T$), and a total height ($z_T$) associated therewith in the y/z plane. The total width ($y_T$) can vary from about 50 mm to about 500 mm, and the total height ($z_T$) can vary from about 50 mm to about 500 mm.

Figure 4A:
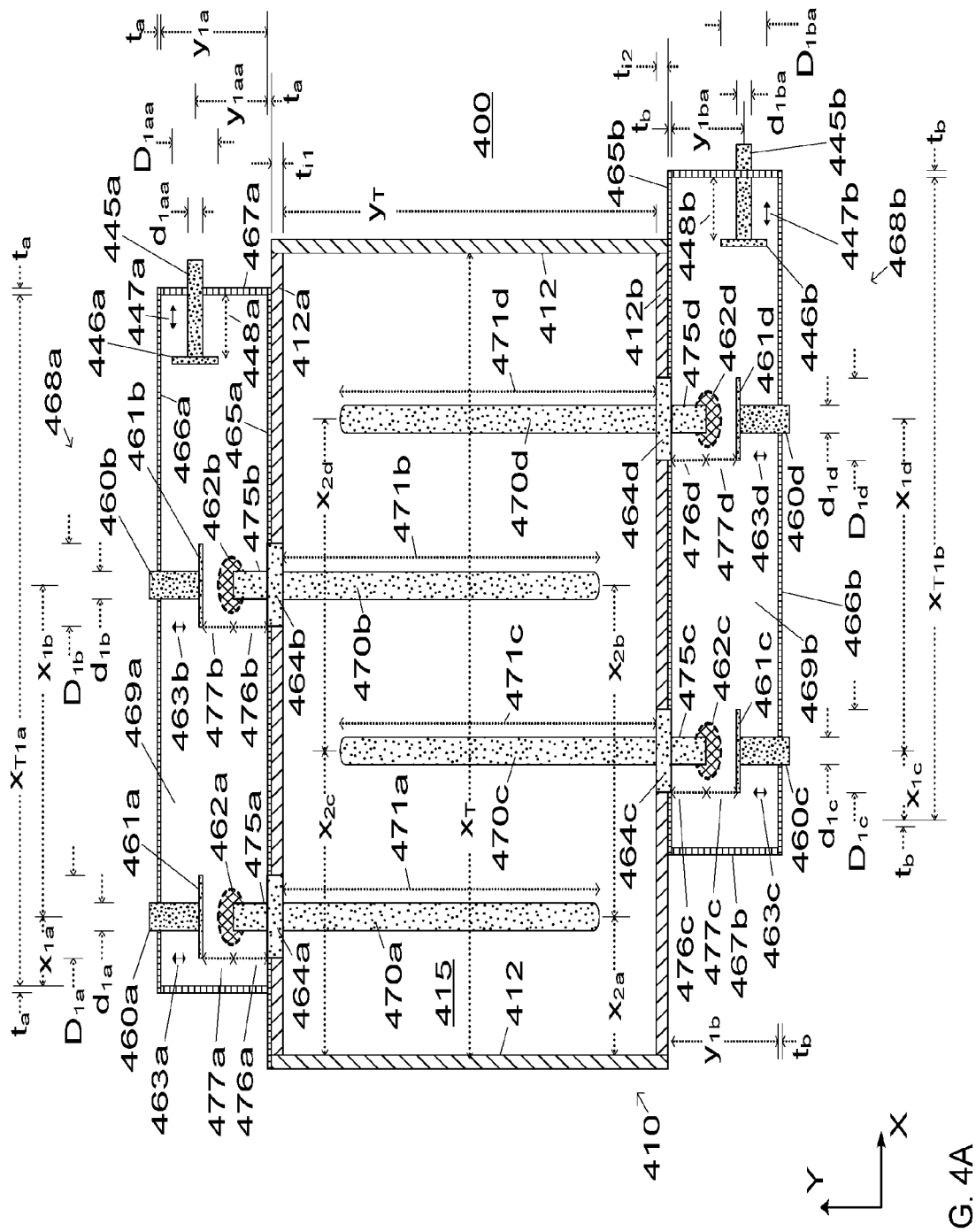
FIGS. 4A-4C illustrate different exemplary views of a fourth microwave processing system according to embodiments of the invention.

FIG. 4A shows a partial cut-away top view of a fourth process chamber 410 in a fourth microwave processing system 400. The top view shows an x/y plane view of a first interface assembly 412a, a second interface assembly 412b, and a plurality of additional chamber walls 412 coupled to the first interface assembly 412a and the second interface assembly 412b thereby forming the fourth process chamber 410.

For example, the chamber walls 412 can have wall thicknesses (t) associated therewith, and the wall thicknesses (t) can vary from about 1 mm to about 5 mm. The first interface assembly 412a can have a first interface thickness ($t_{i1}$) associated therewith, and the first interface thickness ($t_{i1}$) can vary from about 1 mm to about 10 mm. The second interface assembly 412b can have a second interface thickness ($t_{i2}$) associated therewith, and the second interface thickness ($t_{i2}$) can vary from about 1 mm to about 10 mm. The process space 415 can have a length ($x_T$) associated therewith, and the length ($k_T$) can vary from about 10 mm to about 500 mm.

The top view of the fourth microwave processing system 400 shows a cut-away view of a first cavity assembly 468a having a first EM energy tuning space 469a therein, and the first cavity assembly 468a can include a first cavity wall 465a, a second cavity wall 466a, at least one third cavity wall 467a, and one or more additional cavity walls (not shown). For example, the first cavity assembly 468a can be coupled to the first interface assembly 412a using the first cavity wall 465a, and walls (465a, 466a, and 467a) can comprise dielectric material and can have wall thicknesses ($t_a$) associated therewith, and the wall thicknesses ($t_a$) can vary from about 1 mm to about 5 mm. In addition, the first EM energy tuning space 469a can have a first length ($x_{T1a}$) and a first width ($y_{1a}$) associated therewith, the first length ($x_{T1a}$) can vary from about 10 mm to about 500 mm, and the first width ($y_{1a}$) can vary from about 5 mm to about 50 mm.

The top view of the fourth microwave processing system 400 also shows a cut-away view of a second cavity assembly 468b having a second EM energy tuning space 469b therein, and the second cavity assembly 468b can include a first cavity wall 465b, a second cavity wall 466b, at least one third cavity wall 467b, and one or more additional cavity walls (not shown). For example, the second cavity assembly 468b can be coupled to the second interface assembly 412b using the first cavity wall 465b, and walls (465b, 466b, and 467b) can comprise dielectric material and can have wall thicknesses ($t_b$) associated therewith, and the wall thicknesses ($t_b$) can vary from about 1 mm to about 5 mm. In addition, the second EM energy tuning space 469b can have a second length ($x_{T1b}$) and a second width ($y_{1b}$) associated therewith, the second length ($x_{T1b}$) can vary from about 10 mm to about 500 mm, and the second width ($y_{1b}$) can vary from about 5 mm to about 50 mm.

In some exemplary systems, a first set of isolation assemblies (464a and 464b) can be removably coupled to a first interface assembly 412a and can be configured to isolate the process space 415 from the first EM energy tuning space 469a. The first set of isolation assemblies (464a and 464b) can be used to removably couple the first set of plasma tuning rods {(470a and 470b) and (475a and 475b)} to a first interface assembly 412a. For example, the first set of plasma-tuning portions (470a and 470b) can be configured in the process space 415, and the first set of EM-tuning portions (475a and 475b) can be configured within the first EM energy tuning space 469a.

A second set of isolation assemblies (464c and 464d) can be removably coupled to the second interface assembly 412b and can be configured to isolate the process space 415 from the second EM energy tuning space 469b. The second set of isolation assemblies (464c and 464d) can be used to removably couple the second set of plasma tuning rods {(470c and 470d) and (475c and 475d)} to the second interface assembly 412b. For example, the second set of plasma-tuning portions (470c and 470d) can be configured in the process space 415, and the second set of EM-tuning portions (475c and 475d) can be configured within the second EM energy tuning space 469b.

Still referring to FIG. 4A, a first plasma-tuning rod (470a, 475a) can comprise dielectric material and can have a first plasma-tuning portion 470a that can extend a first plasma-tuning distance 471a into the process space 415 at a first location defined using ($x_{2a}$). The first plasma-tuning distance 471a can vary from about 10 mm to about 400 mm.

A first EM-coupling region 462a can be established at a first EM-coupling distance 476a from the first cavity wall 465a within the first EM energy tuning space 469a established in the first cavity assembly 468a, and the first EM-tuning portion 475a can extend into the first EM-coupling region 462a. The first EM-tuning portion 475a can obtain first microwave energy from the first EM-coupling region 462a, and the first microwave energy can be transferred to the process space 415 at the first location ($x_{2a}$) using the first plasma-tuning portion 470a. The first EM-coupling region 462a can include a maximum field region, a maximum voltage region, maximum energy region, or a maximum current region, or any combination thereof. For example, the first EM-coupling distance 476a can vary from about 0.01 mm to about 10 mm, and the first EM-coupling distance 476a can be wavelength-dependent and can vary from about ($\lambda/4$) to about ($10\lambda$).

A first plasma-tuning slab 461a can comprise dielectric material, can be coupled to a first control assembly 460a, and can be used to move 463a the first plasma-tuning slab 461a a first EM-tuning distance 477a relative to the first EM-tuning portion 475a of the first plasma-tuning rod (470a, 475a) within the first EM energy tuning space 469a. The first control assembly 460a and the first plasma-tuning slab 461a can be used to optimize the microwave energy coupled from the first EM-coupling region 462a to the first EM-tuning portion 475a of the first plasma-tuning rod (370a, 475a). For example, the first EM-tuning distance 477a can be established between the first EM-tuning portion 475a and the first plasma-tuning slab 461a within the first EM energy tuning space 469a, and the first EM-tuning distance 477a can vary from about 0.01 mm to about 1 mm.

The first plasma-tuning rod (470a, 475a) can have a first diameter ($d_{1a}$) associated therewith that can vary from about 0.01 mm to about 1 mm. The first plasma-tuning slab 461a can have a first diameter ($D_{1a}$) associated therewith that can vary from about 1 mm to about 10 mm. The first EM-coupling region 462a, the first control assembly 460a, and the first plasma-tuning slab 461a can have a first x/y plane offset ($x_{1a}$) associated therewith, and the first x/y plane offset ($x_{1a}$) can be wavelength-dependent and can vary from about a quarter wavelength ($\lambda/4$) to about ($10\lambda$). The first control assembly 460a can have a cylindrical configuration and a diameter ($d_{1a}$) that can vary from about 1 mm to about 5 mm.

A second plasma-tuning rod (470b, 475b) can have a second plasma-tuning portion 470b that can extend a second plasma-tuning distance 471b into the process space 415 at a second location defined using ($x_{1b}$). For example, the second plasma-tuning distance 471b can vary from about 10 mm to about 400 mm.

A second EM-coupling region 462b can be established at a second EM-coupling distance 476b from the first cavity wall 465a within the first EM energy tuning space 469a established in the first cavity assembly 468a, and the second EM-tuning portion 475b can extend into the second EM-coupling region 462b. The second EM-tuning portion 475b can obtain second microwave energy from the second EM-coupling region 462b, and the second microwave energy can be transferred to the process space 415 at the second location ($x_{1b}$) using the second plasma-tuning portion 470b. The second EM-coupling region 462b can include a maximum field region, a maximum voltage region, maximum energy region, or a maximum current region, or any combination thereof. For example, the second EM-coupling distance 476b can vary from about 0.01 mm to about 10 mm, and the second EM-coupling distance 476b can be wavelength-dependent and can vary from about (2/λ) to about (10λ).

A second plasma-tuning slab 461b can comprise dielectric material, can be coupled to a second control assembly 460b, and can be used to move 463b the second plasma-tuning slab 461b a second EM-tuning distance 477b relative to the second EM-tuning portion 475b of the second plasma-tuning rod (470b, 475b) within the first EM energy tuning space 469a. The second control assembly 460b and the second plasma-tuning slab 461b can be used to optimize the microwave energy coupled from the second EM-coupling region 462b to the second EM-tuning portion 475b of the second plasma-tuning rod (470b, 475b). For example, the second EM-tuning distance 477b can be established between the second EM-tuning portion 475b and the second plasma-tuning slab 461b within the first EM energy tuning space 469a, and the second EM-tuning distance 477b can vary from about 0.01 mm to about 1 mm.

The second plasma-tuning rod (470b, 475b) can have a second diameter ($d_{1b}$) associated therewith that can vary from about 0.01 mm to about 1 mm. The second plasma-tuning slab 461b can have a second diameter ($D_{1b}$) associated therewith that can vary from about 1 mm to about 10 mm. The second EM-coupling region 462b, the second control assembly 460b, and the second plasma-tuning slab 461b can have a second x/y plane offset ($x_{1b}$) associated therewith, and the second x/y plane offset ($x_{1b}$) can be wavelength-dependent and can vary from about a quarter wavelength (λ/4) to about (10λ). The second control assembly 460b can comprise dielectric material and can have a cylindrical configuration and a diameter ($d_{1b}$) that can vary from about 1 mm to about 5 mm.

A third plasma-tuning rod (470c, 475c) can comprise dielectric material and can have a third plasma-tuning portion 470c that can extend a third plasma-tuning distance 471c into the process space 415 at a third location defined using ($x_{2c}$). For example, the third plasma-tuning distance 471c can vary from about 10 mm to about 400 mm.

A third EM-coupling region 462c can be established at a third EM-coupling distance 476c from the first cavity wall 465a within the second EM energy tuning space 469b established in the second cavity assembly 468b, and the third EM-tuning portion 475c can extend into the third EM-coupling region 462c. The third EM-tuning portion 475c can obtain third microwave energy from the third EM-coupling region 462c, and the third microwave energy can be transferred to the process space 415 at the third location ($x_{2c}$) using the third plasma-tuning portion 470c. The third EM-coupling region 462c can include a maximum field region, a maximum voltage region, maximum energy region, or a maximum current region, or any combination thereof. For example, the third EM-coupling distance 476c can vary from about 0.01 mm to about 10 mm, and the third EM-coupling distance 476c can be wavelength-dependent and can vary from about (2/λ) to about (10λ).

A third plasma-tuning slab 461c can comprise dielectric material, can be coupled to a third control assembly 460c, and can be used to move 463c the third plasma-tuning slab 461c a third EM-tuning distance 477c relative to the third EM-tuning portion 475c of the third plasma-tuning rod (470c, 475c) within the second EM energy tuning space 469b. The third control assembly 460c and the third plasma-tuning slab 461c can be used to optimize the microwave energy coupled from the third EM-coupling region 462c to the third EM-tuning portion 475c of the third plasma-tuning rod (470c, 475c). For example, the third EM-tuning distance 477c can be established between the third EM-tuning portion 475c and the third plasma-tuning slab 461c within the second EM energy tuning space 469b, and the third EM-tuning distance 477c can vary from about 0.01 mm to about 1 mm.

The third plasma-tuning rod (470c, 475c) can have a third diameter ($d_{1c}$) associated therewith that can vary from about 0.01 mm to about 1 mm. The third plasma-tuning slab 461c can have a third diameter ($D_{1c}$) associated therewith that can vary from about 1 mm to about 10 mm. The third EM-coupling region 462c, the third control assembly 460c, and the third plasma-tuning slab 461c can have a third x/y plane offset ($x_{1c}$) associated therewith, and the third x/y plane offset ($x_{1c}$) can be wavelength-dependent and can vary from about a quarter wavelength (2/λ) to about (10λ). The third control assembly 460c can comprise dielectric material, can have a cylindrical configuration and a diameter ($d_{1c}$) that can vary from about 1 mm to about 5 mm.

A fourth plasma-tuning rod (470d, 475d) can comprise dielectric material and can have a fourth plasma-tuning portion 470d that can extend a fourth plasma-tuning distance 471d into the process space 415 at a fourth location defined using ($x_{2d}$). For example, the fourth plasma-tuning distance 471d can vary from about 10 mm to about 400 mm.

A fourth EM-coupling region 462d can be established at a fourth EM-coupling distance 476d from the first cavity wall 465a within the second EM energy tuning space 469b established in the second cavity assembly 468b, and the fourth EM-tuning portion 475d can extend into the fourth EM-coupling region 462d. The fourth EM-tuning portion 475d can obtain fourth microwave energy from the fourth EM-coupling region 462d, and the fourth microwave energy can be transferred to the process space 415 at the fourth location ($x_{2d}$) using the fourth plasma-tuning portion 470d. The fourth EM-coupling region 462d can include a maximum field region, a maximum voltage region, maximum energy region, or a maximum current region, or any combination thereof. For example, the fourth EM-coupling distance 476d can vary from about 0.01 mm to about 10 mm, and the fourth EM-coupling distance 476d can be wavelength-dependent and can vary from about (λ/4) to about (10λ).

A fourth plasma-tuning slab 461d can comprise dielectric material, can be coupled to a fourth control assembly 460d, and can be used to move 463d the fourth plasma-tuning slab 461d a fourth EM-tuning distance 477d relative to the fourth EM-tuning portion 475d of the fourth plasma-tuning rod (470d, 475d) within the second EM energy tuning space 469b. The fourth control assembly 460d and the fourth plasma-tuning slab 461d can be used to optimize the microwave energy coupled from the fourth EM-coupling region 462d to the fourth EM-tuning portion 475d of the fourth plasma-tuning rod (470d, 475d). For example, the fourth EM-tuning distance 477d can be established between the fourth EM-tuning portion 475d and the fourth plasma-tuning slab 461d within the second EM energy tuning space 469b, and the fourth EM-tuning distance 477d can vary from about 0.01 mm to about 1 mm.

The fourth plasma-tuning rod (470d, 475d) can have a fourth diameter ($d_{1d}$) associated therewith that can vary from about 0.01 mm to about 1 mm. The fourth plasma-tuning slab 461d can have a fourth diameter ($D_{1d}$) associated therewith that can vary from about 1 mm to about 10 mm. The fourth EM-coupling region 462d, the fourth control assembly 460d, and the fourth plasma-tuning slab 461d can have a fourth x/y plane offset ($x_{1d}$) associated therewith, and the fourth x/y plane offset ($x_{1d}$) can be wavelength-dependent and can vary from about a quarter wavelength (λ/4) to about (10λ). The fourth control assembly 460d can comprise dielectric material, can have a cylindrical configuration and a diameter ($d_{1d}$) that can vary from about 1 mm to about 5 mm.

The top view of the fourth microwave processing system 400 includes a top view of a first cavity-control assembly 445a that is shown coupled to a top view of a first cavity-tuning slab 446a. The first cavity-control assembly 445a can comprise dielectric material, and can have a first diameter ($d_{1aa}$) associated therewith, and the first diameter ($d_{1aa}$) can vary from about 0.01 mm to about 1 mm. The first cavity-tuning slab 446a can comprise dielectric material, and can have a second diameter ($D_{1aa}$) associated therewith, and the second diameter ($D_{1aa}$) can vary from about 1 mm to about 10 mm. The first cavity-control assembly 445a and the first cavity-tuning slab 446a can have a first x/y plane offset ($y_{1aa}$) associated therewith, and the first x/y plane offset ($y_{1aa}$) can vary from about 1 mm to about 10 mm.

In addition, the top view of the fourth microwave processing system 400 includes a top view of a second cavity-control assembly 445b that is shown coupled to a top view of a second cavity-tuning slab 446b. The second cavity-control assembly 445b can comprise dielectric material, and can have a first additional diameter ($d_{1ba}$) associated therewith, and the first additional diameter ($d_{1ba}$) can vary from about 0.01 mm to about 1 mm. The second cavity-tuning slab 446b can comprise dielectric material, and can have a second additional diameter ($D_{1ba}$) associated therewith, and the second additional diameter ($D_{1ba}$) can vary from about 1 mm to about 10 mm. The second cavity-control assembly 445b and the second cavity-tuning slab 446b can have a second x/y plane offset ($y_{1ba}$) associated therewith, and the second x/y plane offset ($y_{1ba}$) vary from about 1 mm to about 10 mm.

Figure 4B:
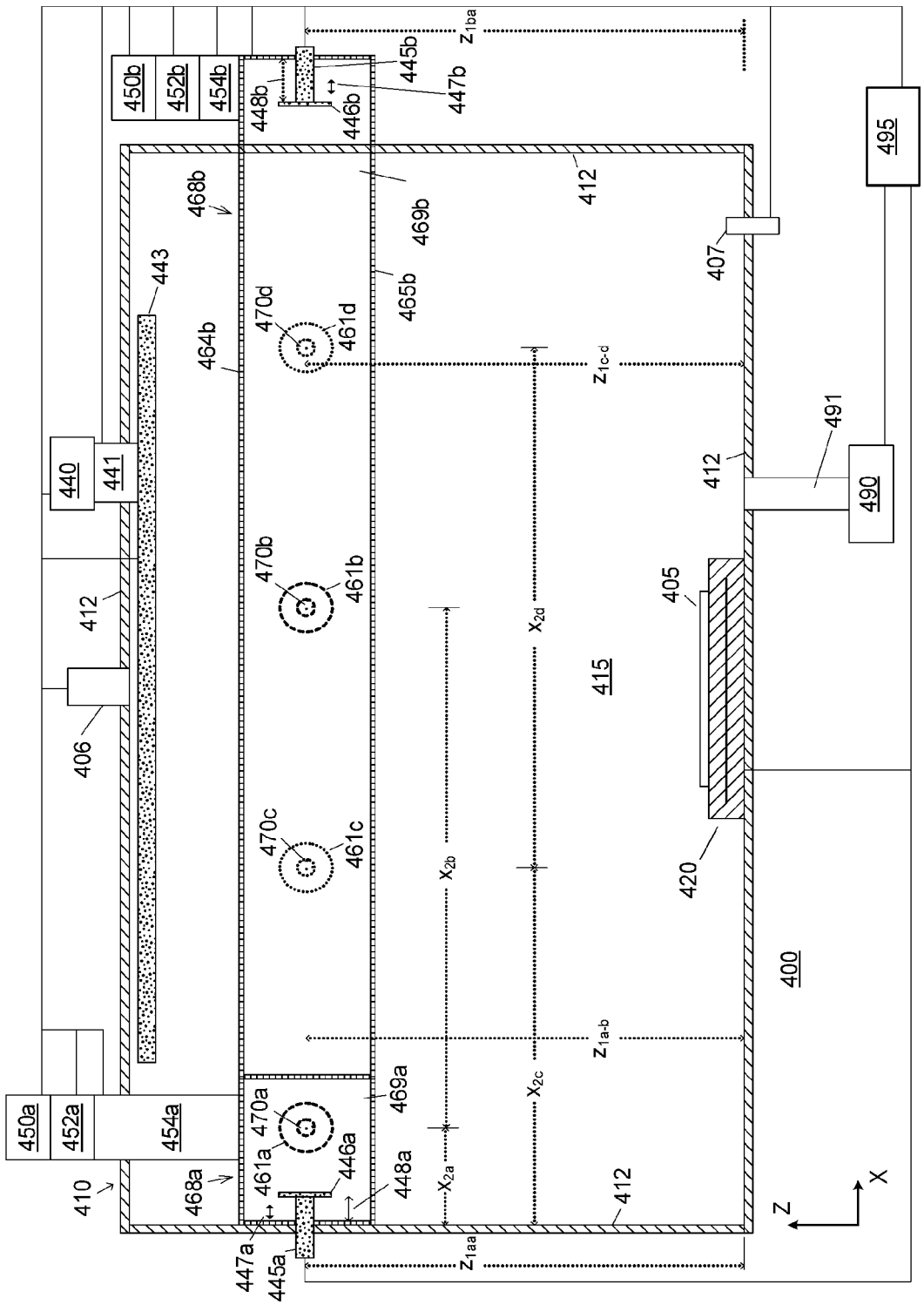

FIG. 4B shows a partial cut-away front view of a fourth process chamber 410 in a fourth microwave processing system 400. The front view shows an x/z plane view of a plurality of additional walls 412 coupled to each other, thereby creating a partial cut-away front view of a process space 415 in the fourth process chamber 410. The fourth microwave processing system 400 can be configured to form plasma in the process space 415.

The front view of the fourth microwave processing system 400 shows a cut-away view of a first cavity assembly 468a having a first EM energy tuning space 469a therein, and the first cavity assembly 468a can include a first cavity wall 465a, a second cavity wall 466a, at least one third cavity wall 467a, and one or more additional cavity walls (not shown). For example, the first cavity assembly 468a can be coupled to the first interface assembly 412a using the first cavity wall 465a. The front view also shows a cut-away view of a second cavity assembly 468b having a second EM energy tuning space 469b therein, and the second cavity assembly 468b can include a first cavity wall 465b, a second cavity wall 466b, at least one third cavity wall 467b, and one or more additional cavity walls (not shown). For example, the second cavity assembly 468b can be coupled to the second interface assembly 412b using the first cavity wall 465b.

A partial front view (dash line view) of a first set of plasma tuning rods (470a and 470b), a partial front view (dash line view) of a first set of plasma-tuning slabs (461a and 461b), a partial front view (dotted line view) of a second set of plasma tuning rods (470c and 470d), and a partial front view (dotted line view) of a second set of plasma-tuning slabs (461c and 461d) are shown in FIG. 4B.

The first set of plasma tuning rods (470a and 470b) and the first set of plasma-tuning slabs (461a and 461b) can have a first set of x/y plane offsets ($x_{2a-b}$) associated therewith that can vary from about 10 mm to about 100 mm. The first set of plasma tuning rods (470a and 470b) and the first set of plasma-tuning slabs (461a and 461b) can have a first set of x/z plane offsets ($z_{1a-b}$) associated therewith, and the first set of x/z plane offsets ($z_{1a-b}$) can vary from about 100 mm to about 400 mm.

The second set of plasma tuning rods (470c and 470d) and the second set of plasma-tuning slabs (461c and 461d) can have a second set of x/y plane offsets ($x_{2c-d}$) associated therewith, and the second set of x/y plane offsets ($x_{2c-d}$) can vary from about 10 mm to about 100 mm. The second set of plasma tuning rods (470c and 470d) and the second set of plasma-tuning slabs (461c and 461d) can have a second set of x/z plane offsets ($z_{1e-d}$) associated therewith, and the second set of x/z plane offsets ($z_{1c-d}$) can vary from about 100 mm to about 400 mm.

FIG. 4B shows that the fourth microwave processing system 400 can include one or more plasma sensors 406 coupled to a chamber wall 412 to obtain first plasma data. In addition, the fourth microwave processing system 400 may be configured to process 200 mm substrates, 300 mm substrates, or larger-sized substrates. In addition, cylindrical, square and rectangular chambers can each be configured so that the fourth microwave processing system 400 may be configured to process circular, square or rectangular substrates, wafers, or LCDs regardless of their size, as would be appreciated by those skilled in the art. Therefore, while aspects of the invention will be described in connection with the processing of a semiconductor substrate, the invention is not limited solely thereto.

As shown in FIG. 4B, a first EM source 450a can be coupled to a first cavity assembly 468a, and a second EM source 450b can be coupled to a second cavity assembly 468b. The first EM source 450a can be coupled to a first matching network 452a, and the first matching network 452a can be coupled to a first coupling network 454a. The second EM source 450b can be coupled to a second matching network 452b, and the second matching network 452b can be coupled to a second coupling network 454b. Alternatively, a plurality of matching networks (not shown) or a plurality of coupling networks (not shown) may be used.

The first coupling network 454a can be removably coupled to the first cavity assembly 468a that can be removably coupled to an upper portion of a first interface assembly 412a of the process chamber 410. The first coupling network 454a can be used to provide microwave energy to the first EM energy tuning space 469a in the first cavity assembly 468a. The second coupling network 454b can be removably coupled to the second cavity assembly 468b that can be removably coupled to an upper portion of a second interface assembly 412b of the process chamber 410. The second coupling network 454b can be used to provide additional microwave energy to the second EM energy tuning space 469b in the second cavity assembly 468b. Alternatively, other EM-coupling configurations may be used.

As shown in FIG. 4B, a controller 495 can be coupled 496 to the EM sources (450a, 450b), the matching networks (452a, 452b), the coupling networks (454a, 454b), and the cavity assemblies (468a, 468b), and the controller 495 can use process recipes to establish, control, and optimize the EM sources (450a, 450b), the matching networks (452a, 452b), the coupling networks (454a, 454b), and the cavity assemblies (468a, 468b) to control the plasma uniformity within the process space 415. For example, the EM sources (450a, 450b) can operate at a frequency from about 500 MHz. to about 5000 MHz. In addition, the controller 495 can be coupled 496 to the plasma sensors 406 and process sensors 407, and the controller 495 can use process recipes to establish, control, and optimize the data from the plasma sensors 406 and the process sensors 407 to control the plasma uniformity within the process space 415.

In addition, the controller 495 can be coupled 496 to gas supply system 440, to a gas supply subassembly 441, and to a gas showerhead 443. For example, the gas supply system 440, the gas supply subassembly 441 and the gas showerhead 443 can be configured to introduce one or more process gases to process space 415, and can include flow control and/or flow measuring devices.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma enhanced deposition, the process gas may comprise a film forming precursor, a reduction gas, or an inert gas, or a combination of two or more thereof.

As shown in FIG. 4B, the fourth microwave processing system 400 can include a pressure control system 490 and port 491 coupled to the process chamber 410, and configured to evacuate the process chamber 410, as well as control the pressure within the process chamber 410. In addition, the fourth microwave processing system 400 can include a substrate holder 420 for mounting the substrate 405 in the process space 415.

The front view of the fourth microwave processing system 400 includes a partial front view of a first cavity-control assembly 445a that is shown coupled to a front view of a first cavity-tuning slab 446a. The first cavity-control assembly 445a and the first cavity-tuning slab 446a can have a first x/z plane offset ($z_{1aa}$) associated therewith, and the first x/z plane offset ($z_{1aa}$) can vary from about 1 mm to about 10 mm.

The first cavity-control assembly 445a can be used to move 447a the first cavity-tuning slab 446a fourth cavity-tuning distances 448a within the first EM-energy tuning space 469a. The controller 495 can be coupled 496 to the first cavity-control assembly 445a, and the controller 495 can use process recipes to establish, control, and optimize the fourth cavity-tuning distances 448a to control and maintain the plasma uniformity within the process space 415 in real-time. For example, the fourth cavity-tuning distances 448a can vary from about 0.01 mm to about 10 mm, and the fourth cavity-tuning distances 448a can be wavelength-dependent and can vary from about ($\lambda/4$) to about ($10\lambda$).

In addition, the front view of the fourth microwave processing system 400 includes a partial front view of a second cavity-control assembly 445b that is shown coupled to a front view of a second cavity-tuning slab 446b. The second cavity-control assembly 445b and the second cavity-tuning slab 446b can have a second x/z plane offset ($z_{1ba}$) associated therewith that can vary from about 1 mm to about 10 mm.

The second cavity-control assembly 445b can be used to move 447b the second cavity-tuning slab 446b second cavity-tuning distances 448b within the second EM-energy tuning space 469b. The controller 495 can be coupled to the second cavity-control assembly 445b, and the controller 495 can use process recipes to establish, control, and optimize the second cavity-tuning distances 448b to control and maintain the plasma uniformity within the process space 415 in real-time. For example, the second cavity-tuning distances 448b can vary from about 0.01 mm to about 10 mm, and the second cavity-tuning distances 448b can be wavelength-dependent and can vary from about ($\lambda/4$) to about ($10\lambda$).

Figure 4C:
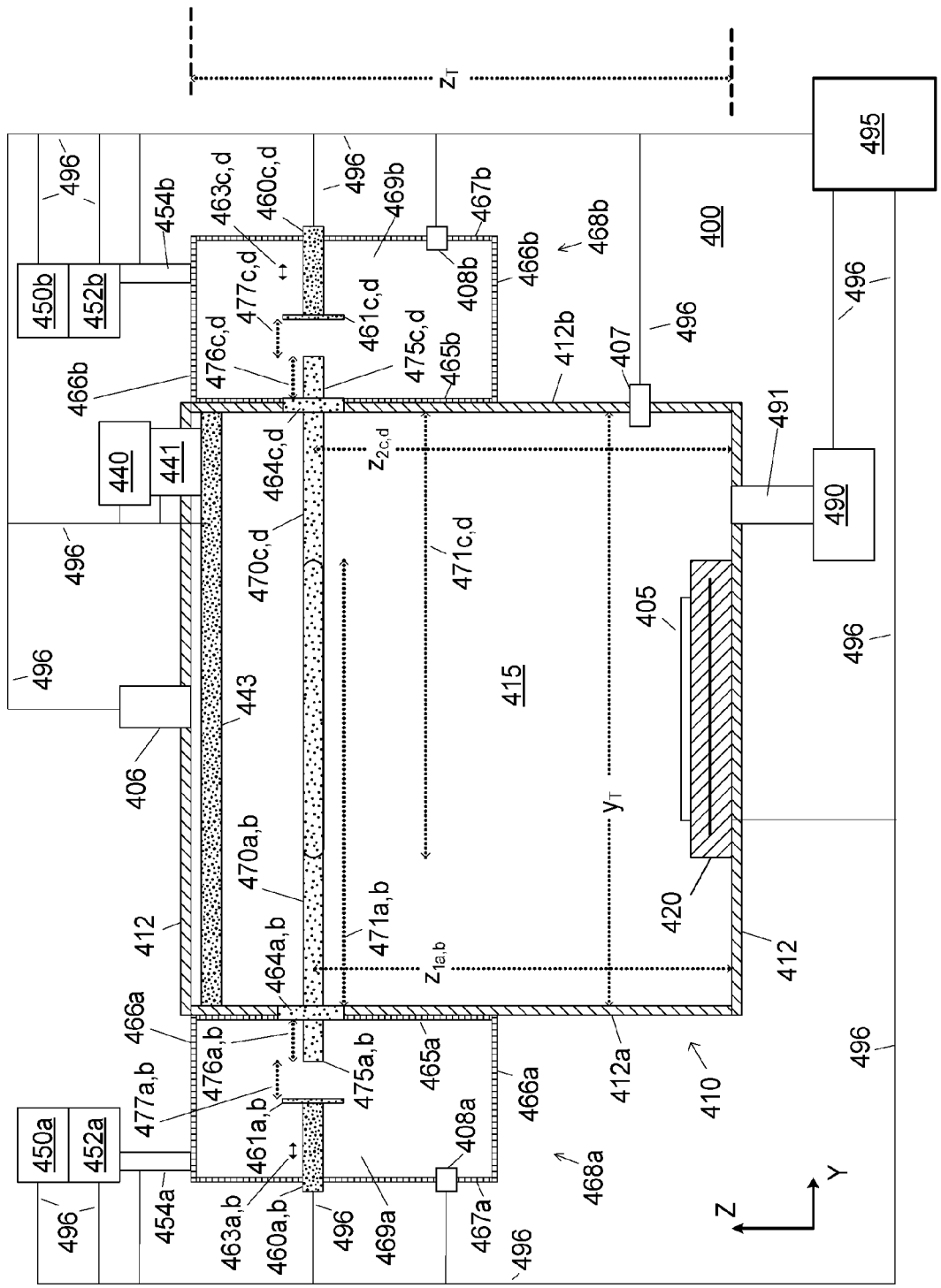

FIG. 4C shows a partial cut-away side view of the fourth process chamber 410 in the fourth microwave processing system 400. The side view shows a y/z plane view of a plurality of chamber walls 412 coupled to a first interface assembly 412a and to a second interface assembly 412b, thereby creating a partial cut-away side view of the process space 415 in the process chamber 410. The fourth microwave processing system 400 can be configured to form plasma in the process space 415.

A partial side view of a first EM energy tuning space 469a in the first cavity assembly 468a and a partial side view of a second EM energy tuning space 469b in the second cavity assembly 468b are shown in FIG. 4C. A partial side view of the first set of plasma tuning rods (470a and 470b), a partial side view of a first set of plasma-tuning slabs (461a and 461b), a partial side view of a second set of plasma tuning rods (470c and 470d), and a partial side view of a second set of plasma-tuning slabs (461c and 461d) are shown in FIG. 4C.

Side views of a first set of isolation assemblies (464a and 464b) and a second set of isolation assemblies (464c and 464d) are also shown in FIG. 4C. For example, first set of isolation assemblies (464a and 464b) can be used to removably couple the first set of plasma tuning rods {(470a and 470b) and (475a and 475b)} to a first interface assembly 412a. Each of the first set of isolation assemblies (464a and 464b) can be removably coupled to a first interface assembly 412a. In addition, the second set of isolation assemblies (464c and 464d) can be used to removably couple the second set of plasma tuning rods {(470c and 470d) and (475c and 475d)} to a second interface assembly 412b. Each of the second set of isolation assemblies (464c and 464d) can be removably coupled to a second interface assembly 412b.

As shown in FIG. 4C, a first set of plasma-tuning slabs (461a and 461b) can be coupled to a first set of control assemblies (460a and 460b), and first set of control assemblies (460a and 460b) can be used to move (463a and 463b) the first set of plasma-tuning slabs (461a and 461b) the first set of EM-tuning distances (477a and 477b) relative to the EM-tuning portions (475a and 475b) within the first EM energy tuning space 469a. In addition, a second set of plasma-tuning slabs (461c and 461d) can be coupled to a second set of control assemblies (460c and 460d), and the second set of control assemblies (460c and 460d) can be used to move (463c and 463d) the second set of plasma-tuning slabs (461c and 461d) the second set of EM-tuning distances (477c and 477d) relative to the EM-tuning portions (475c and 475d) within the second EM energy tuning space 469b.

The first set of control assemblies (460a and 460b) can be coupled to the controller 495, and the controller 495 can use process recipes to establish, control, and optimize the first set of EM-tuning distances (477a and 477b) to control the plasma uniformity within the process space 415. In addition, the second set of control assemblies (460c and 460d) can be coupled to the controller 495, and the controller 495 can use process recipes to establish, control, and optimize the second set of EM-tuning distances (477c and 477d) to control the plasma uniformity within the process space 415.

The controller 495 can be coupled 496 to the EM sources (450a, 450b), the matching networks (452a, 452b), the coupling networks (454a, 454b), and the cavity assemblies (468a, 468b), and the controller 495 can use process recipes to establish, control, and optimize the EM sources (450a, 450b), the matching networks (452a, 452b), the coupling networks (454a, 454b), and the cavity assemblies (468a, 468b) to control the plasma uniformity within the process space 415. For example, the EM sources (450a, 450b) can operate at frequencies from about 500 MHz to about 5000 MHz. In addition, the controller 495 can be coupled 496 to the plasma sensors 406, the process sensors 407, and the cavity sensors (408a and 408b), and the controller 495 can use process recipes to establish, control, and optimize the data from the plasma sensors 406, the process sensors 407, and the cavity sensors (408a and 408b), to control the plasma uniformity within the process space 415.

The side view illustrates a process chamber 410 having a total width ($y_T$), and a total height ($z_T$) associated therewith in the y/z plane. For example, the total width ($y_T$) can vary from about 50 mm to about 500 mm, and the total height ($z_T$) can vary from about 50 mm to about 500 mm.

FIGS. 5A-5D show different views of exemplary plasma-tuning rods in accordance with embodiments of the invention. FIG. 5A shows a front view and a side view of a first exemplary plasma-tuning rod (570a, 575a). The first plasma-tuning portion 570a can have first lengths ($y_{11}$) associated therewith, and the first lengths ($y_{11}$) can vary from about 1 mm to about 400 mm. The first EM-tuning portion 575a can have lengths ($y_{12}$) associated therewith, and the lengths ($y_{12}$) can vary from about 1 mm to about 400 mm. The first plasma-tuning portion 570a and the first EM-tuning portion 575a can have first heights ($x_1$) associated therewith, and the first heights ($x_1$) can vary from about 0.1 mm to about 10 mm. The first plasma-tuning portion 570a and the first EM-tuning portion 575a can have first widths ($z_1$) associated therewith, and the first widths ($z_1$) can vary from about 0.1 mm to about 10 mm.

FIG. 5B shows a front view and a side view of a second exemplary plasma-tuning rod (570b, 575b). The second plasma-tuning portion 570b can have first lengths ($y_{21}$) associated therewith, and the first lengths ($y_{21}$) can vary from about 1 mm to about 400 mm. The second EM-tuning portion 575b can have lengths ($y_{22}$) associated therewith, and the lengths ($y_{22}$) can vary from about 1 mm to about 400 mm. The second plasma-tuning portion 570b and the second EM-tuning portion 575b can have second heights ($x_2$) associated therewith, and the second heights ($x_2$) can vary from about 0.1 mm to about 10 mm. The second plasma-tuning portion 570b and the second EM-tuning portion 575b can have second widths ($z_2$) associated therewith, and the second widths ($z_2$) can vary from about 0.1 mm to about 10 mm.

FIG. 5C shows a front view and a side view of a third exemplary plasma-tuning rod (570c, 575c). The third plasma-tuning portion 570c can have third lengths ($y_{31}$) associated therewith, and the third lengths ($y_{31}$) can vary from about 1 mm to about 400 mm. The third EM-tuning portion 575c can have a length ($y_{32}$) associated therewith, and the length ($y_{32}$) can vary from about 1 mm to about 400 mm. The third plasma-tuning portion 570c and the third EM-tuning portion 575c can have third heights ($x_3$) associated therewith, and the third heights ($x_3$) can vary from about 0.1 mm to about 10 mm. The third plasma-tuning portion 570c and the third EM-tuning portion 575c can have third widths ($z_3$) associated therewith, and the third widths ($z_3$) can vary from about 0.1 mm to about 10 mm.

FIG. 5D shows a front view and a side view of a fourth exemplary plasma-tuning rod (570d, 575d). The fourth plasma-tuning portion 570d can have fourth lengths ($y_{41}$) associated therewith, and the fourth lengths ($y_{41}$) can vary from about 1 mm to about 400 mm. The fourth EM-tuning portion 575d can have a length ($y_{42}$) associated therewith, and the length ($y_{42}$) can vary from about 1 mm to about 400 mm. The fourth plasma-tuning portion 570d and the fourth EM-tuning portion 575d can have fourth heights ($x_4$) associated therewith, and the fourth heights ($x_4$) can vary from about 0.1 mm to about 10 mm. The fourth plasma-tuning portion 570d and the fourth EM-tuning portion 575d can have fourth widths ($z_4$) associated therewith, and the fourth widths ($z_4$) can vary from about 0.1 mm to about 10 mm.

Figure 6A:
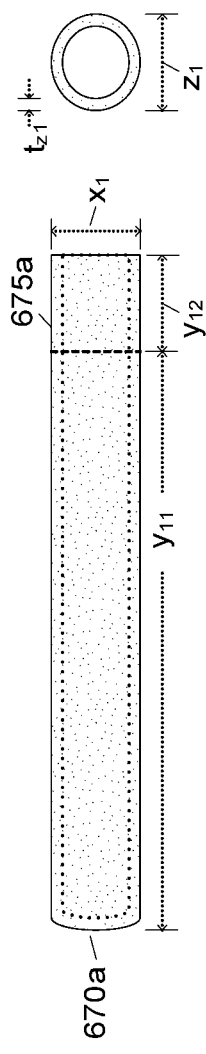
FIGS. 6A-6D show different views of other exemplary plasma-tuning rods in accordance with embodiments of the invention.

FIGS. 6A-6D show different views of exemplary plasma-tuning rods in accordance with embodiments of the invention. FIG. 6A shows a front view and a side view of a first exemplary plasma-tuning rod (670a, 675a). The first plasma-tuning portion 670a can have first lengths ($y_{11}$) associated therewith, and the first lengths ($y_{11}$) can vary from about 1 mm to about 400 mm. The first EM-tuning portion 675a can have lengths ($y_{12}$) associated therewith, and the lengths ($y_{12}$) can vary from about 1 mm to about 400 mm. The first plasma-tuning portion 670a and the first EM-tuning portion 675a can have first heights ($x_1$) associated therewith, and the first heights ($x_1$) can vary from about 0.1 mm to about 10 mm. The first plasma-tuning portion 670a and the first EM-tuning portion 675a can have first widths ($z_1$) associated therewith, and the first widths ($z_1$) can vary from about 0.1 mm to about 10 mm. The first plasma-tuning portion 670a and the first EM-tuning portion 675a can have first thicknesses ($t_{z1}$) associated therewith, and the first thicknesses ($t_{z1}$) can vary from about 0.01 mm to about 1 mm.

Figure 6B:
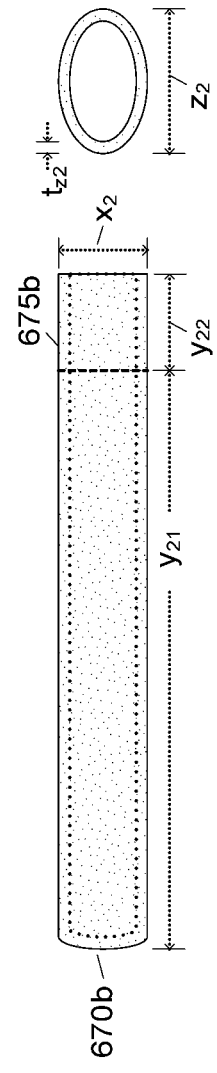

FIG. 6B shows a front view and a side view of a second exemplary plasma-tuning rod (670b, 675b). The second plasma-tuning portion 670b can have first lengths ($y_{21}$) associated therewith, and the first lengths ($y_{21}$) can vary from about 1 mm to about 400 mm. The second EM-tuning portion 675b can have lengths ($y_{22}$) associated therewith, and the lengths ($y_{22}$) can vary from about 1 mm to about 400 mm. The second plasma-tuning portion 670b and the second EM-tuning portion 675b can have second heights ($x_2$) associated therewith, and the second heights ($x_2$) can vary from about 0.1 mm to about 10 mm. The second plasma-tuning portion 670b and the second EM-tuning portion 675b can have second widths ($z_2$) associated therewith, and the second widths ($z_2$) can vary from about 0.1 mm to about 10 mm. The second plasma-tuning portion 670b and the second EM-tuning portion 675b can have second thicknesses ($t_{z2}$) associated therewith, and the second thicknesses ($t_{z2}$) can vary from about 0.01 mm to about 1 mm.

Figure 6C:
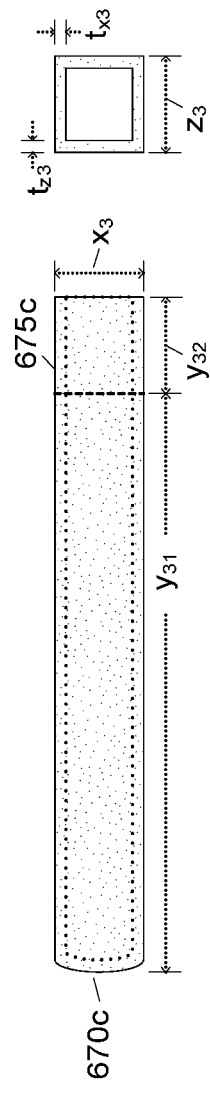

FIG. 6C shows a front view and a side view of a third exemplary plasma-tuning rod (670c, 675c). The third plasma-tuning portion 670c can have third lengths ($y_{31}$) associated therewith, and the third lengths ($y_{31}$) can vary from about 1 mm to about 400 mm. The third EM-tuning portion 675c can have a length ($y_{32}$) associated therewith, and the length ($y_{32}$) can vary from about 1 mm to about 400 mm. The third plasma-tuning portion 670c and the third EM-tuning portion 675c can have third heights ($x_3$) associated therewith, and the third heights ($x_3$) can vary from about 0.1 mm to about 10 mm. The third plasma-tuning portion 670c and the third EM-tuning portion 675c can have third widths ($z_3$) associated therewith, and the third widths ($z_3$) can vary from about 0.1 mm to about 10 mm. The third plasma-tuning portion 670c and the third EM-tuning portion 675c can have third thicknesses ($t_{z3}$ and $t_{x3}$) associated therewith, and the third thicknesses ($t_{z3}$ and $t_{x3}$) can vary from about 0.01 mm to about 1 mm.

Figure 6D:
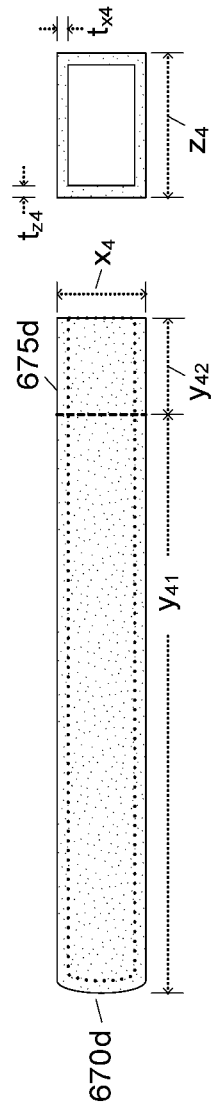

FIG. 6D shows a front view and a side view of a fourth exemplary plasma-tuning rod (670d, 675d). The fourth plasma-tuning portion 670d can have fourth lengths ($y_{41}$) associated therewith, and the fourth lengths ($y_{41}$) can vary from about 1 mm to about 400 mm. The fourth EM-tuning portion 675d can have a length ($y_{42}$) associated therewith, and the length ($y_{42}$) can vary from about 1 mm to about 400 mm. The fourth plasma-tuning portion 670d and the fourth EM-tuning portion 675d can have fourth heights ($x_4$) associated therewith, and the fourth heights ($x_4$) can vary from about 0.1 mm to about 10 mm. The fourth plasma-tuning portion 670d and the fourth EM-tuning portion 675d can have fourth widths ($z_4$) associated therewith, and the fourth widths ($z_4$) can vary from about 0.1 mm to about 10 mm. The fourth plasma-tuning portion 670d and the fourth EM-tuning portion 675d can have fourth thicknesses ($t_{z4}$ and $t_{x4}$) associated therewith, and the fourth thicknesses ($t_{z4}$ and $t_{x4}$) can vary from about 0.01 mm to about 1 mm.

Figure 7A:
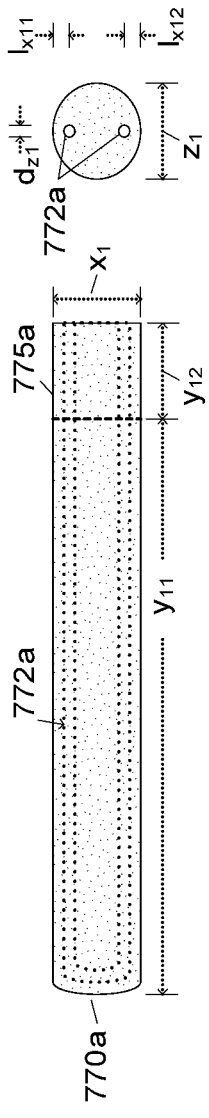
FIGS. 7A-7D show different views of exemplary plasma-tuning rods in accordance with embodiments of the invention.

FIGS. 7A-7D show different views of exemplary plasma-tuning rods in accordance with embodiments of the invention. FIG. 7A shows a front view and a side view of a first exemplary plasma-tuning rod (770a, 775a). The first plasma-tuning portion 770a can have first lengths ($y_{11}$) associated therewith, and the first lengths ($y_{11}$) can vary from about 1 mm to about 400 mm. The first EM-tuning portion 775a can have lengths ($y_{12}$) associated therewith, and the lengths ($y_{12}$) can vary from about 1 mm to about 400 mm. The first plasma-tuning portion 770a and the first EM-tuning portion 775a can have first heights ($x_1$) associated therewith, and the first heights ($x_1$) can vary from about 0.1 mm to about 10 mm. The first plasma-tuning portion 770a and the first EM-tuning portion 775a can have first widths ($z_1$) associated therewith, and the first widths ($z_1$) can vary from about 0.1 mm to about 10 mm. A first temperature control loop 772a can be configured within the first exemplary plasma-tuning rod (770a, 775a). For example, a temperature control fluid and/or gas can flow through the first temperature control loop 772a to control the temperature of the first exemplary plasma-tuning rod (770a, 775a). The first temperature control loop 772a can have first diameters ($d_{z1}$) associated therewith, and the first diameters ($d_{z1}$) can vary from about 0.001 mm to about 0.1 mm. In addition, the first temperature control loop 772a can have first offsets ($1_{x11}$ and $1_{x12}$) associated therewith, and the first offsets ($1_{x11}$ and $1_{x12}$) can vary from about 0.01 mm to about 0.1 mm.

Figure 7B:
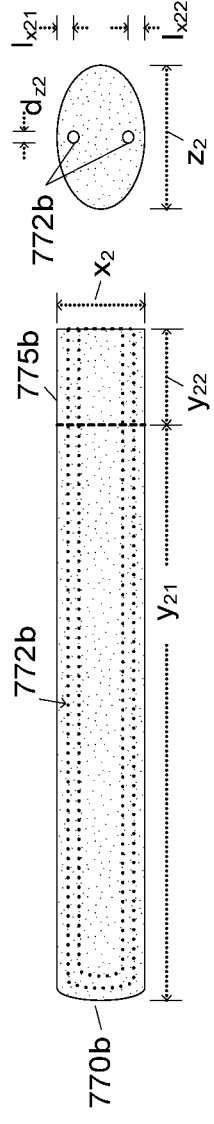

FIG. 7B shows a front view and a side view of a second exemplary plasma-tuning rod (770b, 775b). The second plasma-tuning portion 770b can have first lengths ($y_{21}$) associated therewith, and the first lengths ($y_{21}$) can vary from about 1 mm to about 400 mm. The second EM-tuning portion 775b can have lengths ($y_{22}$) associated therewith, and the lengths ($y_{22}$) can vary from about 1 mm to about 400 mm. The second plasma-tuning portion 770b and the second EM-tuning portion 775b can have second heights ($x_2$) associated therewith, and the second heights ($x_2$) can vary from about 0.1 mm to about 10 mm. The second plasma-tuning portion 770b and the second EM-tuning portion 775b can have second widths ($z_2$) associated therewith, and the second widths ($z_2$) can vary from about 0.1 mm to about 10 mm. A second temperature control loop 772b can be configured within the second exemplary plasma-tuning rod (770b, 775b). For example, a temperature control fluid and/or gas can flow through the second temperature control loop 772b to control the temperature of the second exemplary plasma-tuning rod (770b, 775b). The second temperature control loop 772b can have second diameters ($d_{z2}$) associated therewith, and the second diameters ($d_{z2}$) can vary from about 0.001 mm to about 0.1 mm. In addition, the second temperature control loop 772b can have second offsets ($1_{x21}$ and $1_{x22}$) associated therewith, and the second offsets ($1_{x21}$ and $1_{x22}$) can vary from about 0.01 mm to about 0.1 mm.

Figure 7C:
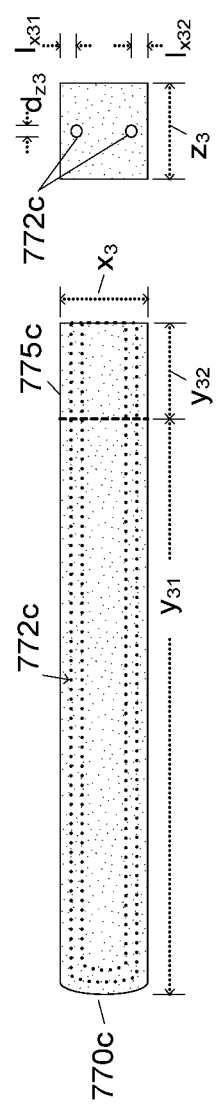

FIG. 7C shows a front view and a side view of a third exemplary plasma-tuning rod (770c, 775c). The third plasma-tuning portion 770c can have third lengths ($y_{31}$) associated therewith, and the third lengths ($y_{31}$) can vary from about 1 mm to about 400 mm. The third EM-tuning portion 775c can have a length ($y_{32}$) associated therewith, and the length ($y_{32}$) can vary from about 1 mm to about 400 mm. The third plasma-tuning portion 770c and the third EM-tuning portion 775c can have third heights ($x_3$) associated therewith, and the third heights ($x_3$) can vary from about 0.1 mm to about 10 mm. The third plasma-tuning portion 770c and the third EM-tuning portion 775c can have third widths ($z_3$) associated therewith, and the third widths ($z_3$) can vary from about 0.1 mm to about 10 mm. A third temperature control loop 772c can be configured within the third exemplary plasma-tuning rod (770c, 775c). For example, a temperature control fluid and/or gas can flow through the third temperature control loop 772c to control the temperature of the third exemplary plasma-tuning rod (770c, 775c). The third temperature control loop 772c can have third diameters ($d_{z3}$) associated therewith, and the third diameters ($d_{z3}$) can vary from about 0.001 mm to about 0.1 mm. In addition, the third temperature control loop 772c can have third offsets ($1_{x31}$ and $1_{x32}$) associated therewith, and the third offsets ($1_{x31}$ and $1_{x32}$) can vary from about 0.01 mm to about 0.1 mm.

Figure 7D:
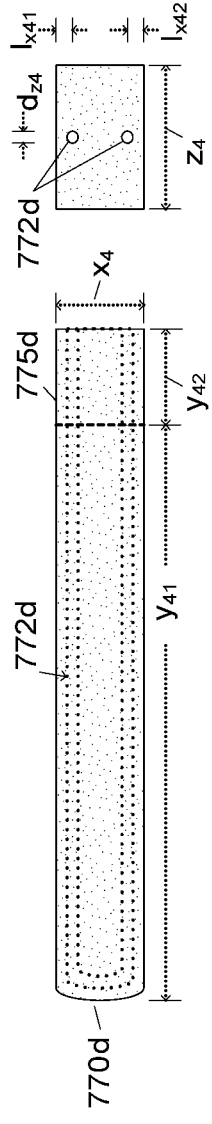

FIG. 7D shows a front view and a side view of a fourth exemplary plasma-tuning rod (770d, 775d). The fourth plasma-tuning portion 770d can have fourth lengths ($y_{41}$) associated therewith, and the fourth lengths ($y_{41}$) can vary from about 1 mm to about 400 mm. The fourth EM-tuning portion 775d can have a length ($y_{42}$) associated therewith, and the length ($y_{42}$) can vary from about 1 mm to about 400 mm. The fourth plasma-tuning portion 770d and the fourth EM-tuning portion 775d can have fourth heights ($x_4$) associated therewith, and the fourth heights ($x_4$) can vary from about 0.1 mm to about 10 mm. The fourth plasma-tuning portion 770d and the fourth EM-tuning portion 775d can have fourth widths ($z_4$) associated therewith, and the fourth widths ($z_4$) can vary from about 0.1 mm to about 10 mm. A fourth temperature control loop 772d can be configured within the fourth exemplary plasma-tuning rod (770d, 775d). For example, a temperature control fluid and/or gas can flow through the fourth temperature control loop 772d to control the temperature of the fourth exemplary plasma-tuning rod (770d, 775d). The fourth temperature control loop 772d can have fourth diameters ($d_{z4}$) associated therewith, and the fourth diameters ($d_{x4}$) can vary from about 0.001 mm to about 0.1 mm. In addition, the fourth temperature control loop 772d can have fourth offsets ($1_{z41}$ and $1_{z42}$) associated therewith, and the fourth offsets ($1_{z41}$ and $1_{z42}$) can vary from about 0.01 mm to about 0.1 mm.

Figure 8:
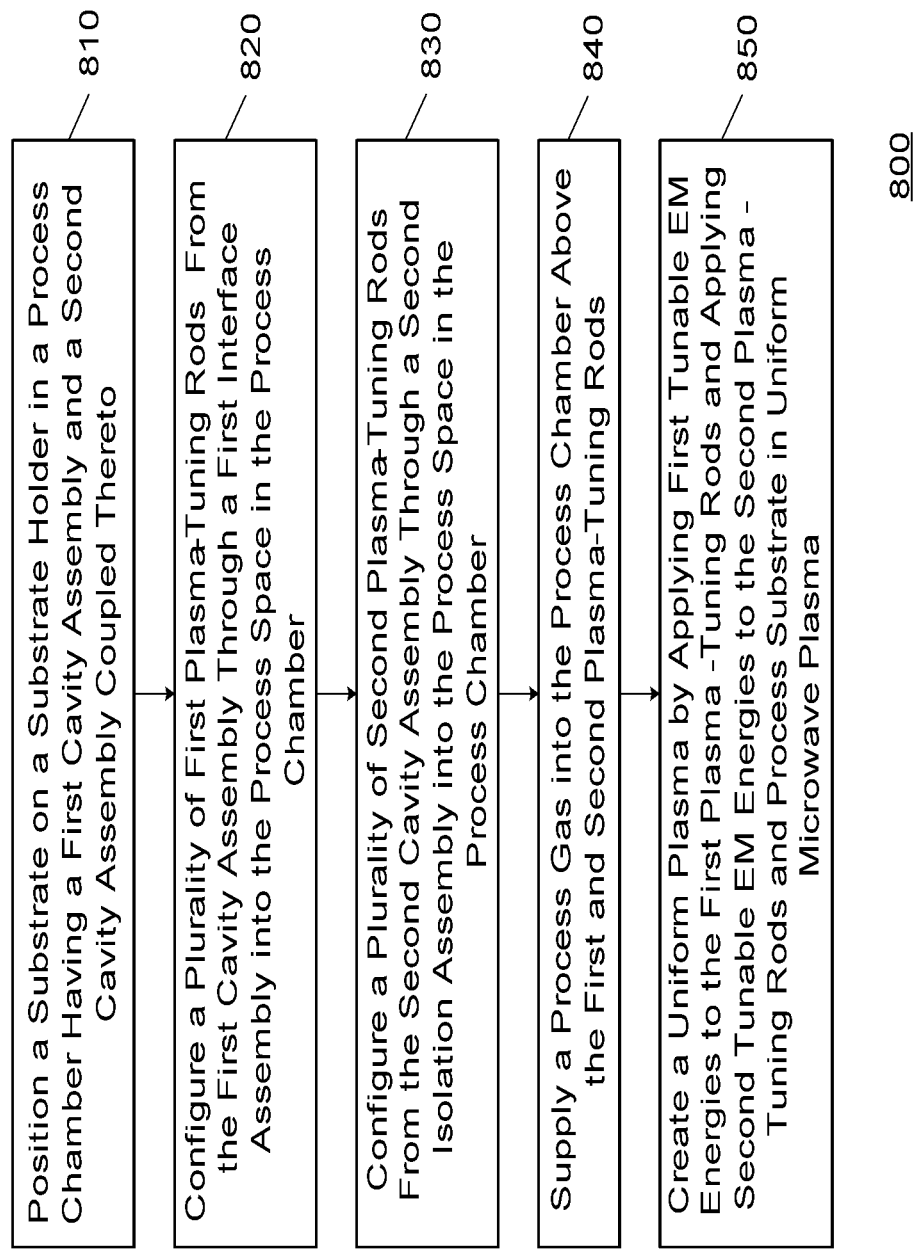
FIG. 8 illustrates a flow diagram for an exemplary operating procedure in accordance with embodiments of the invention.

FIG. 8 illustrates a flow diagram for an exemplary operating procedure in accordance with embodiments of the invention. An exemplary multi-step procedure 800 is shown in FIG. 8.

In 810, a substrate can be positioned on a substrate holder in a process chamber, and a first cavity assembly (168a, FIG. 1) and a second cavity assembly (168b, FIG. 1) can be coupled to the process chamber. In one embodiment, the first cavity assembly (168a, FIG. 1) with the first EM energy tuning space (169a, FIG. 1) therein can be coupled to the first process chamber (110, FIG. 1) using the first interface assembly (112a, FIG. 1), and the second cavity assembly (168b, FIG. 1) with the second EM energy tuning space (169b, FIG. 1) therein can be coupled to the first process chamber (110, FIG. 1) using the second interface assembly (112b, FIG. 1).

In 820, a first set of first plasma-tuning rods {(170a-170e) and (175a-175e), FIG. 1} can be configured from the first cavity assembly (168a, FIG. 1) through a first interface assembly (112a, FIG. 1) into the process space (115, FIG. 1) in the first process chamber (110, FIG. 1). A first set of isolation assemblies (164a-164e, FIG. 1) can be removably coupled to the first interface assembly (112a, FIG. 1) and can be configured to isolate the process space (115, FIG. 1) in the first process chamber (110, FIG. 1) from the first EM energy tuning space (169a, FIG. 1) in the first cavity assembly (168a, FIG. 1). The first set of isolation assemblies (164a-164e, FIG. 1) can be used to removably couple the first set of plasma tuning rods {(170a-170e) and (175a-175e), FIG. 1} to the first interface assembly (112a, FIG. 1). For example, the first plasma-tuning portions (170a-170e, FIG. 1) can be configured in the process space (115, FIG. 1), and the first EM-tuning portions (175a-175e, FIG. 1) can be configured within the first EM energy tuning space (169a, FIG. 1).

In 830, a set of second plasma-tuning rods {(170f-170j) and (175f-175j), FIG. 1} can be configured from the second cavity assembly (168b, FIG. 1) through a second interface assembly (112b, FIG. 1) into the process space (115, FIG. 1) in the first process chamber (110, FIG. 1). A second set of isolation assemblies (164f-164j, FIG. 1) can be removably coupled to the second interface assembly (112b, FIG. 1) and can be configured to isolate the process space (115, FIG. 1) in the first process chamber (110, FIG. 1) from the second EM energy tuning space (169b, FIG. 1) in the second cavity assembly (168b, FIG. 1). The second set of isolation assemblies (164f-164j, FIG. 1) can be used to removably couple the set of second plasma tuning rods {(170f-170j) and (175f-175j), FIG. 1} to the second interface assembly (112b, FIG. 1). For example, the second set of plasma-tuning portions (170f-170j, FIG. 1) can be configured in the process space (115, FIG. 1), and the second EM-tuning portions (175f-175j, FIG. 1) can be configured within the second EM energy tuning space (169b, FIG. 1).

In 840, process gas can be supplied into the process chamber above the first and second plasma-tuning rods. During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (polysilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

In 850, uniform microwave plasma can be created by applying first tunable microwave signals to the first plasma-tuning rods and applying second tunable microwave signals to the second plasma-tuning rods, and the substrate is processed in the uniform microwave plasma.

In some systems, a first set of EM-coupling regions (162a-162e, FIG. 1) can be established at first EM-coupling distances (176a-176e, FIG. 1) from the first cavity wall (165a, FIG. 1) within the first EM energy tuning space (169a, FIG. 1) established in the first cavity assembly (168a, FIG. 1), and the first set of EM-tuning portions (175a-175e, FIG. 1) can extend into the first set of EM-coupling regions (162a-162e, FIG. 1). The first EM-tuning portions (175a-175e, FIG. 1) can obtain different tunable microwave signals (energies) from the first set of EM-coupling regions (162a-162e, FIG. 1), and the different tunable microwave signals (energies) can be transferred to the process space (115, FIG. 1) at the first set of locations ($x_{2a}$-$x_{2e}$, FIG. 1) using the first set of plasma-tuning portions (170a-170e, FIG. 1). The first set of EM-coupling regions (162a-162e, FIG. 1) can include tunable E-field regions, tunable H-field regions, maximum E-field regions, maximum H-field regions, maximum voltage regions, maximum energy regions, or maximum current regions, or any combination thereof.

A first set of plasma-tuning slabs (161a-161e, FIG. 1) can be coupled to a first set of control assemblies (160a-160e, FIG. 1) and can be used to move (163a-163e, FIG. 1) the first set of plasma-tuning slabs (161a-161e, FIG. 1) a first set of EM-tuning distances (177a-177e, FIG. 1) relative to the first set of EM-tuning portions (175a-175e, FIG. 1) of the first set of plasma tuning rods {(170a-170e) and (175a-175e), FIG. 1} within the first EM energy tuning space (169a, FIG. 1). The first set of control assemblies (160a-160e, FIG. 1) and the first set of plasma-tuning slabs (161a-161e, FIG. 1) can be used to tune/optimize the different tunable microwave signals (energies) coupled from the first set of EM-coupling regions (162a-162e, FIG. 1) to the first set of EM-tuning portions (175a-175e, FIG. 1) of the first set of plasma tuning rods {(170a-170e) and (175a-175e), FIG. 1}. For example, the first set of EM-tuning distances (177a-177e, FIG. 1) can be established between the first set of EM-tuning distances (177a-177e, FIG. 1) and the first set of plasma-tuning slabs (161a-161e, FIG. 1) within the first EM energy tuning space (169a, FIG. 1), and the first set of EM-tuning distances (177a-177e, FIG. 1) can vary from about 0.01 mm to about 1 mm. One or more controllers (195, FIG. 1) can be coupled to the first set of control assemblies (160a-160e, FIG. 1) and can be used to control/optimize the movements (163a-163e, FIG. 1) of the first set of plasma-tuning slabs (161a-161e, FIG. 1). For example, one or more controllers (195, FIG. 1) can be used to control/optimize the first set of EM-tuning distances (177a-177e, FIG. 1) to create, optimize, and/or maintain a uniform microwave plasma within the process space (115, FIG. 1) in the process chamber (110, FIG. 1) during substrate processing.

In addition, a second set of EM-coupling regions (162e-162j, FIG. 1) can be established at a second set of EM-coupling distances (176e-176j, FIG. 1) from the first cavity wall (165b, FIG. 1) within the second EM energy tuning space (169b, FIG. 1) established in the second cavity assembly (168b, FIG. 1), and the second set of EM-tuning portions (175f-175j, FIG. 1) can extend into the second set of EM-coupling regions (162f-162j, FIG. 1). The second set of EM-tuning portions (175f-175j, FIG. 1) can obtain different tunable microwave signals (energies) from the second set of EM-coupling regions (162f-162j, FIG. 1), and the different tunable microwave signals (energies) can be transferred to the process space (115, FIG. 1) at the second set of locations ($x_{2f}$-$x_{2j}$, FIG. 1) using the second set of plasma-tuning portions (170f-170j, FIG. 1). The second set of EM-coupling regions (162f-162j, FIG. 1) can include tunable E-field regions, tunable H-field regions, maximum E-field regions, maximum H-field regions, maximum voltage regions, maximum energy regions, or maximum current regions, or any combination thereof.

A second set of plasma-tuning slabs (161f-161j, FIG. 1) can be coupled to a second set of control assemblies (160f-160j, FIG. 1) and can be used to move (163f-163j, FIG. 1) the second set of plasma-tuning slabs (161f-161j, FIG. 1) a second set of EM-tuning distances (177f-177j, FIG. 1) relative to the second set of EM-tuning portions (175f-175j, FIG. 1) of the second set of plasma tuning rods {(170f-170j) and (175f-175j), FIG. 1} within the second EM energy tuning space (169b, FIG. 1). The second set of control assemblies (160f-160j, FIG. 1) and the second set of plasma-tuning slabs (161f-161j, FIG. 1) can be used to tune/optimize the different tunable microwave signals (energies) coupled from the second set of EM-coupling regions (162f-162j, FIG. 1) to the second set of EM-tuning portions (175f-175j, FIG. 1) of the second set of plasma tuning rods {(170f-170j) and (175f-175j), FIG. 1}. For example, the second set of EM-tuning distances (177f-177j, FIG. 1) can be established between the second set of EM-tuning distances (177f-177j, FIG. 1) and the second set of plasma-tuning slabs (161f-161j, FIG. 1) within the second EM energy tuning space (169b, FIG. 1), and the second set of EM-tuning distances (177f-177j, FIG. 1) can vary from about 0.01 mm to about 1 mm. One or more controllers (195, FIG. 1) can be coupled to the second set of control assemblies (160f-160j, FIG. 1) and can be used to control/optimize the second set of movements (163f-163j, FIG. 1) of the second set of plasma-tuning slabs (161f-161j, FIG. 1). For example, one or more controllers (195, FIG. 1) can be used to control/optimize the second set of EM-tuning distances (177f-177j, FIG. 1) to create, optimize, and/or maintain a uniform microwave plasma within the process space (115, FIG. 1) in the process chamber (110, FIG. 1) during substrate processing.

Furthermore, one or more controllers (195, FIG. 1) can be coupled to the EM sources (150a and 150b, FIG. 1), the matching networks (152a and 152b, FIG. 1), the coupling networks (154a and 154b, FIG. 1), and the cavity assemblies (168a and 168b, FIG. 1), and at least one controller (195, FIG. 1) can use process recipes to establish, control, and optimize the EM sources (150a and 150b, FIG. 1), the matching networks (152a and 152b, FIG. 1), the coupling networks (154a and 154b, FIG. 1), and the cavity assemblies (168a and 168b, FIG. 1) to control the microwave plasma uniformity within the process space (115, FIG. 1).

Figure 9:
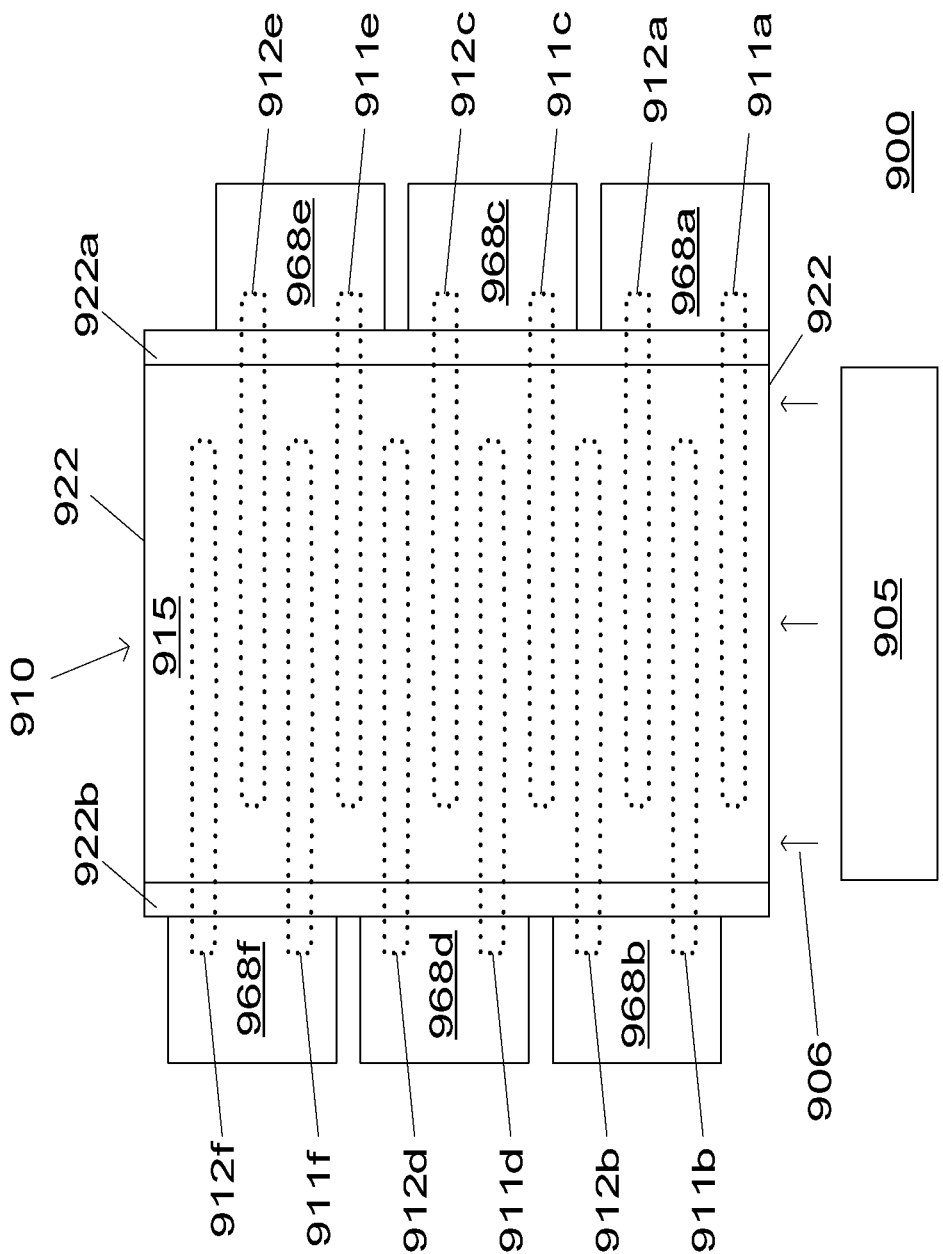
FIG. 9 illustrates a plasma processing system according to embodiments of the invention.

FIG. 9 illustrates a plasma processing system 900 according to embodiments of the invention. The plasma processing system 900 may comprise a dry plasma etching system or a plasma enhanced deposition system.

The plasma processing system 900 comprises a process chamber 910 having a plurality of chamber walls 922 and interface assemblies (922a and 922b) configured to define a process space 915. The plasma processing system 900 is configured to support the substrate 905 in the process space 915. The substrate 905 is exposed to plasma or process chemistry in process space 915. The plasma processing system 900 can comprise a plurality of cavity assemblies (968a, 968b, 968c, 968d, 968e, and 968f) coupled to the interface assemblies (922a and 922b). The first cavity assembly 968a can be coupled to a first set of plasma-tuning rods (911a and 912a); the second cavity assembly 968b can be coupled to a second set of plasma-tuning rods (911b and 912b); the third cavity assembly 968c can be coupled to a third set of plasma-tuning rods (911c and 912c); the fourth cavity assembly 968d can be coupled to a fourth set of plasma-tuning rods (911d and 912d); the fifth cavity assembly 968e can be coupled to a fifth set of plasma-tuning rods (911e and 912e); and the sixth cavity assembly 968f can be coupled to a sixth set of plasma-tuning rods (911f and 912f). The plurality of plasma-tuning rods (911a, 912a, 911b, 912b, 911c, 912c, 911d, 912d, 911e, 912e, 911f, and 912f) can be configured to form plasma in the process space 915. For example, the cavity assemblies (968a, 968b, 968c, 968d, 968e, and 968f) and the plasma-tuning rods (911a, 912a, 911b, 912b, 911c, 912c, 911d, 912d, 911e, 912e, 911f, and 912f) can be configured using the microwave systems (100, 200, 300, or 400) described herein.

Figure 10A:
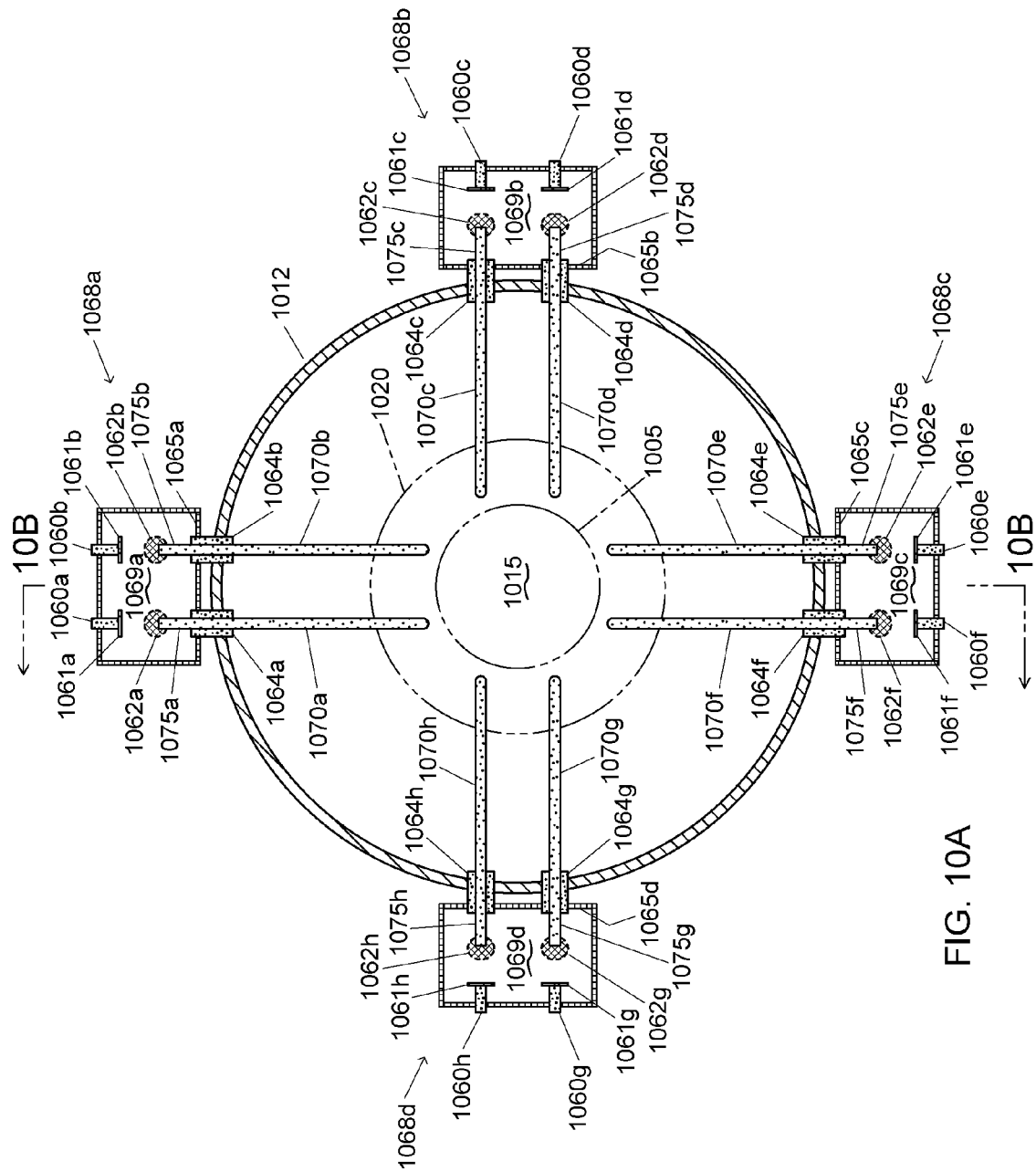
FIGS. 10A-10B show different views of an alternative embodiment of a microwave processing system.

FIG. 10A shows a partial cut-away top view of an alternative embodiment of a process chamber 1010 in a microwave processing system 1000. In this embodiment, process chamber 1010 is a cylindrical chamber having a cylindrical side chamber wall 1012. As with prior embodiments, a first cavity assembly 1068a having a first EM energy tuning space 1069a therein is provided having a cavity wall 1065a coupled to the chamber wall 1012, such as by an interface assembly (not shown). A first set of isolation assemblies (1064a and 1064b) are removably coupled through the chamber wall 1012 and configured to isolate the process space 1015 from the first EM energy tuning space 1069a. The first set of isolation assemblies (1064a and 1064b) are used to removably couple a first set of plasma tuning rods {(1070a and 1070b) and (1075a and 1075b)} with the first set of plasma-tuning portions (1070a and 1070b) configured in the process space 1015, and the first set of EM-tuning portions (1075a and 1075b) configured within the first EM energy tuning space 1069a. Similarly, second, third, and fourth cavity assemblies (1068b, 1068c, and 1068d) are also shown, similarly having second, third and fourth EM energy tuning spaces (1069b, 1069c, and 1069d) therein, and second, third, and fourth sets of isolation assemblies (1064c and 1064d), (1064e and 1064f), and (1064g and 1064h), and first, second, and third sets of plasma tuning rods {(1070c and 1070d) and (1075c and 1075d)}, {(1070e and 1070f) and (1075e and 1075f)}, and {(1070g and 1070h) and (1075g and 1075h)}. The specifics of the components depicted in FIG. 10A may have the same or similar characteristics to those described above with reference to similar components in processing systems 100, 200, 300 and 400. It may be appreciated, however, in a cylindrical chamber, the plasma-tuning portions 1070a-1070h extend a plasma-tuning distance 1071a-1071h into the process space 1015 that is less than the radius of the chamber if the plasma-tuning portions are positioned at the same height in the chamber 1010.

Similarly, as described above, each cavity assembly 1068a-1068d may include an EM-coupling region 1062a-1062h, a plasma-tuning slab 1061a-1061h and a control assembly 1060a-1060h associated with the respective EM-tuning portion 1075a-1075h. In addition, each cavity assembly 1068a-1068d may include a cavity-control assembly 1045a-1045d and cavity-tuning slab 1046a-1046d, as described above for processing systems 100, 200, 300 and 400.

Figure 10B:
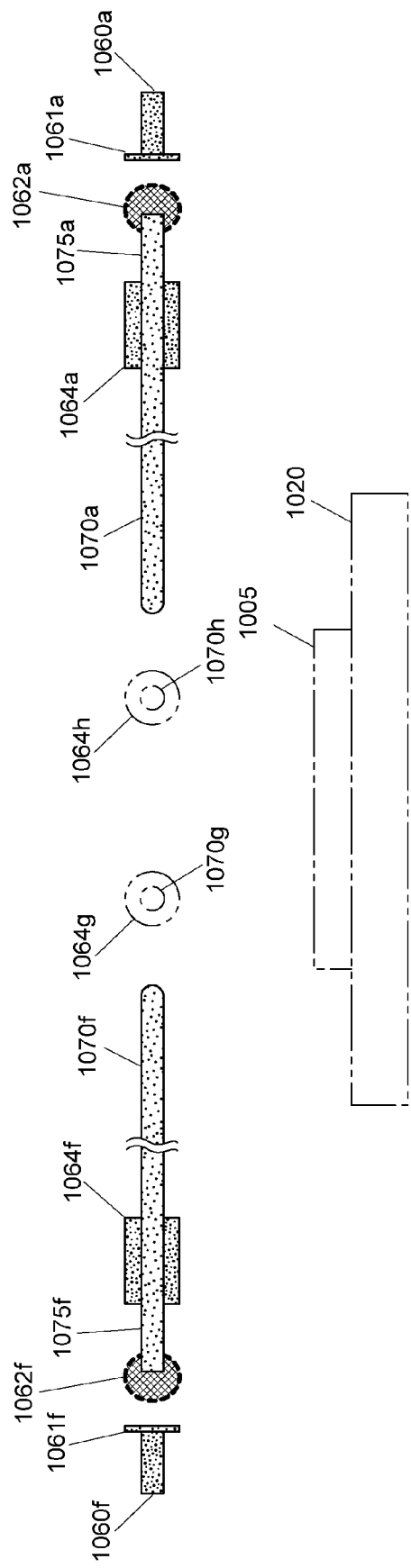

As shown in a partial cross-sectional view in FIG. 10B along line 10B of FIG. 10A, a substrate 1005 may be positioned on a substrate holder 1020 at the radial center of the chamber. The substrate holder 1020 may be stationary, or may be movable in a vertical or translational direction. The substrate holder 1020 may also be offset from the radial center of the chamber 1010, and either stationary or movable in any desired direction. Alternatively, and as will be described in greater detail below, a plurality of substrates 1005 may be provided on a substrate holder 1020 in spaced positions, and the substrate holder 1020 may be stationary, or rotatable in a lazy Susan fashion, and/or vertically movable.

FIG. 11A shows a partial cut-away top view of another embodiment of a process chamber 1110 in a microwave processing system 1100. Similar to process chamber 1010, the process chamber 1110 is a cylindrical chamber. Rather than multiple cavity assemblies positioned around the perimeter, processing system 1100 may have a ring-shaped cavity assembly 1168 defining a single EM energy tuning space 1169. A plurality of isolation assemblies 1164 are spaced around the chamber 1110 with a plasma-tuning rod (1170 and 1175) coupled thereto with a plasma-tuning portion 1170 extending radially into the process chamber 1110 and an EM tuning portion 1175 extending into the EM energy tuning space 1169, as described with previous embodiments.

Each plasma tuning rod (1170 and 1175) has an associated plasma tuning slab 1161 and control assembly 1160. As shown in partial cross-sectional view in FIG. 11B, rather than horizontally oriented plasma-tuning slabs and control assemblies, as shown in phantom, the plasma-tuning slab 1161 and control assembly 1160 may be coupled to the cavity assembly 1168 from the bottom of the cavity assembly, or alternatively, from the top of the cavity assembly (not shown). A cavity control assembly 1145 and cavity-tuning slab 1146 are also provided into the cavity assembly 1168. Microwave energy may then be fed into the single ring-shaped cavity 168, such as through an optional horn portion 1198.

With further reference to FIG. 11A, a lazy Susan type substrate holder 1120 is also shown for supporting a plurality of substrates 1105 thereon, which may be rotated to further ensure uniformity of the plasma exposure. The substrate holder 1120 may also be vertically movable, although that is an optional feature, as a substrate holder may be stationary.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not meant or intended to, in any way, limit the invention—rather the scope of the invention is defined by the appended claims.

What is claimed is:

1. A microwave processing system for processing a substrate comprising:
    a process chamber comprising a process space for processing a substrate therein;
    a first cavity assembly coupled to the process chamber using a first interface assembly, the first cavity assembly having a first electromagnetic (EM) energy tuning space therein, the first interface assembly including a first set of isolation assemblies, wherein a first set of EM-coupling regions, each with EM energy therein, are established in a first EM energy tuning space;
    a first set of plasma-tuning rods, each coupled to a respective one of the first set of isolation assemblies, each of the first set of plasma-tuning rods having a plasma-tuning portion in the process space and an EM-tuning portion in the first EM energy tuning space, each of the plasma-tuning portions of the first set being coupled to a respective one of the EM-coupling regions of the first set, wherein the EM-tuning portions of the first set are configured to obtain EM energy from the EM-coupling regions of the first set;
    a first set of plasma-tuning slabs disposed proximate to the EM-coupling regions of the first set in the first EM energy tuning space and a first set of slab control assemblies coupled to the first set of plasma-tuning slabs through a first cavity assembly wall, each plasma-tuning slab of the first set being positioned a first EM-coupling distance from the EM-tuning portion of a plasma-tuning rod of the first set by a respective slab control assembly of the first set that is configured to tune the EM energy in a respective one of the EM-coupling regions of the first set;
    a first cavity-tuning slab positioned at a variable cavity tuning distance within the first EM energy tuning space by a first cavity control assembly coupled to the first cavity-tuning slab and configured to tune EM energy in the first EM energy tuning space;
    a second cavity assembly coupled to the process chamber using a second interface assembly, the second cavity assembly having a second EM energy tuning space therein, the second interface assembly including a second set of isolation assemblies, wherein a second set of EM-coupling regions, each with EM energy therein, are established in the second EM energy tuning space;
    a second set of plasma-tuning rods, each coupled to a respective one of the second set of isolation assemblies, each of the second set of plasma-tuning rods having a plasma-tuning portion in the process space and an EM-tuning portion in the second EM energy tuning space, each of the plasma-tuning portions of the second set being coupled to a respective one of the EM-coupling regions of the second set, wherein the EM-tuning portions of the second set are configured to obtain EM energy from the EM-coupling regions of the second set;
    a second set of plasma-tuning slabs disposed proximate to the EM-coupling regions of the second set in the second EM energy tuning space and a second set of slab control assemblies coupled to the second set of plasma-tuning slabs through a second cavity assembly wall, each plasma-tuning slab of the second set being positioned a second EM-coupling distance from the EM-tuning portion of a plasma-tuning rod of the second set by a respective slab control assembly of the second set that is configured to tune the EM energy in a respective one of the EM-coupling regions of the second set;
    a second cavity-tuning slab positioned a variable cavity tuning distance within the second EM energy tuning space by a second cavity control assembly coupled to the second cavity-tuning slab and configured to tune EM energy in the second EM energy tuning space; and
    a controller coupled to the first cavity control assembly, the second cavity control assembly, the first set of slab control assemblies, the second set of slab control assemblies, the first cavity assembly and the second cavity assembly, wherein the controller is configured to independently control the first set of slab control assemblies so as to control the first EM-coupling distance to tune each EM energy associated with each of the EM-coupling regions of the first set, the second set of slab control assemblies so as to control the second EM-coupling distance to tune each EM energy associated with each of the EM-coupling regions of the second set, and the first and second cavity control assemblies to tune the EM energies in the first and second EM energy tuning spaces, to thereby control plasma uniformity in the process space.

2. The microwave processing system of claim 1, wherein the first and second sets of plasma-tuning rods and the first and second cavity assemblies comprise dielectric material.

3. The microwave processing system of claim 1, wherein the first and second cavity-tuning slabs and the first and second cavity-control assembly assemblies comprise dielectric material.

4. The microwave processing system of claim 1, further comprising:
- a first coupling network coupled to the first cavity assembly;
- a first matching network coupled to the first coupling network;
- a first EM source coupled to the first matching network, wherein the first EM source is configured to operate in a frequency range from 500 MHz to 5000 MHz, wherein the controller is coupled to the first EM source and configured to control the first EM source, thereby controlling the plasma uniformity in the process space;
- a second coupling network coupled to the second cavity assembly;
- a second matching network coupled to the second coupling network; and
- a second EM source coupled to the second matching network, wherein the second EM source is configured to operate in a second frequency range from 500 MHz to 5000 MHz, wherein the controller is coupled to the second EM source and configured to control the second EM source, thereby controlling the plasma uniformity in the process space.

5. The microwave processing system of claim 1, further comprising:
- a gas showerhead coupled to the process chamber;
- a gas supply subassembly coupled to the gas showerhead; and
- a gas supply system coupled to the gas supply subassembly, wherein the gas showerhead is configured to introduce a process gas to the process space, wherein the controller is coupled to the gas supply system, to the gas supply subassembly, and to the gas showerhead and is configured to control the gas supply system, the gas supply subassembly, and the gas showerhead, thereby controlling the plasma uniformity in the process space.

6. The microwave processing system of claim 5, wherein the process gas comprises two or more of: $C_4F_8$, $C_5F_8$, $C_3F_6$, $C_4F_6$, $CF_4$, $CHF_3$, $CH_2F_2$, an inert gas, oxygen, CO, and $CO_2$.

7. The microwave processing system of claim 5, wherein the process gas comprises two or more of: HBr, $Cl_2$, $NF_3$, $SF_6$, $CHF_3$, $CH_2F_2$, an inert gas, oxygen, CO, and $CO_2$.

8. A method of processing a substrate using a microwave processing system comprising:
- positioning a substrate within a process space in a process chamber;
- coupling a first cavity assembly to the process chamber using a first interface assembly, the first cavity assembly having a first electromagnetic (EM) energy tuning space therein, the first interface assembly including a first set of isolation assemblies, wherein a first set of EM-coupling regions each with EM energy therein, are established in the first EM energy tuning space;
- coupling each one from a first set of plasma-tuning rods to a respective one of the isolation assemblies of the first set, the first set of plasma-tuning rods each having a plasma-tuning portion in the process space and an EM-tuning portion in the first EM energy tuning space, each of the plasma-tuning portions being coupled to a respective one of the EM-coupling regions of the first set, wherein the first set of EM-tuning portions is configured to obtain EM energy from the first set of EM-coupling regions;
- coupling through a first cavity assembly wall, a first set of slab control assemblies to a first set of plasma-tuning slabs disposed proximate to the first set of EM-coupling regions in the first EM energy tuning space, each plasma-tuning slab of the first set being positioned a first EM-coupling distance from the EM-tuning portion of a plasma-tuning rod of the first set by a slab control assembly of the first set that is configured to tune the EM energy in a respective one of the EM-coupling regions of the first set;
- coupling a first cavity control assembly to the first cavity assembly and coupling a first cavity-tuning slab to the first cavity control assembly so that the first cavity-tuning slab is positioned at a variable cavity tuning distance within the first EM energy space and configured to tune EM energy in the first EM energy tuning space;
- coupling a second cavity assembly to the process chamber using a second interface assembly, the second cavity assembly having a second EM energy tuning space therein, the second interface assembly including a second set of isolation assemblies, wherein a second set of EM-coupling regions each with EM energy therein, are established in the second EM energy tuning space;
- coupling each one from a second set of plasma-tuning rods to a respective one of the isolation assemblies of the second set, the second set of plasma-tuning rods each having a plasma-tuning portion in the process space and an EM-tuning portion in the second EM energy tuning space, each of the plasma-tuning portions being coupled to a respective one of the EM-coupling regions of the second set, wherein the second set of EM-tuning portions is configured to obtain EM energy from the second set of EM-coupling regions;
- coupling through a second cavity assembly wall a second set of slab control assemblies to a second set of plasma-tuning slabs disposed proximate to the second set of EM-coupling regions in the second EM energy tuning space, each plasma-tuning slab of the second set being positioned a second EM-coupling distance from the EM-tuning portion of a plasma-tuning rod of the second set by a slab control assembly of the second set that is configured to tune the EM energy in a respective one of the EM-coupling regions of the second set;
- coupling a second cavity control assembly to the second cavity assembly and coupling a second cavity-tuning slab to the second cavity control assembly so that the second cavity-tuning slab is positioned at a variable cavity tuning distance within the second EM energy space and configured to tune EM energy in the second EM energy tuning space; and
- coupling a controller to the first cavity control assembly, the second cavity control assembly, the first set of slab control assemblies, the second set of slab control assemblies, the first cavity assembly and the second cavity assembly, wherein the controller is configured to independently control the first set of slab control assemblies so as to control the first EM-coupling distance to tune each EM energy associated with each of the EM-coupling coupling regions of the first set, the second set of slab control assemblies so as to control the second EM-coupling distance to tune each EM energy associated with each of the EM-coupling regions of the second set, and the first and second cavity control assemblies to tune the EM energies in the first and second EM energy tuning spaces, to thereby control plasma uniformity in the process space.

9. The method of claim 8, further comprising:
coupling a gas showerhead to the process chamber;
coupling a gas supply subassembly to the gas showerhead; and
coupling a gas supply system to the gas supply subassembly, wherein the gas showerhead is configured to introduce a process gas to the process space, wherein the controller is coupled to the gas supply system, to the gas supply subassembly, and to the gas showerhead and is configured to control the gas supply system, the gas supply subassembly, and the gas showerhead, thereby controlling the plasma uniformity in the process space.

10. The method of claim 9, wherein the process gas comprises two or more of: $C_4F_8$, $C_5F_8$, $C_3F_6$, $C_4F_6$, $CF_4$, $CHF_3$, $CH_2F_2$, an inert gas, oxygen, CO, and $CO_2$.

11. The method of claim 9, wherein the process gas comprises two or more of: HBr, $Cl_2$, $NF_3$, $SF_6$, $CHF_3$, $CH_2F_2$, an inert gas, oxygen, CO, and $CO_2$.

12. The method of claim 8, further comprising:
coupling a first coupling network to the first cavity assembly;
coupling a first matching network to the first coupling network;
coupling a first EM source to the first matching network, wherein the first EM source is configured to operate in a frequency range from 500 MHz to 5000 MHz, wherein the controller is coupled to the first EM source and configured to control the first EM source, thereby controlling the plasma uniformity in the process space;
coupling a second coupling network to the second cavity assembly;
coupling a second matching network to the second coupling network; and
coupling a second EM source to the second matching network, wherein the second EM source is configured to operate in a second frequency range from 500 MHz to 5000 MHz, wherein the controller is coupled to the second EM source and configured to control the second EM source, thereby controlling the plasma uniformity in the process space.

* * * * *